(12) United States Patent
Nathan et al.

(10) Patent No.: US 11,270,621 B2
(45) Date of Patent: *Mar. 8, 2022

(54) METHOD AND SYSTEM FOR PROGRAMMING, CALIBRATING AND/OR COMPENSATING, AND DRIVING AN LED DISPLAY

(71) Applicant: Ignis Innovation Inc., Waterloo (CA)

(72) Inventors: Arokia Nathan, Cambridge (GB); Gholamreza Chaji, Waterloo (CA); Stefan Alexander, Elmira (CA); Peyman Servati, Vancouver (CA); Richard I-Heng Huang, Waterloo (CA); Corbin Church, Westmount (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/914,533

(22) Filed: Jun. 29, 2020

(65) Prior Publication Data

US 2020/0327845 A1 Oct. 15, 2020

Related U.S. Application Data

(63) Continuation of application No. 16/005,177, filed on Jun. 11, 2018, now Pat. No. 10,699,624, which is a (Continued)

(30) Foreign Application Priority Data

Dec. 15, 2004 (CA) .................................. CA 2490860
Apr. 8, 2005 (CA) .................................. CA 2503237

(Continued)

(51) Int. Cl.
*G09G 3/20* (2006.01)
*G09G 3/3225* (2016.01)
(Continued)

(52) U.S. Cl.
CPC ......... *G09G 3/2007* (2013.01); *G09G 3/3225* (2013.01); *G09G 3/3233* (2013.01);
(Continued)

(58) Field of Classification Search
CPC .. G09G 3/2007; G09G 3/3233; G09G 3/3241; G09G 3/3283; G09G 3/3291;
(Continued)

(56) References Cited

U.S. PATENT DOCUMENTS 10,699,624 B2 * 6/2020 Nathan ................ G09G 3/2007

* cited by examiner

*Primary Examiner* — Mark W Regn
(74) *Attorney, Agent, or Firm* — Stratford Group Ltd.

(57) ABSTRACT

A method and system for programming, calibrating and driving a light emitting device display, and for operating a display at a constant luminance even as some of the pixels in the display are degraded over time. The system may include extracting a time dependent parameter of a pixel for calibration. Each pixel in the display is configured to emit light when a voltage is supplied to the pixel's driving circuit, which causes a current to flow through a light emitting element. Degraded pixels are compensated by supplying their respective driving circuits with greater voltages. The display data is scaled by a compression factor less than one to reserve some voltage levels for compensating degraded pixels. As pixels become more degraded, and require additional compensation, the compression factor is decreased to reserve additional voltage levels for use in compensation.

16 Claims, 44 Drawing Sheets

Related U.S. Application Data continuation of application No. 14/816,817, filed on Aug. 3, 2015, now Pat. No. 10,013,907, which is a continuation-in-part of application No. 14/738,393, filed on Jun. 12, 2015, now Pat. No. 10,012,678, which is a continuation-in-part of application No. 14/643,584, filed on Mar. 10, 2015, now Pat. No. 9,970,964, which is a continuation of application No. 14/157,031, filed on Jan. 16, 2014, now Pat. No. 8,994,625, said application No. 14/816,817 is a continuation-in-part of application No. 14/135,789, filed on Dec. 20, 2013, now abandoned, said application No. 14/738,393 is a continuation-in-part of application No. 13/898,940, filed on May 21, 2013, now abandoned, said application No. 14/157,031 is a continuation of application No. 13/568,784, filed on Aug. 7, 2012, now Pat. No. 8,736,524, said application No. 14/816,817 is a continuation-in-part of application No. 12/946,601, filed on Nov. 15, 2010, now abandoned, said application No. 14/135,789 is a continuation-in-part of application No. 12/946,601, filed on Nov. 15, 2010, now abandoned, said application No. 13/898,940 is a continuation of application No. 12/946,601, filed on Nov. 15, 2010, now abandoned, said application No. 13/568,784 is a continuation of application No. 12/571,968, filed on Oct. 1, 2009, now Pat. No. 8,259,044, said application No. 12/946,601 is a continuation-in-part of application No. 11/402,624, filed on Apr. 12, 2006, now Pat. No. 7,868,857, said application No. 12/571,968 is a continuation of application No. 11/304,162, filed on Dec. 15, 2005, now Pat. No. 7,619,597.

(30) Foreign Application Priority Data

| Apr. 12, 2005 | (CA) | ................................ CA 2504571 |
| Jun. 8, 2005 | (CA) | ................................ CA 2509201 |
| Oct. 17, 2005 | (CA) | ................................ CA 2521986 |

(51) Int. Cl.
| *G09G 3/3233* | (2016.01) |
| *G09G 3/3241* | (2016.01) |
| *G09G 3/3283* | (2016.01) |
| *G09G 3/3291* | (2016.01) |
| *G01R 19/00* | (2006.01) |

(52) U.S. Cl.
CPC ......... *G09G 3/3241* (2013.01); *G09G 3/3283* (2013.01); *G09G 3/3291* (2013.01); *G01R 19/0092* (2013.01); *G09G 2300/043* (2013.01); *G09G 2300/0819* (2013.01); *G09G 2300/0842* (2013.01); *G09G 2310/027* (2013.01); *G09G 2320/029* (2013.01); *G09G 2320/0233* (2013.01); *G09G 2320/0285* (2013.01); *G09G 2320/0295* (2013.01); *G09G 2320/043* (2013.01); *G09G 2320/045* (2013.01); *G09G 2320/0626* (2013.01); *G09G 2320/0693* (2013.01); *G09G 2360/16* (2013.01)

(58) Field of Classification Search
CPC ......... G09G 3/3225; G09G 2300/0819; G09G 2300/0842; G09G 2310/027; G09G 2320/0233; G09G 2320/0285; G09G 2320/029; G09G 2320/0295; G09G 2320/043; G09G 2320/045; G09G 2320/0693; G09G 2360/16; G09G 2320/0626; G09G 2300/043; G01R 19/0092

See application file for complete search history.

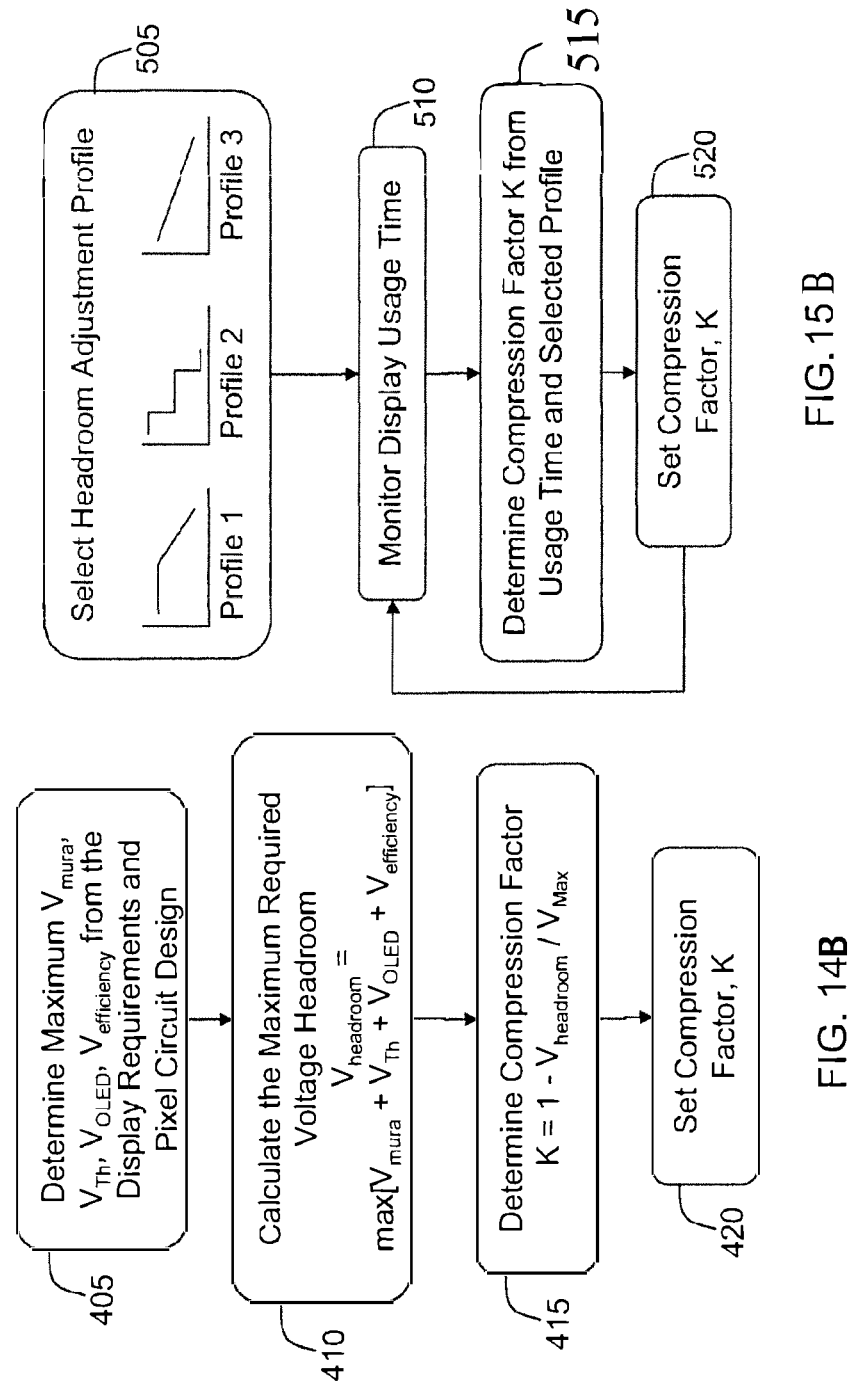

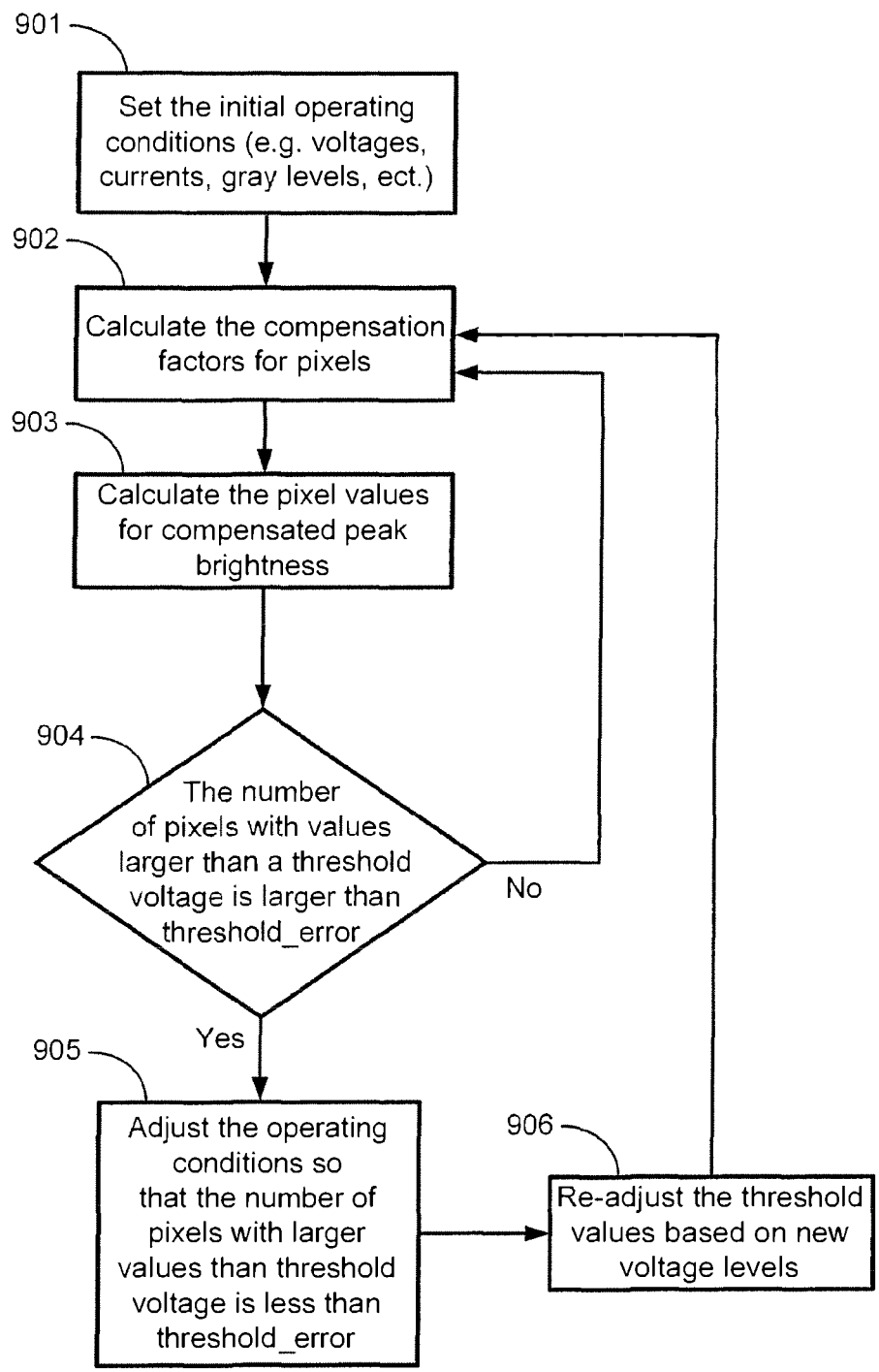
FIG. *19B*

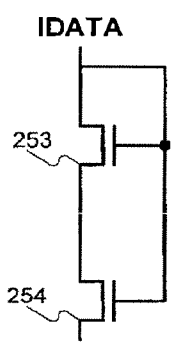
FIG.
24A

METHOD AND SYSTEM FOR PROGRAMMING, CALIBRATING AND/OR COMPENSATING, AND DRIVING AN LED DISPLAY

CROSS-REFERENCE TO RELATED APPLICATIONS

This application is
(A) a continuation of Ser. No. 16/005,177, filed Jun. 18, 2018, now issued as U.S. Pat. No. 10,699,624, which is a continuation of Ser. No. 14/816,817, filed Aug. 3, 2015, now U.S. Pat. No. 10,013,907, which is a continuation-in-part of Ser. No. 14/738,393, filed Jun. 12, 2015, now U.S. Pat. No. 10,012,678, which is a continuation-in-part of Ser. No. 14/643,584, filed Mar. 10, 2015, now issued as U.S. Pat. No. 9,970,964, which is a continuation of U.S. patent application Ser. No. 14/157,031, filed Jan. 16, 2014, now issued as U.S. Pat. No. 8,994,625, which is a continuation of U.S. patent application Ser. No. 13/568,784, filed Aug. 7, 2012, now issued as U.S. Pat. No. 8,736,524, which is a continuation of U.S. patent application Ser. No. 12/571,968, filed Oct. 1, 2009, now issued as U.S. Pat. No. 8,259,044, which is a continuation of U.S. patent application Ser. No. 11/304,162, filed Dec. 15, 2005, now issued as U.S. Pat. No. 7,619,597, which claims priority pursuant to 35 U.S.C. § 119 to (1) Canadian Patent No. 2,490,860, filed Dec. 15, 2004, and to (2) Canadian Patent No. 2,503,237, filed Apr. 8, 2005, and to (3) Canadian Patent No. 2,509,201, filed Jun. 8, 2005, and to (4) Canadian Patent No. 2,521,986, filed Oct. 17, 2005; and
(B) application Ser. No. 14/738,393 is also a continuation-in-part of Ser. No. 13/898,940, filed May 21, 2013, which is a continuation of U.S. application Ser. No. 12/946,601, filed Nov. 15, 2010, which is a continuation-in-part of prior application Ser. No. 11/402,624, filed Apr. 12, 2006, now U.S. Pat. No. 7,868,857, which claims priority to Canadian Patent No. 2,504,571, filed Apr. 12, 2005; and
(B) this application is also a continuation-in-part of Ser. No. 12/946,601, which is a continuation-in-part of Ser. No. 11/402,624, now issued as U.S. Pat. No. 7,868,857; and
(C) this application is also a continuation-in-part of Ser. No. 14/135,789, which is a continuation-in-part of Ser. No. 12/946,601, which is a continuation-in-part of Ser. No. 11/402,624, now issued as U.S. Pat. No. 7,868,857, all of which are incorporated herein by reference in their respective entireties.

FIELD OF DISCLOSURE

The present disclosure relates to display technologies, more specifically methods and systems for programming, calibrating and driving a light emitting device display, and compensating for non-uniformities of elements in light emitting device displays.

BACKGROUND OF THE DISCLOSURE

Recently active-matrix organic light-emitting diode (AMOLED) displays with amorphous silicon (a-Si), poly-silicon, organic, or other driving backplane have become more attractive due to advantages over active matrix liquid crystal displays. For example, the advantages include: with a-Si besides its low temperature fabrication that broadens the use of different substrates and makes feasible flexible displays, its low cost fabrication, high resolution, and a wide viewing angle.

An AMOLED display includes an array of rows and columns of pixels, each having an organic light-emitting diode (OLED) and backplane electronics arranged in the array of rows and columns. Since the OLED is a current driven device, the pixel circuit of the AMOLED should be capable of providing an accurate and constant drive current.

U.S. Pat. No. 6,594,606 discloses a method and system for calibrating passive pixels. U.S. Pat. No. 6,594,606 measures data line voltage and uses the measurement for pre-charge. However, this technique does not provide the accuracy needed for active matrix, since the active matrix calibration should work for both backplane aging and OLED aging. Further, after pre-charge, current programming must be performed. Current-programming of current driven pixels is slow due to parasitic line capacitances and suffers from non-uniformity for large displays. The speed may be an issue when programming with small currents.

Other compensation techniques have been introduced. However, there is still a need to provide a method and system which is capable of providing constant brightness, achieving high accuracy and reducing the effect of the aging of the pixel circuit.

Amorphous silicon is, for example, a promising material for AMOLED displays, due to its low cost and vast installed infrastructure from thin film transistor liquid crystal display (TFTLCD) fabrication.

All AMOLED displays, regardless of backplane technology used, exhibit differences in luminance on a pixel to pixel basis, primarily as a result of process or construction inequalities, or from aging caused by operational use over time. Luminance non-uniformities in a display may also arise from natural differences in chemistry and performance from the OLED materials themselves. These non-uniformities must be managed by the AMOLED display electronics in order for the display device to attain commercially acceptable levels of performance for mass-market use.

FIG. 1B illustrates an operational flow of a conventional AMOLED display 10. Referring to FIG. 1B, a video source 12 contains luminance data for each pixel and sends the luminance data in the form of digital data 14 to a digital data processor 16. The digital data processor 16 may perform some data manipulation functions, such as scaling the resolution or changing the color of the display. The digital data processor 16 sends digital data 18 to a data driver integrated circuit (IC) 20. The data driver IC 20 converts that digital data 18 into an analog voltage or current 22, which is sent to thin film transistors (TFTs) 26 in a pixel circuit 24. The TFTs 26 convert that voltage or current 22 into another current 28 which flows through an organic light-emitting diode (OLED) 30. The OLED 30 converts the current 28 into visible light 36. The OLED 30 has an OLED voltage 32, which is the voltage drop across the OLED. The OLED 30 also has an efficiency 34, which is a ratio of the amount of light emitted to the current through the OLED.

The digital data 14, analog voltage/current 22, current 28, and visible light 36 all contain the exact same information (i.e. luminance data). They are simply different formats of the initial luminance data that came from the video source 12. The desired operation of the system is for a given value of luminance data from the video source 12 to always result in the same value of the visible light 36.

However, there are several degradation factors which may cause errors on the visible light 36. With continued usage, the TFTs will output lower current 28 for the same input from the data driver IC 20. With continued usage, the OLED 30 will consume greater voltage 32 for the same input current. Because the TFT 26 is not a perfect current source, this will actually reduce the input current 28 slightly. With continued usage, the OLED 30 will lose efficiency 34, and emit less visible light for the same current.

Due to these degradation factors, the visible light output 36 will be less over time, even with the same luminance data being sent from the video source 12. Depending on the usage of the display, different pixels may have different amounts of degradation.

Therefore, there will be an ever-increasing error between the required brightness of some pixels as specified by the luminance data in the video source 12, and the actual brightness of the pixels. The result is that the decreased image will not show properly on the display.

One way to compensate for these problems is to use a feedback loop. FIG. 2B illustrates an operational flow of a conventional AMOLED display 40 that includes the feedback loop. Referring to FIG. 2B, a light detector 42 is employed to directly measure the visible light 36. The visible light 36 is converted into a measured signal 44 by the light detector 42. A signal converter 46 converts the measured visible light signal 44 into a feedback signal 48. The signal converter 46 may be an analog-to-digital converter, a digital-to-analog converter, a microcontroller, a transistor, or another circuit or device. The feedback signal 48 is used to modify the luminance data at some point along its path, such as an existing component (e.g. 12, 16, 20, 26, 30), a signal line between components (e.g. 14, 18, 22, 28, 36), or combinations thereof.

Some modifications to existing components, and/or additional circuits may be required to allow the luminance data to be modified based on the feedback signal 48 from the signal converter 46. If the visible light 36 is lower than the desired luminance from video source 12, the luminance signal may be increased to compensate for the degradation of the TFT 26 or the OLED 30. This results in that the visible light 36 will be constant regardless of the degradation. This compensation scheme is often known as Optical Feedback (OFB). However, in the system of FIG. 2B, the light detector 42 must be integrated onto a display, usually within each pixel and coupled to the pixel circuitry. Not considering the inevitable issues of yield when integrating a light detector into each pixel, it is desirable to have a light detector which does not degrade itself, however such light detectors are costly to implement, and not compatible with currently installed TFT-LCD fabrication infrastructure.

Therefore, there is a need to provide a method and system which can compensate for non-uniformities in displays without measuring a light signal.

AMOLED displays are conventionally operated according to digital data from a video source. The OLEDs within the display can be programmed to emit light with luminance according to a programming voltage or a programming current. The programming current or programming voltage are conventionally set by a display driver that takes digital data as input and has an analog output for sending the programming current or programming voltage to pixel circuits. The pixel circuits are configured to drive current through OLEDs based on the programming current or programming voltage.

SUMMARY OF ASPECTS OF THE PRESENT DISCLOSURE

It is an object of the invention to provide a method and system that obviates or mitigates at least one of the disadvantages of existing systems.

According to an aspect of the present disclosure, a method and system are provided for programming, calibrating and driving a light emitting device display, and for operating a display at a constant luminance even as some of the pixels in the display are degraded over time. The system may include extracting a time dependent parameter of a pixel for calibration. Each pixel in the display is configured to emit light when a voltage is supplied to the pixel's driving circuit, which causes a current to flow through a light emitting element. Degraded pixels are compensated by supplying their respective driving circuits with greater voltages. The display data is scaled by a compression factor less than one to reserve some voltage levels for compensating degraded pixels. As pixels become more degraded, and require additional compensation, the compression factor is decreased to reserve additional voltage levels for use in compensation.

In accordance with an aspect of the present invention there is provided a method of real-time calibration for a display array having a plurality of pixel circuits arranged in row and column, including the steps of: generating a priority list of pixels, which is used to prioritize pixels for calibration based on display and previous calibration data, the priority list being used to select one or more (n) pixels which are programmed with currents higher than a threshold current for calibration; selecting n pixels in a selected column of the display array from the linked list; implementing programming to the pixels in the selected column, including: monitoring a pixel current for the n pixels and obtaining calibration data; updating a compensation memory based on the calibration data for calibration; sorting the priority list for the next programming.

In accordance with a further aspect of the present invention there is provided a system for real-time calibration for a display array having a plurality of pixel circuits arranged in row and column, each pixel circuit having a light emitting device and a driving transistor, the system including: a calibration scheduler for controlling programming and calibration of the display array, including: a priority list for listing one or more pixels for calibration based on display data; module for enabling, during a programming cycle, calibration mode for one or more pixels in the selected column, which are selected from the priority list, and during a programming cycle, enabling normal operation mode for the rest of the pixels in the selected column; a monitor for monitoring a pixel current for the pixels in the calibration mode through the selected column; a generator for generating a calibration data based on the monitoring result; a memory for storing calibration data; and an7adjuster for adjusting a programming data applied to the display array based on the calibration data when the pixel on the normal operation mode is programmed.

In accordance with a further aspect of the present invention there is provided a system for a display array having a pixel circuit, the pixel circuit being programmed through a data line, the system including: a data source for providing a programming data into the pixel circuit; a current-controlled voltage source associated with the voltage source for converting a current on the data line to a voltage associated with the current to extract a time dependent parameter of the pixel circuit.

In accordance with a further aspect of the present invention there is provided a system for a display array including a plurality of pixel circuits, each pixel circuit including a driving transistor, at least one switch transistor, a storage capacitor and a light emitting device, the system including: a monitor for monitoring a current or voltage on the pixel circuit; a data process unit for controlling the operation of the display array, the data process unit extracting information on an aging of the pixel circuit, based on the monitored current or voltage and determining a state of the pixel circuit; a driver controlled by the data process unit and for providing programming and calibration data to the pixel circuit, based on the state of the pixel circuit.

In accordance with a further aspect of the present invention there is provided a method of driving a display array, the display array including a plurality of pixel circuits, each pixel circuit including a driving transistor, at least one switch transistor, a storage capacitor and a light emitting device, the method including the steps of: applying a current or voltage to the pixel circuit; monitoring a current or voltage flowing through the pixel circuit; extracting information on an aging of the pixel circuit, based on the monitored current or voltage and determining the state of the pixel circuit; providing operation voltage to the pixel circuit, including determining programming and calibration data for the pixel circuit based on the state of the pixel circuit.

In accordance with a further aspect of the present invention there is provided a method of driving a display array, the display array including a plurality of pixel circuits, each pixel circuit including a driving transistor, at least one switch transistor, a storage capacitor and a light emitting device, the method including the steps of: applying a current or voltage to the light emitting device; monitoring a current or voltage flowing through the light emitting device; predicting a shift in the voltage of the light emitting device, based on the monitored current or voltage and determining the state of the pixel circuit; and providing, to the light emitting device, a bias associated with the shift in the voltage of the light emitting device.

In accordance with a further aspect of the present invention there is provided a system for driving a display array, the display array including a plurality of pixel circuits, each pixel circuit including a driving transistor, at least one switch transistor, a storage capacitor and a light emitting device, the system including: a monitor for monitoring a current or voltage on the pixel circuit; a data process unit for predicting a shift in the voltage of the light emitting device, based on the monitored current or voltage and determining the state of the pixel circuit; and a circuit for providing, to the light emitting device, a bias associated with the shift in the voltage of the light emitting device.

In accordance with an aspect of the present invention there is provided a system for a display array including a plurality of pixel circuits, each pixel circuit having a driving transistor, at least one switch transistor, a storage capacitor and a light emitting device, the light emitting device being located at a programming path for programming the pixel circuit, the system including: a controller for controlling the operation of the display array; a driver for providing operation voltage to the pixel circuit based on the control of the controller; and the driver providing the operation voltage to the pixel circuit during a programming cycle such that the light emitting device being removed from the programming path.

It is an object of the invention to provide a method and system that obviates or mitigates at least one of the disadvantages of existing systems.

In accordance with an aspect of the present invention there is provided a system for compensating non-uniformities in a light emitting device display which includes a plurality of pixels and a source for providing pixel data to each pixel circuit. The system includes: a module for modifying the pixel data applied to one or more than one pixel circuit, an estimating module for estimating a degradation of a first pixel circuit based on measurement data read from a part of the first pixel circuit, and a compensating module for correcting the pixel data applied to the first or a second pixel circuit based on the estimation of the degradation of the first pixel circuit.

According to a further aspect of the present disclosure, a system and method are disclosed for operating a display at a constant luminance even as some of the pixels in the display are degraded over time. Each pixel in the display is configured to emit light when a voltage is supplied to the pixel's driving circuit, which causes a current to flow through a light emitting element. Degraded pixels are compensated by supplying their respective driving circuits with greater voltages. The display data is scaled by a compression factor less than one to reserve some voltage levels for compensating degraded pixels. As pixels become more degraded, and require additional compensation, the compression factor is decreased to reserve additional voltage levels for use in compensation.

In accordance with another aspect of the present invention there is provided a display degradation compensation system for adjusting the operating conditions for pixels in an OLED display to compensate for non-uniformity or aging of the display. The system includes a controller programmed to set an initial value for at least one of peak luminance and an operating condition, calculate compensation values for the pixels in the display, determine the number of pixels having compensation values larger than a predetermined threshold compensation value, and if the determined number of pixels having compensation values larger than said predetermined threshold value is greater than a predetermined threshold number, adjust the set value until said determined number of pixels is less than said predetermined threshold number.

According to a still further aspect of the present disclosure, a display degradation compensation system and method are provided for adjusting the operating conditions for pixels in an OLED display to compensate for non-uniformity or aging of the display. The system or method sets an initial value for at least one of peak luminance and an operating condition, calculates compensation values for the pixels in the display, determines the number of pixels having compensation values larger than a predetermined threshold compensation value, and if the determined number of pixels having compensation values larger than said predetermined threshold value is greater than a predetermined threshold number, adjusts the set value until said determined number of pixels is less than said predetermined threshold number.

In accordance with a further aspect of the present invention there is provided a method of compensating non-uniformities in a light emitting device display having a plurality of pixels, including the steps of: estimating a degradation of the first pixel circuit based on measurement data read from a part of the first pixel circuit, and correcting pixel data applied to the first or a second pixel circuit based on the estimation of the degradation of the first pixel circuit.

The present disclosure provides a method of maintaining uniform luminosity of an AMOLED display. The AMOLED display includes an array of pixels having light emitting devices. The light emitting devices are configured to emit light according to digital input from a video source. The video source includes digital data corresponding to a desired luminance of each pixel in the AMOLED display. Over time, aspects within the light emitting devices and their associated driving circuits degrade and require compensation to continue to emit light with the same luminance for a given digital input.

Degradation of the pixels in the light emitting display are compensated by incrementing the digital inputs of the pixels according to a measured or estimated degradation of the pixels. To allow for compensation to occur, the digital input is compressed to a range of values less than an available range. Compressing the digital input is carried out according to a compression factor, which is a number less than one. In an implementation of the present disclosure, the digital inputs are multiplied by the compression factor, which compresses the digital input to a range less than the available range. The remaining portion of the digital range can be used to provide compensation to degraded pixels based on measured or estimated degradation of the pixels. The present disclosure provides methods for setting and adjusting the compression factor to statically or dynamically adjust the compression factor and provide compensation to the display by incrementing the digital signals before the signals are sent to the driving circuits.

According to yet another aspect of the present disclosure, a method is provided of compensating for a degradation of a pixel having a driving circuit for driving current through a light emitting device based on an input. The method includes: receiving luminosity data; scaling the luminosity data by a compression factor to create compressed data; compensating for the degradation of the pixel by adjusting the compressed data to create compensated data; and supplying the driving circuit based on the compensated data.

The scaling can be carried out by multiplying the luminosity data by a constant integer to create resulting data with a greater number of bits, and multiplying the resulting data by the compression factor. The luminosity data can be an eight-bit integer and the compressed data is a ten-bit integer. The driving circuit can include at least one thin film transistor (TFT), which can be an n-type TFT. The at least one TFT can be used to drive current through the light emitting device. The degradation can be due to a voltage threshold of the at least one TFT or due to a shift in the voltage threshold of the at least one TFT.

The light emitting device can be an organic light emitting diode (OLED). The degradation can be due to a bias voltage of the OLED or due to a shift in the bias voltage of the OLED. The degradation can be due to a voltage required to compensate for an inefficiency of the OLED or due to a shift in the voltage required to compensate for the inefficiency of the OLED.

The compression factor can be determined based on a user selected profile and a usage time of the pixel. The compression factor can be determined based on an estimation of degradation of the pixel and on a display requirement. The estimation can be based on a design of hardware aspects of the pixel and of the driving circuit.

According to a further aspect of the present disclosure, a method is disclosed of compensating for a degradation of a pixel in a display having a plurality of pixels said pixel having a driving circuit for driving a current through a light emitting device based on an input, the input being supplied to the driving circuit by a display driver. The method includes: receiving luminosity data; scaling the luminosity data by a compression factor to create compressed data; compensating for a degradation of a pixel in the display by adjusting the compressed data based on the degradation to create compensated data; and sending the compensated data to the display driver.

The method can further include: ascertaining a maximum compensation applied to the plurality of pixels; and adjusting the compression factor based on the ascertained maximum compensation. The adjusting can be carried out by computing the ratio of the ascertained maximum compensation to a maximum assignable value of the inputs and updating the compression factor to be one minus the computed ratio. The luminosity data can include eight-bit integers. The scaling can be carried out by: multiplying the luminosity data by a constant integer to create resulting data with a greater number of bits, and multiplying the resulting data by the compression factor. At least one of the driving circuits can include at least one thin film transistor (TFT).

The method can further include compensating for degradations of the plurality of pixels in the display by adjusting the compressed data based on the degradations to create compensated data. The at least one TFT can be used to drive current through at least one of the light emitting devices. The degradation can be due to a voltage threshold of the at least one TFT or due to a shift in the voltage threshold of the at least one TFT.

At least one of the light emitting devices can be an organic light emitting diode (OLED). The degradation can be due to a bias voltage of the OLED or due to a shift in the bias voltage of the OLED. The degradation can be due to a voltage required to compensate for an inefficiency of the OLED or due to a shift in the voltage required to compensate for the inefficiency of the OLED.

The compression factor can be determined based on a user selected profile and a usage time of the display. The compression factor can be determined based on an estimation of the degradation of the display and based on display requirements and the design of hardware aspects within the display.

According to yet another aspect of the present disclosure, a method is disclosed of operating a display having a plurality of pixels to compensate for degradation of the plurality of pixels. The plurality of pixels have driving circuits for driving currents through light emitting devices based on inputs. The method includes: operating the display according to a first compression factor by: receiving a first set of luminosity data for the plurality of pixels; scaling the first set of luminosity data by the first compression factor to create a first set of compressed data; compensating for a first degradation of the plurality of pixels by adjusting the first set of compressed data based on a first set of offset increments to create a first set of compensated data; and supplying the driving circuits based on the first set of compensated data; determining a second compression factor based on a second degradation of the plurality of pixels; and operating the display according to the second compression factor by: receiving a second set of luminosity data for the plurality of pixels; scaling the second set of luminosity data by the second compression factor to create a second set of compressed data; compensating for the second degradation of the plurality of pixels by adjusting the second set of compressed data based on a second set of offset increments to create a second set of compensated data; and supplying the driving circuits based on the second set of compensated data.

The method can further include, prior to operating the display according to the first compression factor, determining the first compression factor based on the first degradation of the plurality of pixels. The adjusting the first set of compressed data can be carried out by adding the first set of offset increments to the first set of compressed data to create the first set of compensated data. The adjusting the second set of compressed data can be carried out by adding the second set of offset increments to the second set of compressed data to create the second set of compensated data. The adjusting the first set of compressed data can be carried out by subtracting the first set of offset increments from the first set of compressed data to create the first set of compensated data. The adjusting the second set of compressed data can be carried out by subtracting the second set of offset increments from the second set of compressed data to create the second set of compensated data.

The determining the first compression factor can be carried out by ascertaining the maximum value in the first set of offset increments and computing the ratio of the ascertained maximum to a maximum assignable input value. The first set of offset increments can be determined based on estimates of degradation of the plurality of pixels. The determining the first compression factor can be carried out by ascertaining the maximum value in the first set of offset increments and computing the ratio of the ascertained maximum to a maximum assignable input value. The first set of offset increments can be determined based on measurements of degradation of the plurality of pixels. The determining the second compression factor can be carried out by ascertaining the maximum value in the second set of offset increments and computing the ratio of the ascertained maximum to a maximum assignable input value. The second set of offset increments can be determined based on estimates of degradation of the plurality of pixels. The determining the second compression factor can be carried out by ascertaining the maximum value in the second set of offset increments and computing the ratio of the ascertained maximum to a maximum assignable input value. The second set of offset increments can be determined based on measurements of degradation of the plurality of pixels.

The first set of luminosity data and second set of luminosity data can include eight-bit integers. The scaling the first set of luminosity data can be carried out by: multiplying the first set of luminosity data by a constant integer to create a first set of resulting data that includes integers having a number of bits greater than eight; and multiplying the first set of resulting data by the first compression factor, and wherein the scaling the second set of luminosity data is carried out by: multiplying the second set of luminosity data by the constant integer to create a second set of resulting data that includes integers having a number of bits greater than eight; and multiplying the second set of resulting data by the second compression factor.

According to a still further aspect of the present disclosure, a display degradation compensation system is disclosed for compensating for a degradation of a plurality of pixels in a display. The plurality of pixels have driving circuits for driving currents through light emitting devices. The display degradation compensation system includes: a digital data processor module for receiving a luminosity data, compressing the luminosity data according to a compression factor, and compensating for the degradation of the plurality of pixels by adjusting the compressed data to create compensated data; and a display driver for receiving the compensated data and supplying the inputs to the driving circuits, the driving circuits being configured to deliver the driving currents to the light emitting devices based on the received compensated data. The adjusting the compressed data can be carried out according to a measurement of the degradation of the plurality of pixels. The digital data processor module can include a digital adder for adjusting the compressed data to create compensated data.

The display degradation compensation system can further include a compensation module for determining the compression factor. The compensation module can be configured to determine the compression factor according to a function including a measurement of the degradation of the plurality of pixels. The compensation module can be configured to dynamically adjust the compression factor according to an input specified by a user and according to a usage time of the display. The compensation module can be configured to dynamically adjust the compression factor according to a function including a measurement of the degradation of the plurality of pixels. The digital data processor module can be configured to receive eight-bit luminance data and output ten-bit compensated data. At least one of the light emitting devices can be an organic light emitting diode. At least one of the driving circuits can include at least one thin film transistor.

According to another aspect of the present disclosure, a system is disclosed for compensating for non-uniformities in a display having a plurality of pixels. At least one of the plurality of pixels includes a pixel circuit having a light emitting device. The pixel circuit can be configured to drive the pixel based on luminance data. The system includes: a module for modifying the pixel data applied to one or more than one pixel, the module including: an estimating module for estimating a degradation of a first pixel circuit based on measurement data read from the first pixel circuit; a grayscale compression module for compressing the luminance data according to a grayscale compression algorithm to reserve grayscale values; and a compensating module for correcting the compressed luminance data applied to the first or a second pixel circuit based on the estimation of the degradation of the first pixel circuit; and a display driver for receiving the corrected luminance data and supplying the pixel circuit with an analog voltage or current based on the corrected luminance data.

The grayscale compression module can transform the luminance data so as to use luminance values less than those of the original luminance data. The luminance data can be eight-bit data. The compressing can be carried out in the grayscale compression module to transform the luminance data to a range of 200 values.

The reserved grayscale values can be reserved at a high end of an available range to allow for providing corrections to the compressed luminance data that increase the luminosity of corrected pixels. The reserved grayscale values can be reserved at a low end of an available range to allow for providing corrections to the compressed luminance data that decrease the luminosity of corrected pixels.

The compensating module can correct the luminance data according to a decreasing brightness algorithm. The compensating module can correct the luminance data according to a constant brightness algorithm.

This summary of the invention does not necessarily describe all features of the invention.

Other aspects and features of the present invention will be readily apparent to those skilled in the art from a review of the following detailed description of preferred embodiments in conjunction with the accompanying drawings.

BRIEF DESCRIPTION OF THE DRAWINGS

These and other features of the invention will become more apparent from the following description in which reference is made to the appended drawings wherein:

FIG. 24A is a diagram showing a programming path of FIG. 23A when applying the OLED removing;

FIG. 11A-1 illustrates an experimental result of a video source outputting equal luminance data for each pixel for a usage time of zero hours.

FIG. 11B-1 illustrates an experimental result of a video source outputting maximum luminance data to some pixels and zero luminance data to other pixels for a usage of time of 1000 hours.

FIG. 11C-1 illustrates an experimental result of a video source outputting equal luminance data for each pixel after some pixels received maximum luminance data and others pixels received zero luminance data for a usage time of 1000 hours when no compensation algorithm is applied.

FIG. 11D-1 illustrates an experimental result of a video source outputting equal luminance data for each pixel after some pixels received maximum luminance data and others pixels received zero luminance data for a usage time of 1000 hours when a constant brightness compensation algorithm is applied.

FIG. 11E-1 illustrates an experimental result of a video source outputting equal luminance data for each pixel after some pixels received maximum luminance data and others pixels received zero luminance data for a usage time of 1000 hours when a decreasing brightness compensation algorithm is applied.

FIG. 14B is a flowchart illustrating a method for selecting the compression factor according to display requirements and the design of the pixel circuit.

FIG. 15B is a flowchart illustrating a method for selecting the compression factor according to a pre-determined headroom adjustment profile.

FIG. 19B is a flowchart illustrating a method for periodically adjusting operating conditions for compensation.

DETAILED DESCRIPTION OF THE PREFERRED EMBODIMENTS OF THE DISCLOSURE

Embodiments of the present invention are described using a pixel including a light emitting device and a plurality of transistors. The light emitting device may be an organic light emitting diode (OLED). It is noted that "pixel" and "pixel circuit" may be used interchangeably.

Figure 1A:
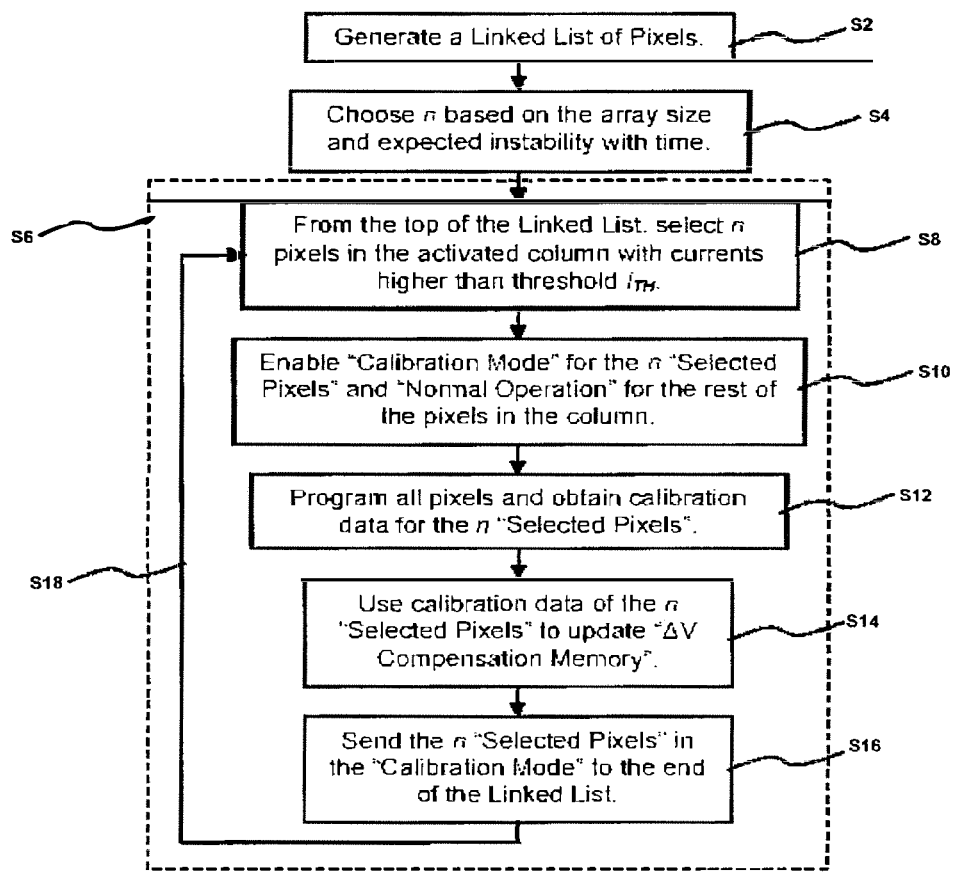
FIG. 1A is a flow chart showing a process for calibration-scheduling in accordance with an embodiment of the present invention.

Real-time calibration-scheduling for a display array having a plurality of pixels is described in detail. FIG. 1A illustrates a process for a calibration-scheduling in accordance with an embodiment of the present invention. According to this technique, the pixels are calibrated based on their aging and/or usage during the normal operation of the display array.

A linked list of pixels is generated in step S2. The linked list contains an identification of a pixel with high brightness for calibration. The linked list is used to schedule the priority in calibration.

In step S4, "n" is chosen based on the display size and expected instability with time (e.g. shift in characteristics of transistors and light emitting device). "n" represents the number of pixels that are calibrated in each programming cycle. "n" may be one or more than one.

Then programming cycle starts at step S6. The step S6 includes steps S8-S16. The steps S8-S16 are implemented on a selected column of the display array.

In step S8, "n" pixels in the selected column are selected from the beginning of the linked list, hereinafter referred to as "Selected Pixels".

In step S10, "Calibration Mode" is enabled for the Selected Pixels, and "Normal Operation Mode" is enabled for the rest of the pixels in the selected column of the display array.

In step S12, all pixels in the selected column are programmed by a voltage source driver (e.g. 28 of FIG. 2A) which is connected to a data line of the pixel.

For the Selected Pixels, current flowing through the data line is monitored during the programming cycle. For the pixels other than the Selected Pixels in the selected column, the corresponding programming voltage is boosted using data stored in a memory (e.g. 34 of FIG. 2A), hereinafter referred to as "ΔV compensation memory".

In step S14, the monitored current is compared with the expected current that must flow through the data line. Then, a calibration data curve for the Selected Pixels is generated. The ΔV compensation memory is updated based on the calibration data curve.

The calibration data curve stored in the ΔV compensation memory for a pixel will be used to boost programming voltage for that pixel in the next programming cycles when that pixel is in the Normal Operation Mode.

In step S16, the identifications of the Selected Pixels are sent to the end of the linked list. The Selected Pixels have the lowest priority in the linked list for calibration.

During display operation (S6-S16), the linked list will provide a sorted priority list of pixels that must be calibrated. It is noted that in the description, the term "linked list" and the term "priority list" may be used interchangeably.

The operation goes back (S18) to the step S8. The next programming cycle starts. A new column in the display array is activated (selected), and, new "n" pixels in the new activated column are selected from the top of the linked list. The ΔV compensation memory is updated using the calibration data obtained for the new Selected Pixels.

The number of the Selected Pixels, "n", is now described in detail. As described above, the number "n" is determined based on the display size and expected instability in device characteristics with time. It is assumed that the total number of pixels N is $N=3 \times m_1 \times m_2$, where m1 and m2 are the number of rows and columns in the display, respectively.

The highest rate in characteristics shift is K ($=\Delta I.\Delta t.I$). Each programming cycle takes $t=1/f \cdot m_2$. The maximum expected shift in characteristics after the entire display is calibrated is $\Delta I/I = K.t.N/n < e$, where e is the allowed error. After this the calibration can be redone from the beginning, and the error is eliminated. This shows that $n > K.t.N/e$ or $n > 3.K.m_1/f.e$. For instance, if K=1%/hr, $m_1$=1024, f=60 Hz, and e=0.1%, then n>0.14, which implies that it is needed to calibrate once in 5 programming cycles. This is achievable with one calibration unit, which operates only one time in 5 programming cycles. Each calibration unit enables calibration of one pixel at a programming cycle. If e=0.01%, n>1.4. This means that two calibration units calibrating two pixels in each programming cycle are required. This shows that it is feasible to implement this calibration system with very low cost.

The frequency of calibration can be reduced automatically as the display ages, since shifts in characteristics will become slower as the time progresses. In addition, the pixels that are selected for calibration can be programmed with different currents depending on display data. The only condition is that their programming current is larger than a reference current. Therefore, the calibration can be performed at multiple brightness levels for one pixel to achieve higher accuracy.

The linked list is described in detail. In the linked list, the pixels with high brightness for calibration are listed. The display data is used to determine the pixels with high brightness for calibration. Calibration at low currents is slow and often not accurate. In addition, maximum shift in characteristics occurs for pixels with high current. Thus, in order to improve the accuracy and speed of calibration, the pixels, which must be programmed with currents higher than a threshold current $I_{TH}$, are selected and stored in the linked list.

$I_{TH}$ is a variable and may be "0". For $I_{TH}=0$, all pixels are listed in the linked list, and the calibration is performed for all pixels irrespective of their programming current.

The calibration-scheduling technique described above is applicable to any current programmed pixels, for example, but not limited to, a current mirror based pixel.

Figure 2A:
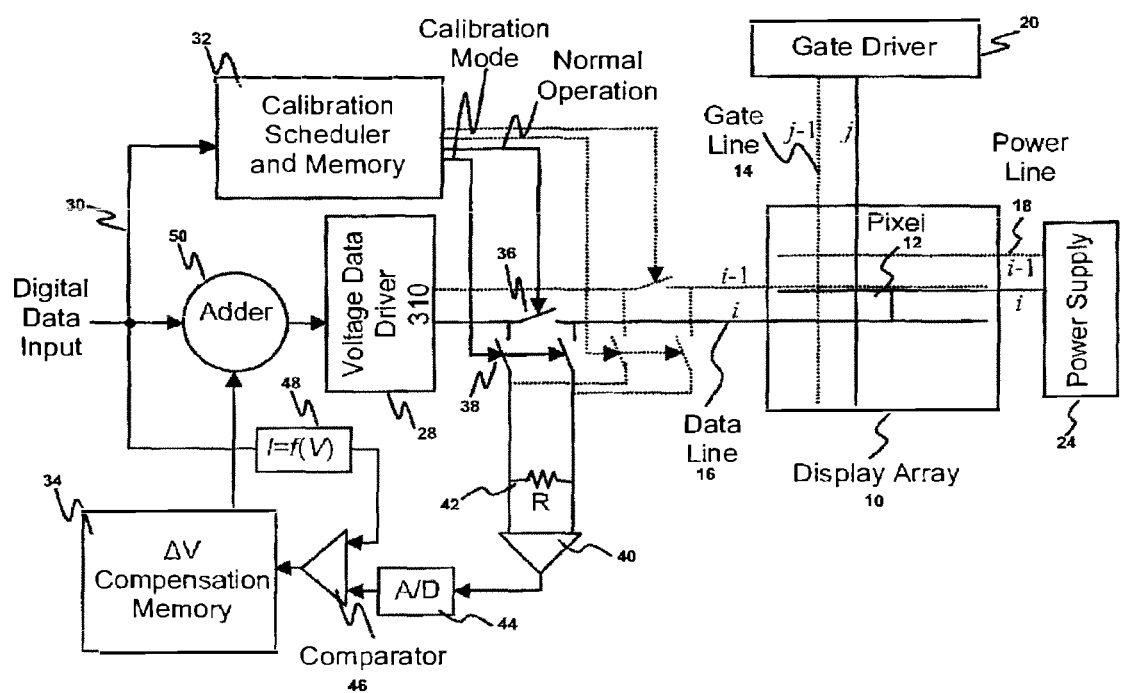
FIG. 2A is a diagram showing an example of a system structure for implementing the calibration-scheduling of FIG. 1A.

FIG. 2A illustrates an example of a system structure for implementing the calibration-scheduling of FIG. 1A. A system 30 of FIG. 2A for implementing calibration-scheduling algorithm is provided to a display array 10 having a plurality of pixel circuits 12. The pixel circuit 12 is a current programmed pixel circuit, such as, but not limited to a current mirror based pixel. The pixel circuits 12 are arranged in row and column.

The pixel circuit 12 may include an OLED and a plurality of transistors (e.g. TFTs). The transistor may be fabricated using amorphous silicon, nano/micro crystalline silicon, poly silicon, organic semiconductors technologies (e.g. organic TFT), NMOS/PMOS technology or CMOS technology (e.g. MOSFET). The display array 10 may be an AMOLED display array.

The pixel circuit 12 is operated by a gate line 14 connected to a gate driver 20, a data line 16 connected to a voltage data driver 28, and a power line connected to a power supply 24. In FIG. 2A, two data lines, two gate lines and two power lines are shown as an example. It is apparent that more than two data lines, two gate lines and two power lines may be provided to the display array 10.

The system 30 includes a calibration scheduler and memory block 32 for controlling programming and calibration of the display array 10, and a ΔV compensation memory 34 for storing ΔV compensation voltage (value). In each programming cycle, a column of the display array 10 is selected. The calibration scheduler and memory block 32 enables Normal Operation Mode or Calibration Mode for the selected column (i.e., data line) during that programming cycle.

The system 30 further includes a monitoring system for monitoring and measuring a pixel current. The monitoring system includes switches 36 and 38 and a voltage sensor 40 with an accurate resistor 42. In FIG. 2A, the switches 36 and 38 are provided for each data line as an example.

The system 30 further includes a generator for generating ΔV compensation voltage based on the monitoring result. The generator includes an analog/digital converter (A/D) 44, a comparator 46, and a translator 48. The A/D 44 converts the analog output of the voltage sensor 40 into a digital output. The comparator 46 compares the digital output to an output from the translator 48. The translator 48 implements function f(V) on a digital data input 52. The translator 48 converts the current data input 52 to the voltage data input through f(v). The result of the comparison by the comparator 46 is stored in the ΔV compensation memory 34.

The system 30 further includes an adder 50 for adding the digital data input 52 and the ΔV compensation voltage stored in the ΔV compensation memory 34. The voltage data driver 28 drives a data line based on the output of the adder 50. The programming data for the data line is adjusted by adding the ΔV compensation voltage.

When the calibration scheduler and memory block 32 enables the Normal Operation Mode for a selected data line, the switch 36 is activated. The voltage output from the voltage data driver 28 is directly applied to the pixel on that data line.

When the calibration scheduler and memory block 32 enables the Calibration Mode for that data line, the switch 38 is activated. The voltage is applied to the pixel on that data line through the accurate resistor 42. The voltage drop across the resistor 42 at the final stages of the programming time (i.e. when initial transients are finished) is measured by the voltage sensor 40. The voltage drop monitored by the voltage sensor 40 is converted to digital data by the A/D 44. The resulting value of the voltage drop is proportional to the current flowing through the pixel if the pixel is a current programmed pixel circuit. This value is compared by the comparator 46 to the expected value obtained by the translator 48.

The difference between the expected value and the measured value is stored in the ΔV compensation memory 34, and will be used for a subsequent programming cycle. The difference will be used to adjust the data voltage for programming of that pixel in future.

The calibration scheduler and memory block 32 may include the linked list described above. In the beginning, the linked list is generated automatically. It may be just a list of pixels. However, during the operation it is modified.

The calibration of the pixel circuits with high brightness guarantees the high speed and accurate calibration that is needed in large or small area displays.

Since the display array 10 is driven using a voltage programming technique, it is fast and can be used for high-resolution and large area displays.

Due to speed, accuracy, and ease of implementation, the applications of the calibration-scheduling technique ranges from electroluminescent devices used for cellphones, personal organizers, monitors, TVs, to large area display boards.

The system 30 monitors and measures voltage drop which depends on time dependent parameters of the pixel, and generates a desirable programming data. However, the time dependent parameters of the pixel may be extracted by any mechanisms other than that of FIG. 2A.

A further technique for programming, extracting time dependent parameters of a pixel and driving the pixel is described in detail with reference to FIGS. 3A-7A. This technique includes voltage-extracting for calibration. Programming data is calibrated with the extracted information, resulting in a stable pixel current over time. Using this technique, the aging of the pixel is extracted.

Figure 3A:
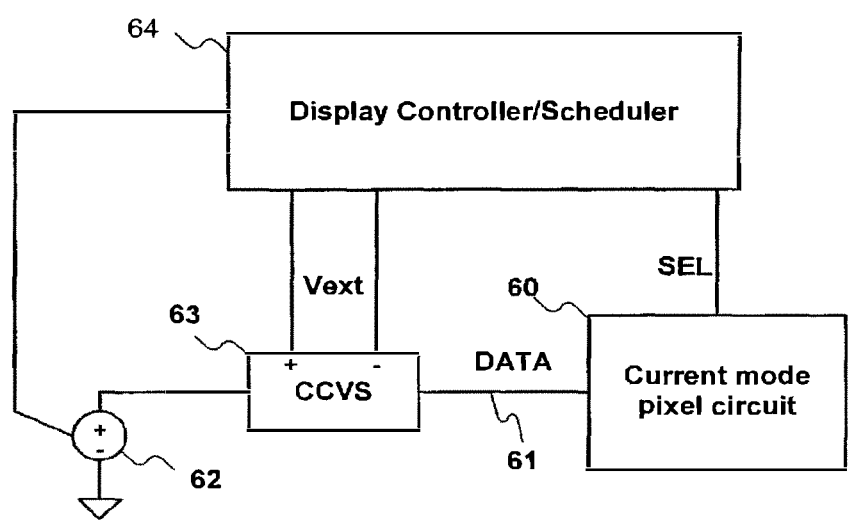
FIG. 3A is a diagram showing a system architecture for a voltage-extracting, programming and driving in accordance with an embodiment of the present invention.

FIG. 3A illustrates a system architecture for implementing a voltage-extracting, programming and driving in accordance with an embodiment of the present invention. The system of FIG. 3A implements the voltage-extracting and programming to a current mode pixel circuit 60. The pixel circuit 60 includes a light emitting device and a plurality of transistors having a driving transistor (not shown). The transistors may be TFTs.

The pixel circuit 60 is selected by a select line SEL and is driven by DATA on a data line 61. A voltage source 62 is provided to write a programming voltage $V_P$ into the pixel circuit 60. A current-controlled voltage source (CCVS) 63 having a positive node and a negative node is provided to convert the current on the data line 61 to a voltage Vext. A display controller and scheduler 64 operates the pixel circuit 60. The display controller and scheduler 64 monitors an extracted voltage Vext output from the CCVS 63 and then controls the voltage source 62.

The resistance of CCVS 63 is negligible. Thus the current on the data line 61 is written as:

$$I_{Line} = I_{pixel} = \beta(V_P - V_T)^2 \quad (1)$$

where $I_{Line}$ represents the current on the data line 61, $I_{pixel}$ represents a pixel current, $V_T$ represents the threshold voltage of the driving transistor included in the pixel circuit 60, and represents the gain parameter in the TFT characteristics.

As the threshold voltage of the driving TFT increases during the time, the current on the data line 61 decreases. By monitoring the extracted voltage Vext, the display controller and scheduler 64 determines the amount of shift in the threshold voltage.

The threshold voltage VT of the driving transistor can be calculate as:

$$V_T = V_P - (I_{Line}/\beta)^{0.5} \quad (2)$$

The programming voltage $V_P$ is modified with the extracted information. The extraction procedure can be implemented for one or several pixels during each frame time.

Figure 4A:
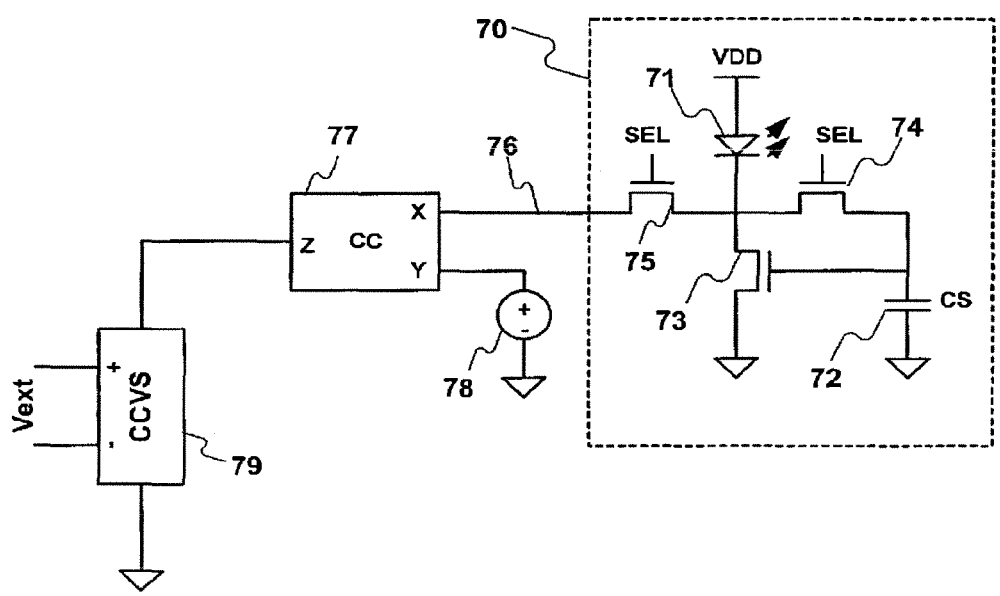
FIG. 4A is a diagram showing an example of the extracting, programming and driving system of FIG. 3A and a pixel circuit.

FIG. 4A illustrates an example of a system for the voltage-extracting, programming and driving of FIG. 3A, which is employed with a top-emission current-cell pixel circuit 70. The pixel circuit 70 includes an OLED 71, a storage capacitor 72, a driving transistor 73 and switch transistors 74 and 75.

The transistors 73, 74 and 75 may be n-type TFTs. However, these transistors 73, 74 and 75 may be p-type transistors. The voltage-extracting and programming technique applied to the pixel circuit 70 is also applicable to a pixel circuit having p-type transistors.

The driving transistor 73 is connected to a data line 76 through the switch transistor 75, and is connected to the OLED 71, and also is connected to the storage capacitor 72 through the switch transistor 74. The gate terminal of the driving transistor 73 is connected to the storage capacitor 72. The gate terminals of the switch transistors 74 and 75 are connected to a select line SEL. The OLED 71 is connected to a voltage supply electrode or line VDD. The pixel circuit 70 is selected by the select line SEL and is driven by DATA on the data line 76.

A current conveyor (CC) 77 has X, Y and Z terminals, and is used to extract a current on the data line 76 without loading it. A voltage source 78 applies programming voltage to the Y terminal of the CC 77. In the CC 77, the X terminal is forced by feedback to have the same voltage as that of the Y terminal. Also, the current on the X terminal is duplicated into the Z terminal of the CC 77. A current-controlled voltage source (CCVS) 79 has a positive node and a negative node. The CCVS 79 converts the current on the Z terminal of the CC 77 into a voltage Vext.

Vext is provided to the display controller and scheduler 64 of FIG. 3A, where the threshold voltage of the driving transistor 73 is extracted. The display controller and scheduler 64 controls the voltage source 78 based on the extracted threshold voltage.

Figure 5A:
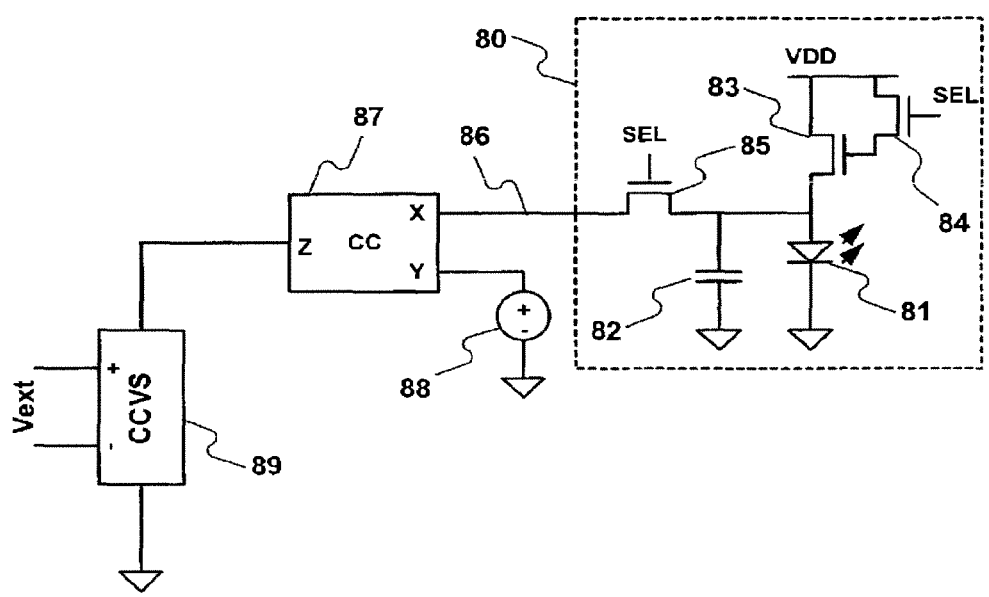
FIG. 5A is a diagram showing a further example of the extracting, programming and driving system of FIG. 3A and a pixel circuit.

FIG. 5A illustrates a further example of a system for the voltage-extracting, programming, and driving of FIG. 3A, which is employed with a bottom-emission current-cell pixel circuit 80. The pixel circuit 80 includes an OLED 81, a storage capacitor 82, a driving transistor 83, and switch transistors 84 and 85. The transistors 83, 84 and 85 may be n-type TFTs. However, these transistors 83, 84 and 85 may be p-type transistors.

The driving transistor 83 is connected to a data line 86 through the switch transistor 85, and is connected to the OLED 81, and also is connected to the storage capacitor 82. The gate terminal of the driving transistor 83 is connected to a voltage supply line VDD through the switch transistor 84. The gate terminals of the switch transistors 84 and 85 are connected to a select line SEL. The pixel circuit 80 is selected by the select line SEL and is driven by DATA on the data line 86.

A current conveyor (CC) 87 has X, Y and Z terminals, and is used to extract a current on the data line 86 without loading it. A voltage source 88 applies a negative programming voltage at the Y terminal of the CC 87. In the CC 87, the X terminal is forced by feedback to have the same voltage as that of the Y terminal. Also, the current on the X terminal is duplicated into the Z terminal of the CC 87. A current-controlled voltage source (CCVS) 89 has a positive node and a negative node. The CCVS 89 converts the current of the Z terminal of the CC 87 into a voltage Vext.

Vext is provided to the display controller and scheduler 64 of FIG. 3A, where the threshold voltage of the driving transistor 83 is extracted. The display controller and scheduler 64 controls the voltage source 88 based on the extracted threshold voltage.

Figure 6A:
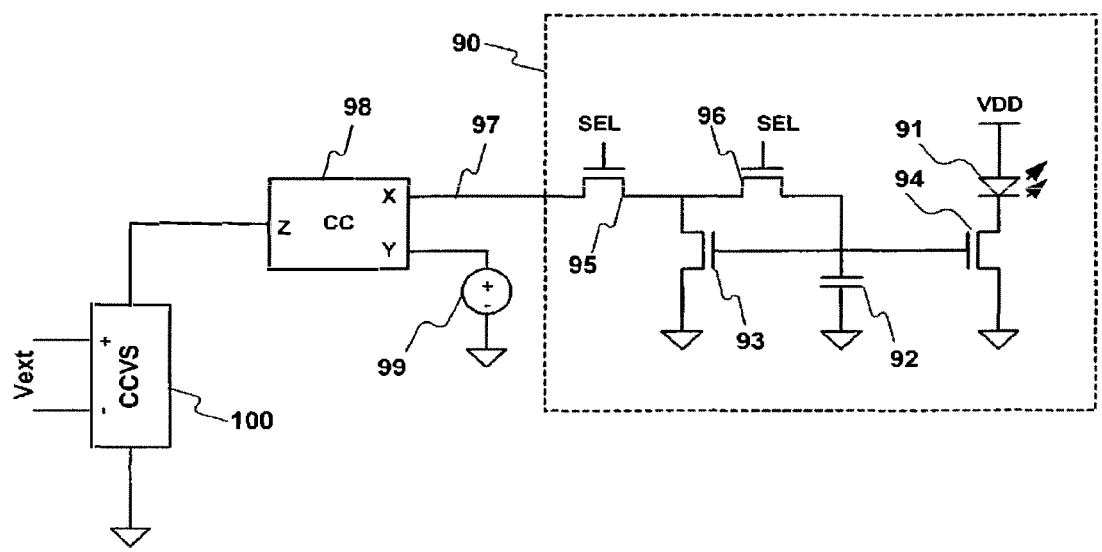
FIG. 6A is a diagram showing a further example of the extracting, programming and driving system of FIG. 3A and a pixel circuit.

FIG. 6A illustrates a further example of a system for the voltage-extracting, programming and driving of FIG. 3A, which is employed with a top-emission current-mirror pixel circuit 90. The pixel circuit 90 includes an OLED 91, a storage capacitor 92, mirror transistors 93 and 94, and switch transistors 95 and 96. The transistors 93, 94, 95 and 96 may be n-type TFTs. However, these transistors 93, 94, 95 and 96 may be p-type transistors.

The mirror transistor 93 is connected to a data line 97 through the switch transistor 95, and is connected to the storage capacitor 92 through the switch transistor 96. The gate terminals of the mirror transistors 93 and 94 are connected to the storage capacitor 92 and the switch transistor 96. The mirror transistor 94 is connected to a voltage supply electrode or line VDD through the OLED 91. The gate terminals of the switch transistors 85 and 86 are connected to a select line SEL. The pixel circuit 90 is selected by the select line SEL and is driven by DATA on the data line 97.

A current conveyor (CC) 98 has X, Y and Z terminals, and is used to extract the current of the data line 97 without loading it. A voltage source 99 applies a positive programming voltage at the Y terminal of the CC 98. In the CC 98, the X terminal is forced by feedback to have the same voltage as the voltage of the Y terminal. Also, the current on the X terminal is duplicated into the Z terminal of the CC 98. A current-controlled voltage source (CCVS) 100 has a positive node and a negative node. The CCVS 100 converts a current on the Z terminal of the CC 98 into a voltage Vext.

Vext is provided to the display controller and scheduler 64 of FIG. 3A, where the threshold voltage of the driving transistor 93 is extracted. The display controller and scheduler 64 controls the voltage source 99 based on the extracted threshold voltage.

Figure 7A:
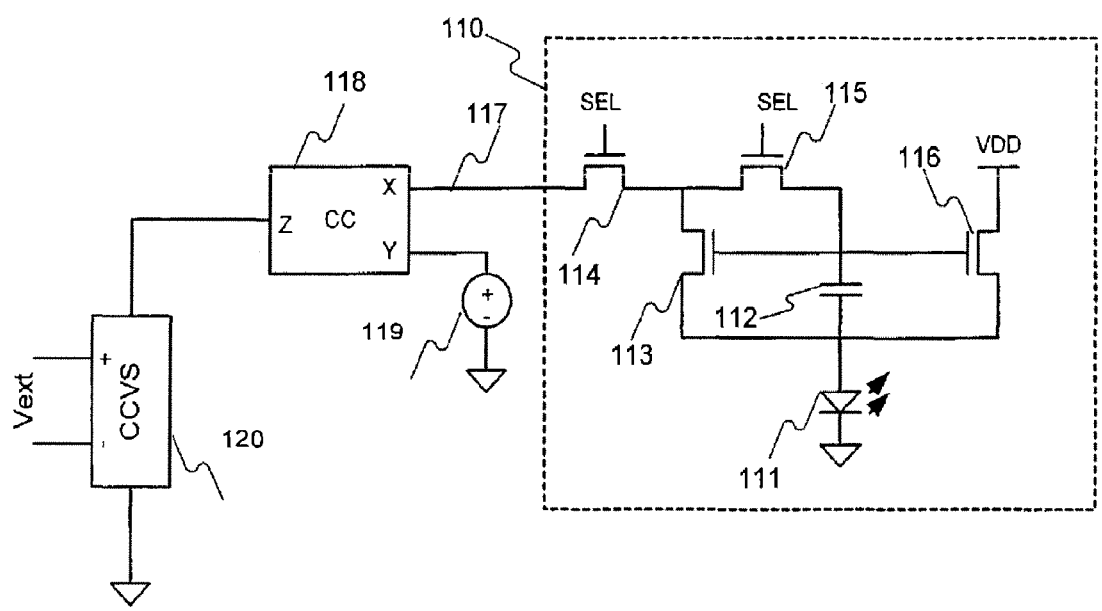
FIG. 7A is a diagram showing a further example of the extracting, programming and driving system of FIG. 3A and a pixel circuit.

FIG. 7A illustrates a further example of a system for the voltage-extracting, programming and driving of FIG. 3A, which is employed with a bottom-emission current-minor pixel circuit 110. The pixel circuit 110 includes an OLED 111, a storage capacitor 112, mirror transistors 113 and 116, and switch transistors 114 and 115. The transistors 113, 114, 115 and 116 may be n-type TFTs. However, these transistors 113, 114, 115 and 116 may be p-type transistors.

The mirror transistor 113 is connected to a data line 117 through the switch transistor 114, and is connected to the storage capacitor 112 through the switch transistor 115. The gate terminals of the mirror transistors 113 and 116 are connected to the storage capacitor 112 and the switch transistor 115. The minor transistor 116 is connected to a voltage supply line VDD. The mirror transistors 113, 116 and the storage capacitor 112 are connected to the OLED 111. The gate terminals of the switch transistors 114 and 115 are connected to a select line SEL. The pixel circuit 110 is selected by the select line SEL and is driven by DATA on the data line 117.

A current conveyor (CC) 118 has X, Y and Z terminals, and is used to extract the current of the data line 117 without loading it. A voltage source 119 applies a positive programming voltage at the Y terminal of the CC 118. In the CC 118, the X terminal is forced by feedback to have the same voltage as the voltage of the Y terminal of the CC 118. Also, the current on the X terminal is duplicated into the Z terminal of the CC 118. A current-controlled voltage source (CCVS) 120 has a positive node and a negative node. The 120 converts the current on the Z terminal of the CC 118 into a voltage Vext.

Vext is provided to the display controller and scheduler 64 of FIG. 3A, where the threshold voltage of the driving transistor 113 is extracted. The display controller and scheduler 64 controls the voltage source 119 based on the extracted threshold voltage.

Referring to FIGS. 3A-7A, using the voltage-extracting technique, time dependent parameters of a pixel (e.g. threshold shift) can be extracted. Thus, the programming voltage can be calibrated with the extracted information, resulting in a stable pixel current over time. Since the voltage of the OLED (i.e. 71 of FIG. 4A, 81 of FIG. 5A, 91 of FIG. 6A, 111 of FIG. 7A) affects the current directly, the voltage-extracting driving technique described above can also be used to extract OLED degradation as well as the threshold shift.

The voltage-extracting technique described above can be used with any current-mode pixel circuit, including current-mirror and current-cell pixel circuit architectures, and are applicable to the display array 10 of FIG. 2A. A stable current independent of pixel aging under prolonged display operation can be provided using the extracted information. Thus, the display operating lifetime is efficiently improved.

It is noted that the transistors in the pixel circuits of FIGS. 3A-7A may be fabricated using amorphous silicon, nano/ micro crystalline silicon, poly silicon, organic semiconductors technologies (e.g. organic TFT), NMOS/PMOS technology or CMOS technology (e.g. MOSFET). The pixel circuits of FIGS. 3A-7A may form AMOLED display arrays.

A further technique for programming, extracting time dependent parameters of a pixel and driving the pixel is described in detail with reference to FIGS. 8A-17A. The technique includes a step-calibration driving technique. In the step-calibration driving technique, information on the aging of a pixel (e.g. threshold shift) is extracted. The extracted information will be used to generate a stable pixel current/luminance. Despite using the one-bit extraction technique, the resolution of the extracted aging is defined by display drivers. Also, the dynamic effects are compensated since the pixel aging is extracted under operating condition, which is similar to the driving cycle.

Figure 8A:
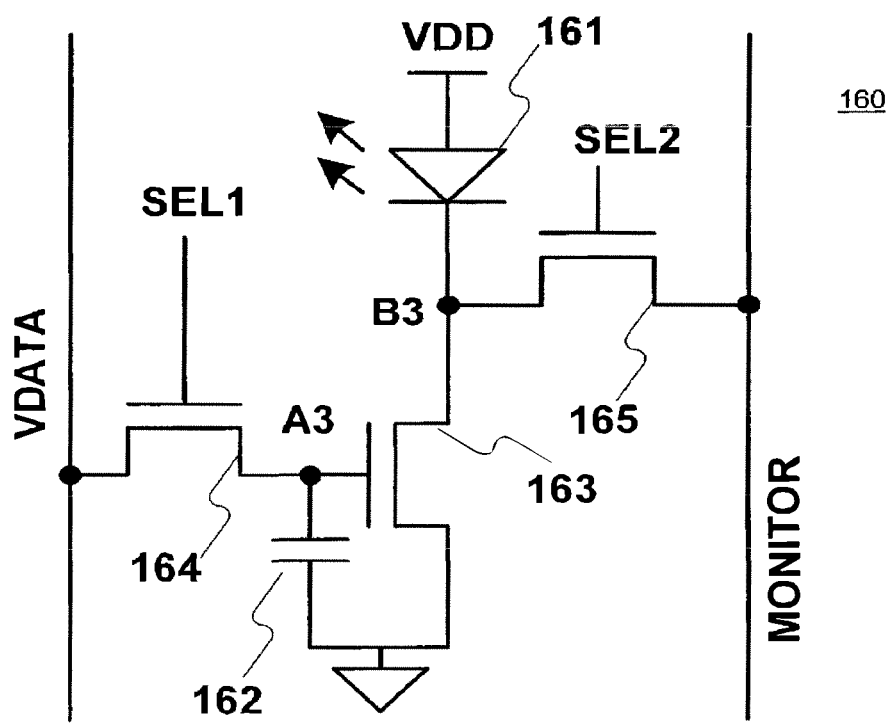
FIG. 8A is a diagram showing a pixel circuit to which a step-calibration driving in accordance with an embodiment of the present invention is applied.

FIG. 8A illustrates a pixel circuit 160 to which a step-calibration driving in accordance with an embodiment of the present invention is applied. The pixel circuit 160 includes an OLED 161, a storage capacitor 162, and a driving transistor 163 and switch transistors 164 and 165. The pixel circuit 160 is a current-programmed, 3-TFT pixel circuit. A plurality of the pixel circuits 160 may form an AMOLED display.

The transistors 163, 164 and 165 are n-type TFTs. However, the transistors 163, 164 and 165 may be p-type TFTs. The step-calibration driving technique applied to the pixel circuit 160 is also applicable to a pixel circuit having p-type transistors. The transistors 163, 164 and 165 may be fabricated using amorphous silicon, nano/micro crystalline silicon, poly silicon, organic semiconductors technologies (e.g. organic TFT), NMOS/PMOS technology or CMOS technology (e.g. MOSFET).

The gate terminal of the driving transistor 163 is connected to a signal line VDATA through the switch transistor 164, and also connected to the storage capacitor 162. The source terminal of the driving transistor 163 is connected to a common ground. The drain terminal of the driving transistor 163 is connected to a monitor line MONITOR through the switch transistor 165, and also is connected to the cathode electrode of the OLED 161.

The gate terminal of the switch transistor 164 is connected to a select line SEL1. The source terminal of the switch transistor 164 is connected to the gate terminal of the driving transistor 163, and is connected to the storage capacitor 162. The drain terminal of the switch transistor 164 is connected to VDATA.

The gate terminal of the switch transistor 165 is connected to a select line SEL2. The source terminal of the switch transistor 165 is connected to MONITOR. The drain terminal of the switch transistor 165 is connected to the drain terminal of the driving transistor 163 and the cathode electrode of the OLED 161. The anode electrode of the OLED 161 is connected to a voltage supply electrode or line VDD.

The transistors 163 and 164 and the storage capacitor 162 are connected at node A3. The transistors 163 and 165 and the OLED 161 are connected at node B3.

Figure 9A:
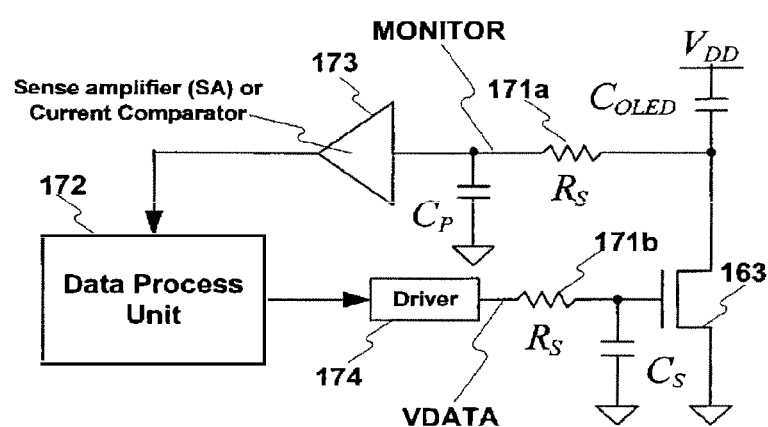
FIG. 9A is a diagram showing an example of a driver and extraction block and the driving transistor of FIG. 8A.

FIG. 9A illustrates an example of a driver and extraction block 170 along with the driving transistor 163 of FIG. 8A. In FIG. 9A, each of Rs 171a and Rs 171b represents the ON resistance of the switch transistors (e.g. 164, 165 of FIG. 8A). Cs represents the storage capacitor of the pixel, $C_{OLED}$ represents the OLED capacitance, and CP represents the line parasitic capacitance. In FIG. 9A, the OLED is presented as a capacitance.

A block 173 is used to extract the threshold voltage of the driving transistor, during the extraction cycle. The block 173 may be a current sense amplifier (SA) or a current comparator. In the description, the block 173 is referred to as "SA block 173".

If the current of the MONITOR line is higher than a reference current (IREF), the output of the SA block 173 (i.e. Triggers of FIG. 10A, 11A) becomes one. If the current of the MONITOR line is less than the reference current (IREF), the output of the SA block 173 becomes zero.

It is noted that the SA block 173 can be shared between few columns result in less overhead. Also, the calibration of the pixel circuit can be done one at a time, so the extraction circuits can be shared between the all columns.

A data process unit (DPU) block 172 is provided to control the programming cycle, contrast, and brightness, to perform the calibration procedure and to control the driving cycle. The DPU block 172 implements extraction algorithm to extract (estimate) the threshold voltage of the driving transistor based on the output from the SA block 173, and controls a driver 174 which is connected to the driving transistor 163.

Figure 10A:
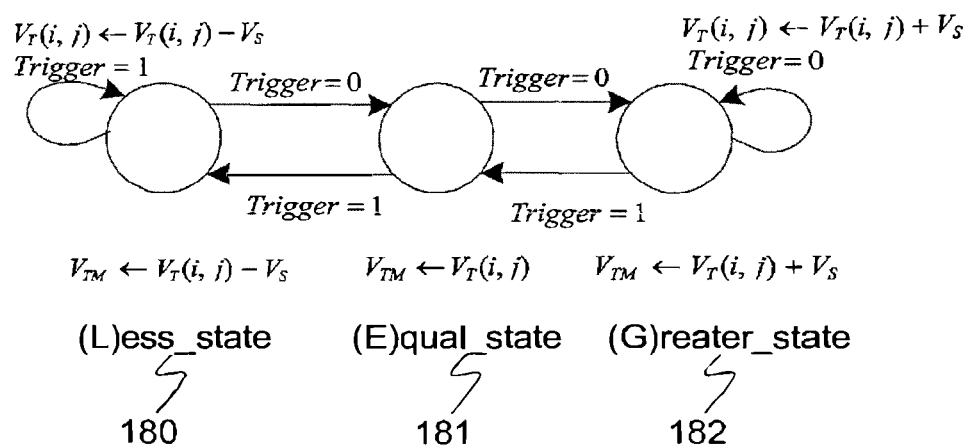
FIG. 10A is a diagram showing an example of an extraction algorithm implemented by a DPU block of FIG. 9A.

FIG. 10A illustrates an example of the extraction algorithm implemented by the DPU block 172 of FIG. 9A. The algorithm of FIG. 10A is in a part of the DPU block 172. In FIG. 10A, $V_T(i, j)$ represents the extracted threshold voltage for the pixel (i, j) at the previous extraction cycle, $V_S$ represents the resolution of the driver 174, "i" represents a row of a pixel array and "j" represents a column of a pixel array. Trigger conveys the comparison results of the SA block 173 of FIG. 9A. Less_state 180 determines the situation in which the actual $V_T$ of the pixel is less than the predicted $V_T(V_{TM})$, Equal_state 181 determines the situation in which the predicted $V_T(V_{TM})$ and the actual $V_T$ of the pixel are equal, and Great state 182 determines the situation in which the actual $V_T$ of the pixel is greater than the predicted $V_T$ ($V_{TM}$).

The DPU block 172 of FIG. 9A determines an intermediate threshold voltage $V_{TM}$ as follows:

(A1) When s(i, j)Less_state (180), the actual threshold voltage is less than $V_T(i, j)$, $V_{TM}$ is set to $(V_T(i, j)-V_S)$.
(A2) When s(i, j)=Equal_state (181), the actual threshold voltage is equal to VT(i, j), VTM is set to VT (i, j).
(A3) When s(i, j)=Greater_state (182), the actual threshold voltage is greater than $V_T(i, V_{TM}$ is set to $(V_T(i, j)\pm V_S)$.
where s(i, j) represents the previous state of the pixel (i, j) stored in a calibration memory (e.g. 208 of FIG. 16A).

Figure 11A:
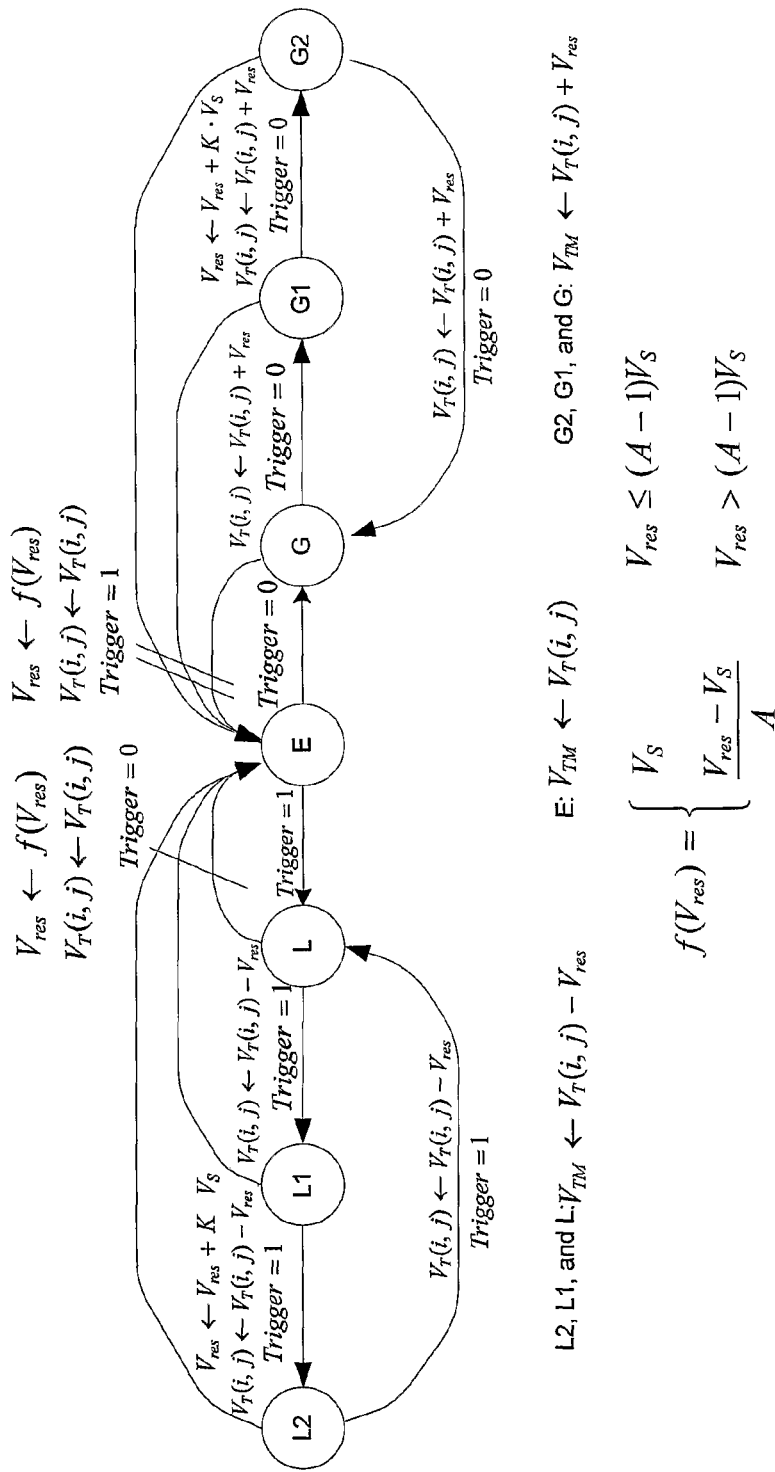
FIG. 11A is a diagram showing a further example of the extraction algorithm implemented by the DPU block of FIG. 9A.

FIG. 11A illustrates a further example of the extraction algorithm implemented by the DPU block 172 of FIG. 9A. The algorithm of FIG. 11A is in a part of the DPU block 172 of FIG. 9A. In FIG. 11A, $V_T(i, j)$ represents the extracted threshold voltage for the pixel (i, j) at the previous extraction cycle, $V_S$ represents the resolution of the driver 174, "i" represents a row of a pixel array and "j" represents a column of a pixel array. Trigger conveys the comparison results of the SA block 173.

Further, in FIG. 11A, Vres represents the step that will be added/subtracted to the predicted $V_T$ ($V_{TM}$) in order achieve the actual $V_T$ of the pixel, A represents the reduction gain of a prediction step, and K represents the increase gain of the prediction step.

The operation of FIG. 11A is the same as that of FIG. 10A, except that it has gain extra states L2 and G2 for rapid extraction of abrupt changes. In the gain states, the step size is increased to follow the changes more rapidly. L1 and G1 are the transition states which define the $V_T$ change is abrupt or normal.

Figure 12A:
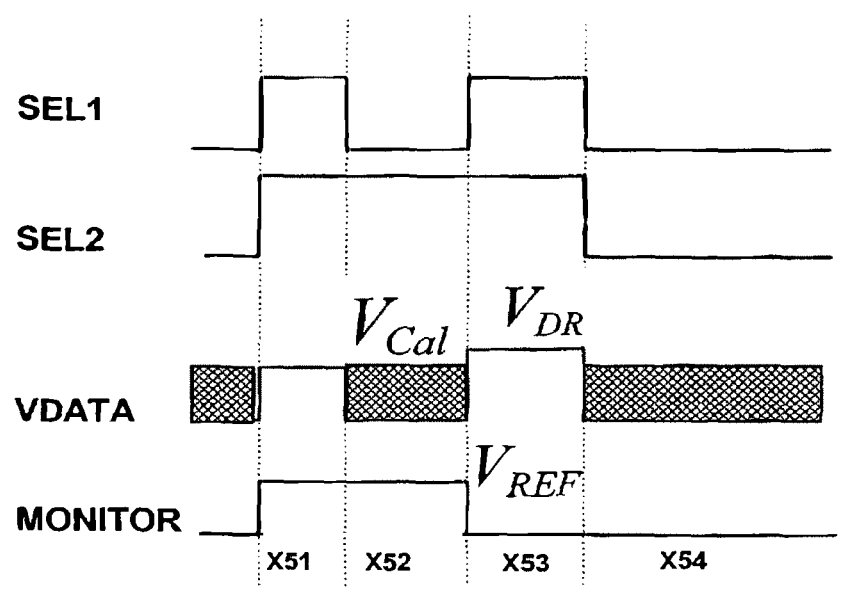
FIG. 12A is a timing diagram showing an example of waveforms for the step-calibration driving.

FIG. 12A illustrates an example of waveforms applied to the pixel circuit 160 of FIG. 8A. In FIG. 12A, $V_{cal}=V_B+V_{TM}$, and $V_{DR}=V_P+V_T(i, j)+V_{REF}$, where $V_B$ represents the bias voltage during the extraction cycle, $V_{TM}$ is defined based on the algorithm shown in FIG. 10A or 11A, $V_P$ represents a programming voltage, $V_T(i, j)$ represents the extracted threshold voltage at the previous extraction cycle, $V_{REF}$ represents the source voltage of the driving transistor during the programming cycle.

Referring to FIGS. 8A-12A, the operation of the pixel circuit 160 includes operating cycles X51, X52, X53, and X54. In FIG. 12A, an extraction cycle is separated from a programming cycle. The extraction cycle includes X51 and X52, and the programming cycle includes X53. X54 is a driving cycle. At the end of the programming cycle, node A3 is charged to $(V_P+V_T)$ where $V_P$ is a programming voltage and $V_T$ is the threshold voltage of the driving transistor 163.

In the first operating cycle X51: SEL1 and SEL 2 are high. Node A3 is charged to $V_{cal}$, and node B3 is charged to $V_{REF}$. $V_{cal}$ is $V_B \pm V_{TM}$ in which $V_B$ is a bias voltage, and $V_{TM}$ the predicted $V_T$, and $V_{REF}$ should be larger than $V_{DD}-V_{OLED0}$ where $V_{OLED0}$ is the ON voltage of the OLED 161.

In the second operating cycle X52: SEL1 goes to zero. The gate-source voltage of the driving transistor 163 is given by:

$$VGS = V_B = V_{TM}\Delta + V_B\Delta + V_{TM}\Delta - V_{T2}\Delta - V_H$$

where VGS represents the gate-source voltage of the driving transistor 163, $\Delta V_B$, $\Delta V_{TM}$, $\Delta V_{T2}$ and $\Delta V_H$ are the dynamic effects depending on $V_B$, $V_{TM}$, $V_{T2}$ and $V_H$, respectively. $V_{T2}$ represents the threshold voltage of the switch transistor 164, and $V_H$ represents the change in the voltage of SEL1 at the beginning of second operating cycle X52 when it goes to zero.

The SA block 173 is tuned to sense the current larger than $\beta(V_B)^2$, so that the gate-source voltage of the driving transistor 163 is larger than $(V_B+V_T)$, where $\beta$ is the gain parameter in the I-V characteristic of the driving transistor 163.

As a result, after few iterations, $V_{TM}$ and the extracted threshold voltage $V_T(i, j)$ for the pixel (i, j) converge to:

$$V_{TM} = V_T - \gamma \cdot (V_B + V_T + V_{T2} - V_H)$$

$$\gamma = \frac{C_{g2}/(2 \cdot C_S)}{1 + C_{g2}/(2 \cdot C_S)}$$

where $C_{g2}$ represents the gate capacitance of the switch transistor 164.

In the third operating cycle X53: SEL1 is high. VDATA goes to $V_{DR}$. Node A3 is charged to $[V_P+V_T(i, j)-\gamma(V_P-V_B)]$.

In the fourth operating cycle X54: SEL1 and SEL2 go to zero. Considering the dynamic effects, the gate-source voltage of the driving transistor 163 can be written as:

$$VGS = V_P + V_T$$

Therefore, the pixel current becomes independent of the static and dynamic effects of the threshold voltage shift.

Figure 13A:
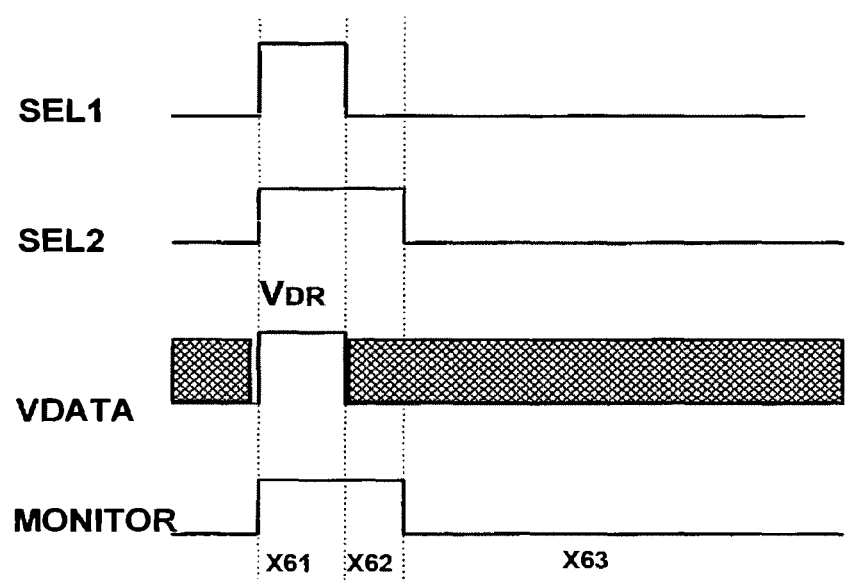
FIG. 13A is a timing diagram showing a further example of waveforms for the step-calibration driving.

In FIG. 12A, the extraction cycle and the programming cycle are shown as separated cycles. However, the extraction cycle and the programming cycle may be merged as shown in FIG. 13A. FIG. 13A illustrates a further example of waveforms applied to the pixel circuit 160 of FIG. 8A.

Referring to FIGS. 8A-11A and 13A, the operation of the pixel circuit 160 includes operating cycles X61, X62 and X63. Programming and extraction cycles are merged into the operating cycles X61 and X62. The operating cycle X63 is a driving cycle.

During the programming cycle, the pixel current is compared with the desired current, and the threshold voltage of the driving transistor is extracted with the algorithm of FIG. 10A or 11A. The pixel circuit 160 is programmed with $V_{DR}=VP+V_T (i, j)+V_{REF}$ during the operating cycle X61. Then the pixel current is monitored through the MONITOR line, and is compared with the desired current. Based on the comparison result and using the extraction algorithm of FIG. 10A or 11A, the threshold voltage $V_T (i, j)$ is updated.

In FIG. 8A, two select lines SEL1 and SEL2 are shown. However, a signal select line (e.g. SEL1) can be used as a common select line to operate the switch transistors 164 and 165. When using the common select line, SEL1 of FIG. 12A stays at high in the second operating cycle X52, and the VGS remains at $(V_B+V_{TM})$. Therefore, the dynamic effects are not detected.

Figure 14A:
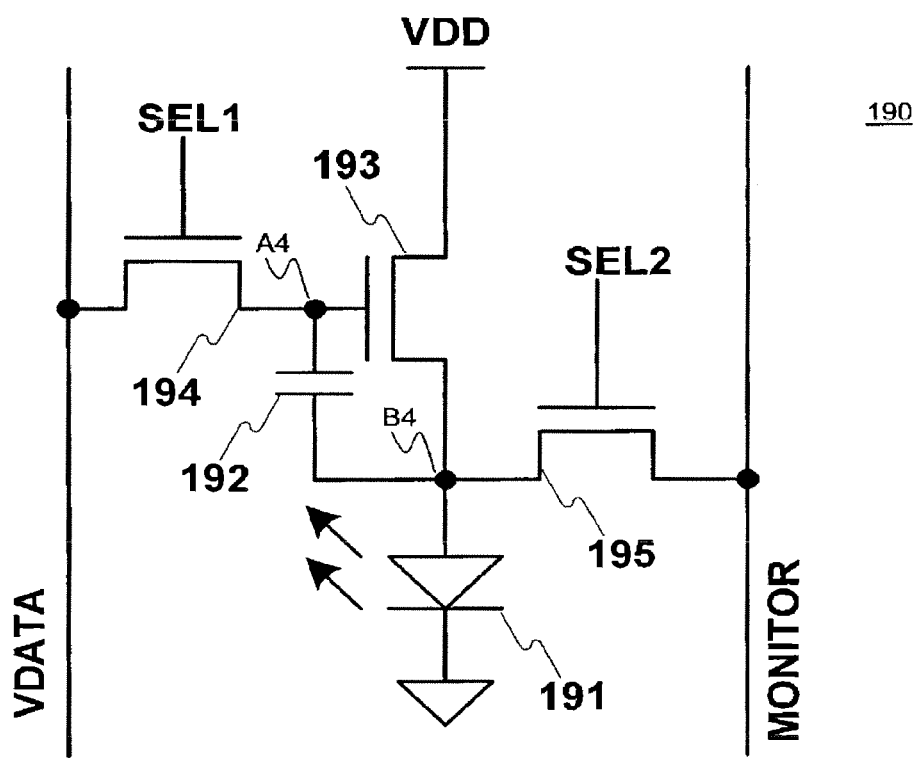
FIG. 14A is a diagram showing a pixel circuit to which the step-calibration driving is applicable.

The step-calibration driving technique described above is applicable to the pixel circuit 190 of FIG. 14A. The pixel circuit 190 includes an OLED 191, a storage capacitor 192, and a driving transistor 193 and switch transistors 194 and 195. The pixel circuit 190 is a current-programmed, 3-TFT pixel circuit. A plurality of the pixel circuits 190 may form an AMOLED display.

The transistors 193, 194 and 195 are n-type TFTs. However, the transistors 193, 194 and 195 may be p-type TFTs. The step-calibration driving technique applied to the pixel circuit 190 is also applicable to a pixel circuit having p-type transistors. The transistors 193, 194 and 195 may be fabricated using amorphous silicon, nano/micro crystalline silicon, poly silicon, organic semiconductors technologies (e.g. organic TFT), NMOS/PMOS technology or CMOS technology (e.g. MOSFET).

The gate terminal of the driving transistor 193 is connected to a signal line VDATA through the switch transistor 194, and also connected to the storage capacitor 192. The source terminal of the driving transistor 193 is connected to the anode electrode of the OLED 191, and is connected to a monitor line MONITOR through the switch transistor 195. The drain terminal of the driving transistor 193 is connected to a voltage supply line VDD. The gate terminals of the transistors 194 and 195 are connected to select lines SEL1 and SEL2, respectively.

The transistors 193 and 194 and the storage capacitor 192 are connected at node A4. The transistor 195, the OLED 191 and the storage capacitor 192 are connected at node B4.

The structure of the pixel circuit 190 is similar to that of FIG. 8A, except that the OLED 191 is at the source terminal of the driving transistor 193. The operation of the pixel circuit 190 is the same as that of FIG. 12A or 13A.

Since the source terminal of the drive TFT 193 is forced to VREF during the extraction cycle (X51 and X52 or X62), the extracted data is independent of the ground bouncing. Also, during the programming cycle (X53 or X61), the source terminal of the drive TFT is forced to VREF, the gate-source voltage of the drive TFT becomes independent of the ground bouncing. As a result of these conditions, the pixel current is independent of ground bouncing.

Figure 15A:
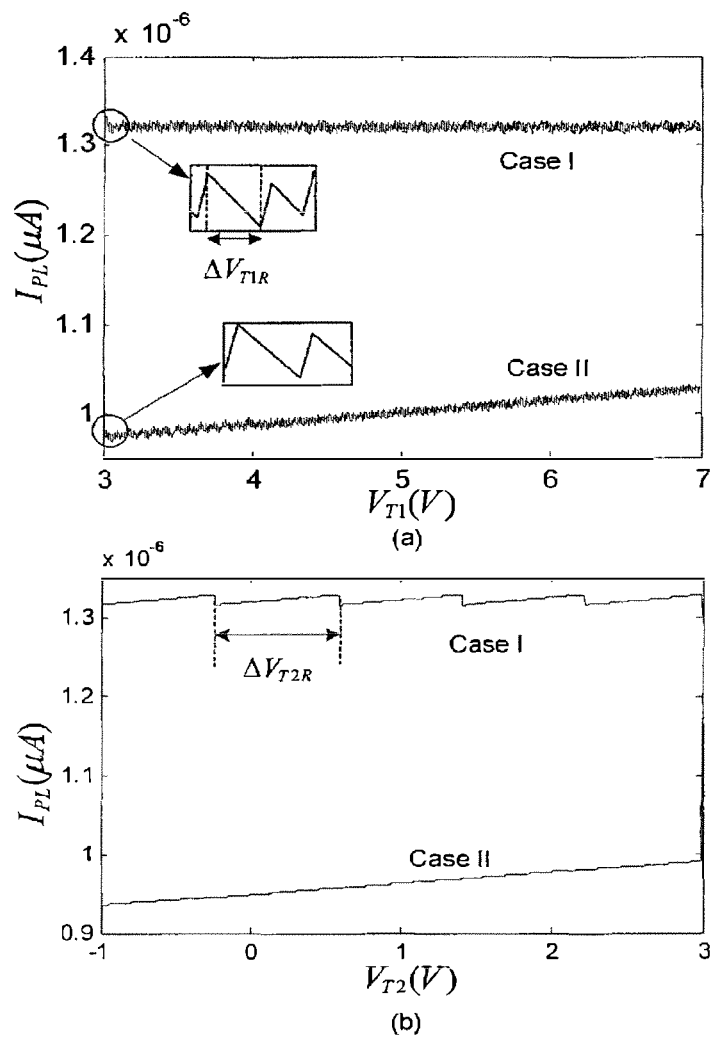
FIG. 15A is a graph showing the results of simulation for the step-calibration driving.

FIG. 15A illustrates the results of simulation for the step-calibration driving technique. In FIG. 15A, "Case I" represents an operation of FIG. 8A where SELL goes to zero in the second operating cycle (X52 of FIG. 12A); "Case II" represents an operation of FIG. 8A where SEL1 stays at high in the second operating cycle.

In FIG. 15A, $\Delta V_{TR}$ is the minimum detectable shift in the threshold voltage of the driving transistor (e.g. 163 of FIG. 8A), $\Delta V_{T2R}$ is the minimum detectable shift in the threshold voltage of the switch transistor (e.g. 164 of FIG. 8A), and In is the pixel current of the pixel during the driving cycle.

The pixel current of Case II is smaller than that of Case I for a given programming voltage due to the dynamic effects of the threshold voltage shift. Also, the pixel current of Case II increases as the threshold voltage of the driving transistor increases (a), and decreases as the threshold voltage of the switch transistor decreases (b). However, the pixel current of Case I is stable. The maximum error induced in the pixel current is less than %0.5 for any shift in the threshold voltage of the driving and switch TFTs. It is obvious that $\Delta V_{T2R}$ is larger than $\Delta V_{TR}$ because the effect of a shift in VT on the pixel current is dominant. These two parameters are controlled by the resolution ($V_S$) of the driver (e.g. 174 of FIG. 9A), and the SNR of the SA block (e.g. 193 of FIG. 9A). Since a shift smaller than $\Delta V_{TR}$ cannot be detected, and also the time constant of threshold-shift is large, the extraction cycles (e.g. X51, X52 of FIG. 12A) can be done after a long time interval consisting of several frames, leading to lower power consumption. Also, the major operating cycles become the other programming cycle (e.g. X53 of FIG. 12A) and the driving cycle (e.g. X54 of FIG. 12A). As a result, the programming time reduces significantly, providing for high-resolution, large-area AMOLED displays where a high-speed programming is prerequisite.

Figure 16A:
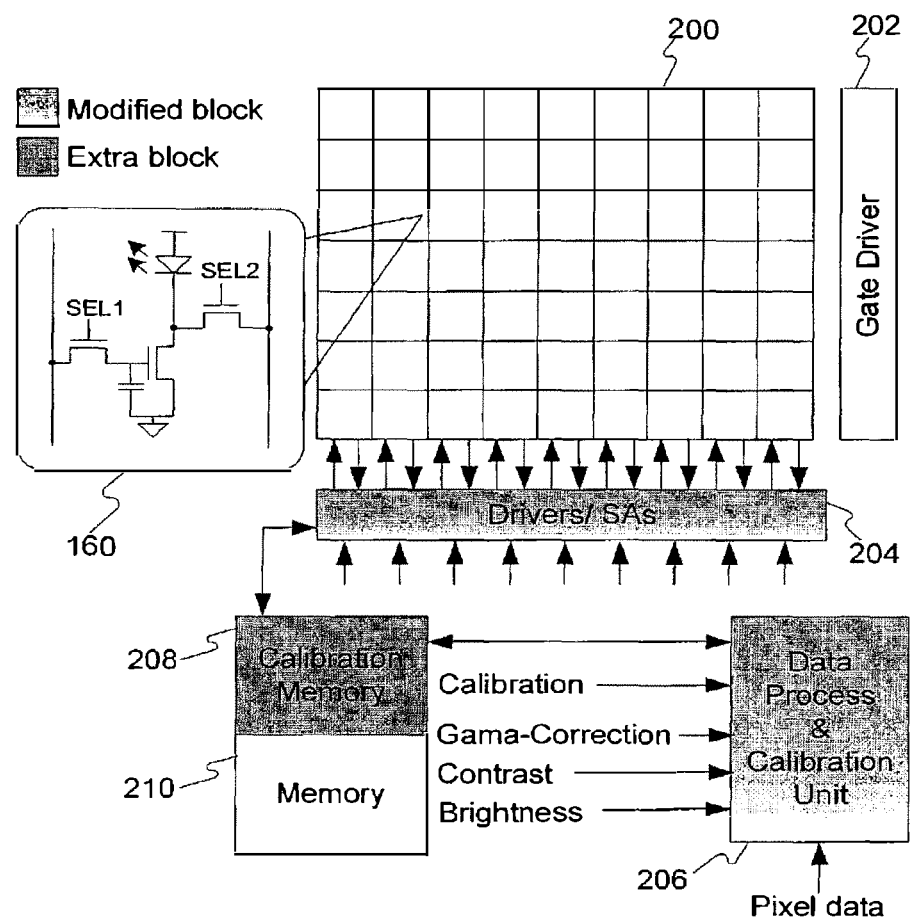
FIG. 16A is a diagram showing an example of a system architecture for the step-calibration driving with a display array.

FIG. 16A illustrates an example of a system architecture for the step-calibration driving with a display array 200. The display array 200 includes a plurality of the pixel circuits (e.g. 160 of FIG. 8A or 190 of FIG. 14A).

A gate driver 202 for selecting the pixel circuits, a drivers/SAs block 204, and a data process and calibration unit block 206 are provided to the display array 200. The drivers/SAs block 204 includes the driver 174 and the SA block 173 of FIG. 9A. The data process and calibration unit block 206 includes the DPU block 172 of FIG. 9A. "Calibration" in FIG. 16A includes the calibration data from a calibration memory 208, and may include some user defined constants for setting up calibration data processing. The contrast and the brightness inputs are used to adjust the contrast and the brightness of the panel by the user. Also, gamma-correction data is defined based on the OLED characteristic and human eye. The gamma-correction input is used to adjust the pixel luminance for human eyes.

The calibration memory 208 stores the extracted threshold voltage $V_T(i, j)$ and the state $s(i, j)$ of each pixel. A memory 210 stores the other required data for the normal operation of a display including gamma correction, resolution, contrast, and etc. The DPU block performs the normal tasks assigned to a controller and scheduler in a display. Besides, the algorithm of FIG. 10A or 11A is added to it to perform the calibration.

Figure 17A:
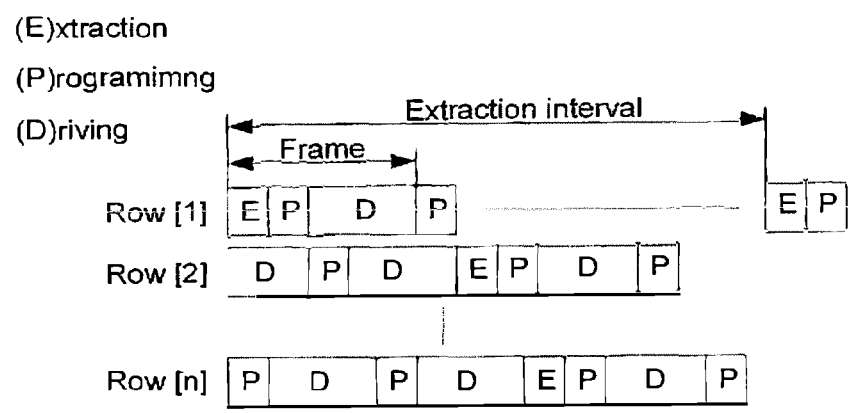
FIG. 17A is a timing diagram showing an example of waveforms applied to the system architecture of FIG. 16A.

FIG. 17A illustrates an example of waveforms applied to the system architecture of FIG. 16A. In FIG. 17A, each of ROW[1], ROW[2], and ROW[3] represents a row of the display array 200, "E" represents an extraction operation, "P" represents a programming operation and "D" represents a driving operation. It is noted that the extraction cycles (E) are not required to be done for all the frame cycle. Therefore, after a long time interval (extraction interval), the extraction is repeated for a pixel.

As shown in FIG. 17A, only one extraction procedure occurs during a frame time. Also, the VT extraction of the pixel circuits at the same row is preformed at the same time.

Therefore, the maximum time required to refresh a frame is:

$$\tau_F = \tau_P \cdot n + \tau_E$$

where $\tau_F$ represents the frame time, $\tau_P$ represents the time required to write the pixel data into the storage capacitor (e.g. 162 of FIG. 8A), $\tau_E$ represents the extraction time, and n represents the number of row in the display array (e.g. 200 of FIG. 16A).

Assuming $\tau_E = m \cdot \tau_P$, the frame time $\tau_F$ can be written as:

$$\tau_F = (n+m) \cdot \tau_P$$

where m represents the timing required for the extraction cycles in the scale of programming cycle timing ($\tau_P$).

For example, for a Quarter Video Graphics Array (QVGA) display (240×320) with frame rate of 60 Hz, if m=10, the programming time of each row is 6611 s, and the extraction time is 0.66 ms.

It is noted that the step-calibration driving technique described above is applicable to any current-programmed pixel circuit other than those of FIGS. 8A and 14A.

Using the step-calibration driving technique, the time dependent parameter(s) of a pixel, such as threshold shift, is extracted. Then, the programming-voltage is calibrated with the extracted information, resulting in a stable pixel current over time. Further, a stable current independent of the pixel aging under prolonged display operation can be is provided to the pixel circuit, which efficiently improves the display operating lifetime.

A technique for programming, extracting time dependent parameters of a pixel and driving the pixel in accordance with a further embodiment of the present invention is described in detail. The technique includes extracting information on the aging of a pixel (e.g. OLED luminance) by monitoring OLED voltage or OLED current, and generating luminance. The programming voltage is calibrated with the extracted information, resulting in stable brightness over time.

Since the OLED voltage/current has been reported to be correlated with the brightness degradation in the OLED (e.g. 161 of FIG. 8A, 191 of FIG. 14A), the programming voltage can be modified by the OLED voltage/current to provide a constant brightness.

For example, during the driving cycle, the voltage/current of the OLED (161 of FIG. 8A or 191 of FIG. 14A) is extracted while SEL2 is high. Since the OLED voltage or current has been reported to be correlated with the brightness degradation in the OLED, the programming voltage can be modified by the OLED voltage to provide a constant brightness.

Figure 18A:
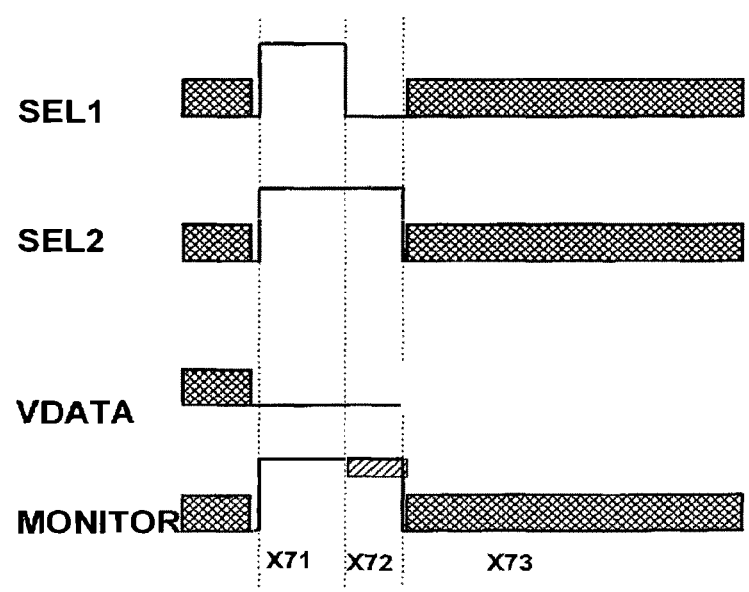
FIG. 18A is a timing diagram showing an example of waveforms for a voltage/current extraction.

FIG. 18A illustrates an example of waveforms for the voltage/current extraction. The waveforms of FIG. 18A are applicable to the pixel circuit 160 of FIG. 8A and the pixel circuit 190 of FIG. 14A to extract OLED voltage/current. The operation of FIG. 18A includes operating cycles X71, X72 and X73. The operating cycles X71 and X72 are an OLED extraction cycle. The operating cycle X73 is one of the operating cycles shown in FIGS. 12A and 13.

During the first operating cycle X71, SEL1 and SEL2 are high, and VDATA is zero. The gate-source voltage of the driving transistor (e.g. 163 of FIG. 8A) becomes zero. A current or voltage is applied to the OLED (161 of FIG. 8A) through the MONITOR line.

During the second operating cycle X72, SEL2 is high and SEL1 is low. The OLED voltage or current is extracted through the MONITOR line using the algorithm presented in FIG. 10A or 11A. This waveform can be combined with any other driving waveform.

In the above description, the algorithm of FIGS. 10A and 11A is used to predict the aging data, i.e. $V_T$ shift, based on the comparison results (current with current or voltage with voltage). However, the algorithm of FIGS. 10A and 11A is applicable to predict the shift in the OLED voltage $V_{OLED}$ by replacing $V_T$ with the $V_{OLED}$ and the comparison result of OLED current/voltage with a reference current/voltage. In the description above, the system architecture shown in FIG. 9A is used to compensate for the threshold shift. However, it is understood that the OLED data is also extracted when the architecture of FIG. 9A, i.e. DPU 172, block 173, driver 174, is used. This data can be used to compensate for the OLED shift.

The operating cycle X73 can be any operating cycle including the programming cycle. This depends on the status of the panel after OLED extraction. If it is during the operation, then X73 is the programming cycle of the waveforms in FIGS. 12A and 13A. The OLED voltage can be extracted during the driving cycle X55/X63 of FIG. 12A/13A. During the driving cycle X55/X63, the SEL2 of FIG. 8A or 14A goes to a high voltage, and so the voltage of the OLED can be read back through the MONITOR for a specific pixel current.

Figure 19A:
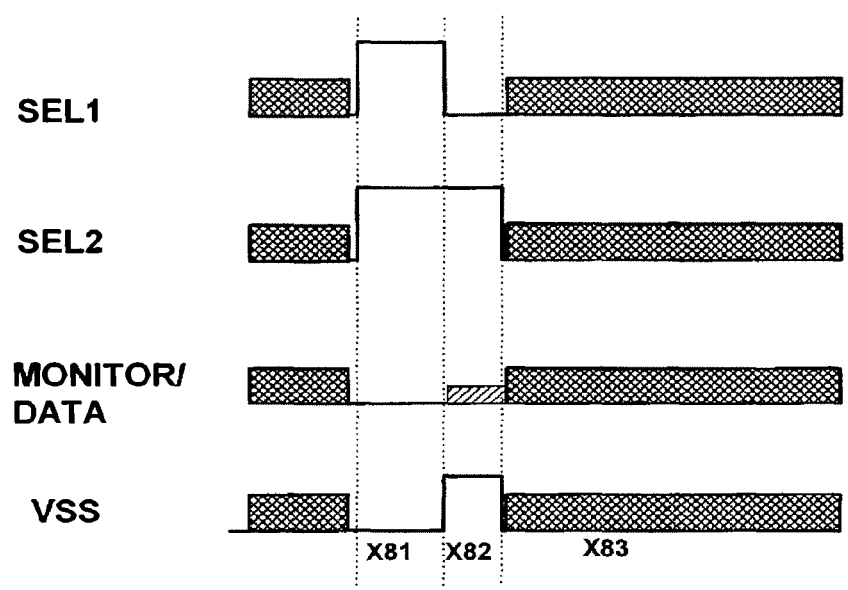
FIG. 19A is a timing diagram showing a further example of waveforms for the voltage/current extraction.
Figure 20A:
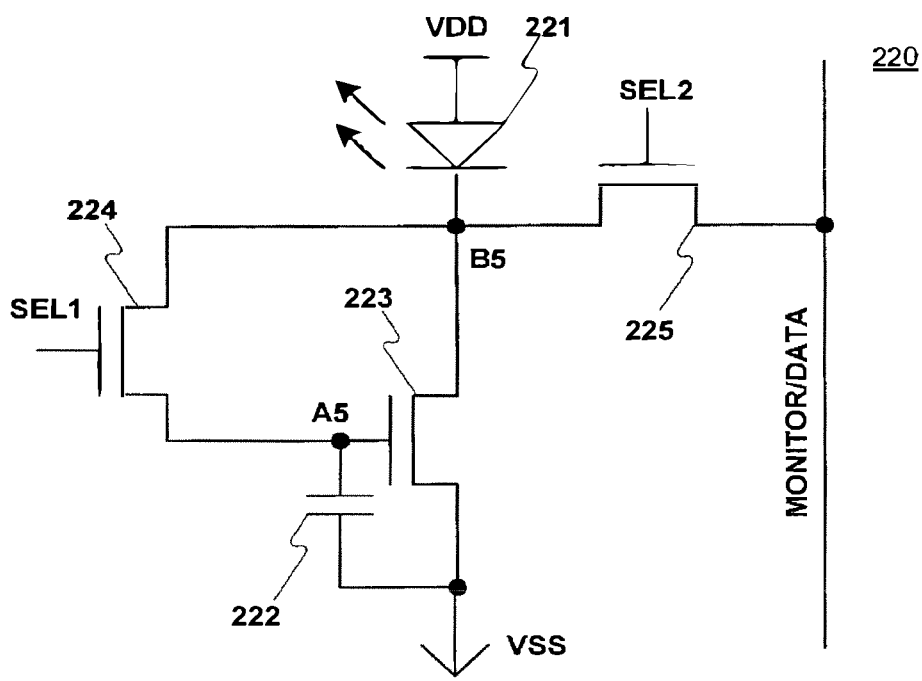
FIG. 20A is a diagram showing a pixel circuit to which the voltage/current extraction of FIG. 19A is applicable.

FIG. 19A illustrates a further example of waveforms for the voltage/current extraction. FIG. 20A illustrates a pixel circuit 220 to which the voltage/current extraction of FIG. 19A is applied.

Referring to FIG. 20A, the pixel circuit 220 includes an OLED 221, a storage capacitor 222, and a driving transistor 223 and switch transistors 224 and 225. A plurality of the pixel circuits 220 may form an AMOLED display.

The transistors 223, 224 and 225 are n-type TFTs. However, the transistors 223, 224 and 225 may be p-type TFTs. The voltage/current extraction technique applied to the pixel circuit 220 is also applicable to a pixel circuit having p-type transistors. The transistors 223, 224 and 225 may be fabricated using amorphous silicon, nano/micro crystalline silicon, poly silicon, organic semiconductors technologies (e.g. organic TFT), NMOS/PMOS technology or CMOS technology (e.g. MOSFET).

The gate terminal of the driving transistor 223 is connected to the source terminal of the switch transistor 224, and also connected to the storage capacitor 222. The one terminal of the driving transistor 223 is connected to a common ground. The other terminal of the driving transistor 223 is connected to a monitor and data line MONITOR/DATA through the switch transistor 235, and is also connected to the cathode electrode of the OLED 221.

The gate terminal of the switch transistor 224 is connected to a select line SELL. The one terminal of the switch transistor 224 is connected to the gate terminal of the driving transistor 223, and is connected to the storage capacitor 222. The other terminal of the switch transistor 224 is connected to the cathode electrode of the OLED 221.

The gate terminal of the switch transistor 225 is connected to a select line SEL2. The one terminal of the switch transistor 225 is connected to MONITOR/DATA. The other terminal of the switch transistor 225 is connected to the driving transistor 223 and the cathode electrode of the OLED 221. The anode electrode of the OLED 221 is connected to a voltage supply electrode or line VDD.

The transistors 223 and 224 and the storage capacitor 222 are connected at node A5. The transistors 223 and 225 and the OLED 221 are connected at node B5.

The pixel circuit 220 is similar to the pixel circuit 160 of FIG. 8A. However, in the pixel circuit 220, the MONITOR/DATA line is used for monitoring and programming purpose.

Referring to FIGS. 19A-20A, the operation of the pixel circuit 220 includes operating cycles X81, X82 and X83.

During the first operating cycle X81, SEL1 and SEL2 are high and MONITOR/DATA is zero. The gate-source voltage of the driving transistor (223 of FIG. 20A) becomes zero.

During the second operating cycle X82, a current or voltage is applied to the OLED through the MONITOR/DATA line, and its voltage or current is extracted. As described above, the shift in the OLED voltage is extracted using the algorithm presented in FIG. 10A or 11A based on the monitored voltage or current. This waveform can be combined with any driving waveform.

The operating cycle X83 can be any operating cycle including the programming cycle. This depends on the status of the panel after OLED extraction.

The OLED voltage/current can be extracted during the driving cycle of the pixel circuit 220 of FIG. 20A after it is programmed for a constant current using any driving technique. During the driving cycle the SEL2 goes to a high voltage, and so the voltage of the OLED can be read back through the MONITOR/DATA line for a specific pixel current.

Figure 21A:
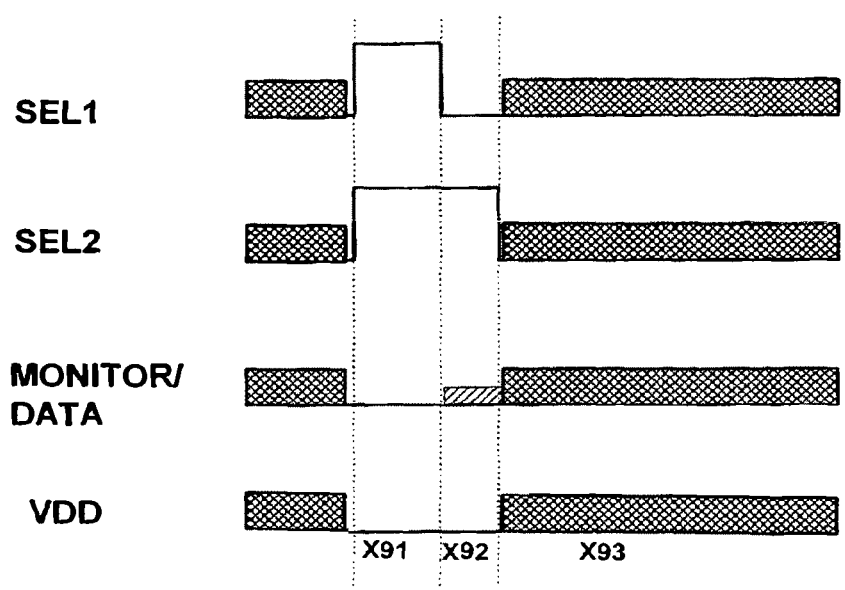
FIG. 21A is a timing diagram showing a further example of waveforms for the voltage/current extraction.
Figure 22A:
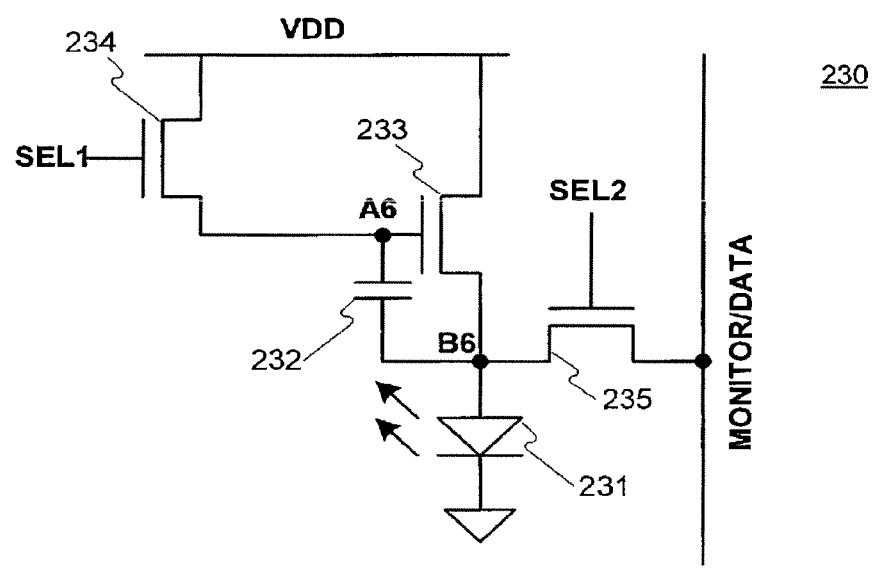
FIG. 22A is a diagram showing a pixel circuit to which the voltage/current extraction of FIG. 21A is applicable.

FIG. 21A illustrates a further example of waveforms for the voltage/current extraction technique. FIG. 22A illustrates a pixel circuit 230 to which the voltage/current extraction of FIG. 21A is applied. The waveforms of FIG. 21A is also applicable to the pixel circuit 160 of FIG. 8A to extract OLED voltage/current.

Referring to FIG. 22A, the pixel circuit 230 includes an OLED 231, a storage capacitor 232, and a driving transistor 233 and switch transistors 234 and 235. A plurality of the pixel circuits 230 may form an AMOLED display.

The transistors 233, 234 and 235 are n-type TFTs. However, the transistors 233, 234 and 235 may be p-type TFTs. The voltage/current extraction technique applied to the pixel circuit 230 is also applicable to a pixel circuit having p-type transistors. The transistors 233, 234 and 235 may be fabricated using amorphous silicon, nano/micro crystalline silicon, poly silicon, organic semiconductors technologies (e.g. organic TFT), NMOS/PMOS technology or CMOS technology (e.g. MOSFET).

The gate terminal of the driving transistor 233 is connected to the source terminal of the switch transistor 234, and also connected to the storage capacitor 232. The one terminal of the driving transistor 233 is connected to a voltage supply line VDD. The other terminal of the driving transistor 233 is connected to a monitor and data line MONITOR/DATA through the switch transistor 235, and is also connected to the anode electrode of the OLED 231.

The gate terminal of the switch transistor 234 is connected to a select line SELL. The one terminal of the switch transistor 234 is connected to the gate terminal of the driving transistor 233, and is connected to the storage capacitor 232. The other terminal of the switch transistor 234 is connected to VDD.

The gate terminal of the switch transistor 225 is connected to a select line SEL2. The one terminal of the switch transistor 235 is connected to MONITOR/DATA. The other terminal of the switch transistor 235 is connected to the driving transistor 233 and the anode electrode of the OLED 231. The anode electrode of the OLED 231 is connected to VDD.

The transistors 233 and 234 and the storage capacitor 232 are connected at node A6. The transistors 233 and 235 and the OLED 231 are connected at node B5.

The pixel circuit 230 is similar to the pixel circuit 190 of FIG. 14A. However, in the pixel circuit 230, the MONITOR/DATA line is used for monitoring and programming purpose.

Referring to FIGS. 21A-22A, the operation of FIG. 22A includes operating cycles X91, X92 and X93.

During the first operating cycle X91, SEL1 and SEL2 are high and VDD goes to zero. The gate-source voltage of the driving transistor (e.g. 233 of FIG. 21A) becomes zero.

During the second operating cycle X92, a current (voltage) is applied to the OLED (e.g. 231 of FIG. 21A) through the MONITOR/DATA line, and its voltage (current) is extracted. As described above, the shift in the OLED voltage is extracted using the algorithm presented in FIG. 10A or 11A based on the monitored voltage or current. This waveform can be combined with any other driving waveform.

The operating cycle X93 can be any operating cycle including the programming cycle. This depends on the status of the panel after OLED extraction.

The OLED voltage can be extracted during the driving cycle of the pixel circuit 230 of FIG. 21A after it is programmed for a constant current using any driving technique. During the driving cycle the SEL2 goes to a high voltage, and so the voltage of the OLED can be read back through the MONITOR/DATA line for a specific pixel current.

As reported, the OLED characteristics improve under negative bias stress. As a result, a negative bias related to the stress history of the pixel, extracted from the OLED voltage/current, can be applied to the OLED during the time in which the display is not operating. This method can be used for any pixel circuit presented herein.

Using the OLED voltage/current extraction technique, a pixel circuit can provide stable brightness that is independent of pixel aging under prolonged display operation, to efficiently improve the display operating lifetime.

A technique for reducing the unwanted emission in a display array having a light emitting device in accordance with an embodiment of the present invention is described in detail. This technique includes removing OLED from a programming path during a programming cycle. This technique can be adopted in hybrid driving technique to extract information on the precise again of a pixel, e.g. the actual threshold voltage shift/mismatch of the driving transistor. The light emitting device is turned off during the programming/calibration cycle so that it prevents the unwanted emission and effect of the light emitting device on the pixel aging. This technique can be applied to any current mirror pixel circuit fabricated in any technology including poly silicon, amorphous silicon, crystalline silicon, and organic materials.

Figure 23A:
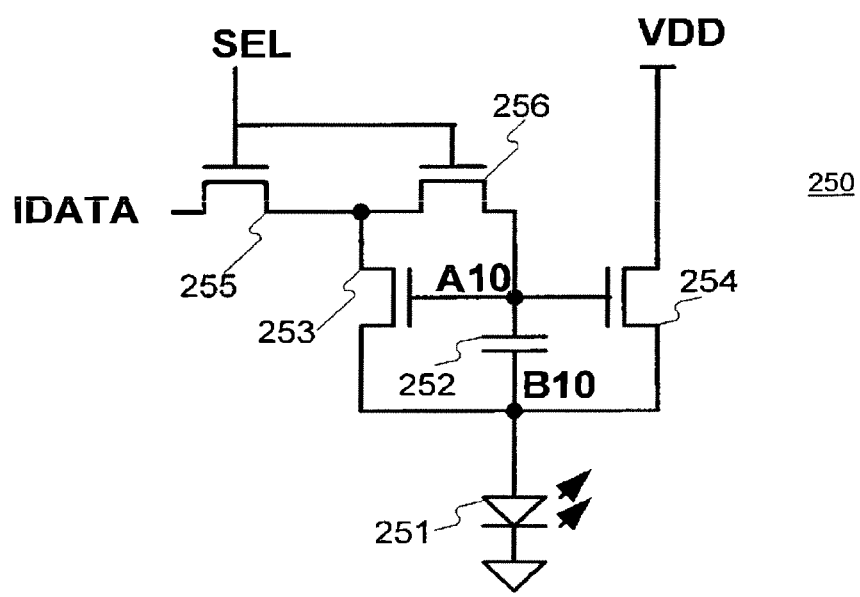
FIG. 23A is a diagram showing a mirror based pixel circuit to which OLED removing in accordance with an embodiment of the present invention is applied.

FIG. 23A illustrates a mirror based pixel circuit 250 to which a technique for removing OLED from a programming path during a programming cycle is applied. The pixel circuit 250 includes an OLED 251, a storage capacitor 252, a programming transistor 253, a driving transistor 254, and switch transistors 255 and 256. The gate terminals of the transistors 253 and 254 are connected to IDATA through the switch transistors 255 and 256.

The transistors 253, 254, 255 and 256 are n-type TFTs. However, the transistors 253, 254, 255 and 256 may be p-type TFTs. The OLED removing technique applied to the pixel circuit 250 is also applicable to a pixel circuit having p-type transistors. The transistors 253, 254, 255 and 256 may be fabricated using amorphous silicon, nano/micro crystalline silicon, poly silicon, organic semiconductors technologies (e.g. organic TFT), NMOS/PMOS technology or CMOS technology (e.g. MOSFET).

The transistors 253, 254 and 256 and the storage capacitor 252 are connected at node A10. The transistors 253 and 254, the OLED 251 and the storage capacitor 252 are connected at node B10.

In the conventional current programming, SEL goes high, and a programming current (IP) is applied to IDATA. Considering that the width of the mirror transistor 253 is "m" times larger than the width of the mirror transistor 254, the current flowing through the OLED 251 during the programming cycle is (m+1)IP. When "m" is large to gain significant speed improvement, the unwanted emission may become considerable.

By contrast, according to the OLED removing technique, VDD is brought into a lower voltage. This ensures the OLED 251 to be removed from a programming path as shown in FIG. 24A.

During a programming cycle, SEL is high and VDD goes to a reference voltage (Vref) in which the OLED 251 is reversely biased. Therefore, the OLED 251 is removed from the current path during the programming cycle.

During the programming cycle, the pixel circuit 250 may be programmed with scaled current through IDATA without experiencing unwanted emission.

During the programming cycle, the pixel circuit 250 may be programmed with current and using one of the techniques describe above. The voltage of the IDATA line is read back to extract the threshold voltage of the mirror transistor 253 which is the same as threshold voltage of the driving transistor 254.

Also, during the programming cycle, the pixel circuit 250 may be programmed with voltage through the IDATA line, using one of the techniques describe above. The current of the IDATA line is read back to extract the threshold voltage of the mirror transistor 253 which is the same as threshold voltage of the driving transistor 254.

The reference voltage Vref is chosen so that the voltage at node B10 becomes smaller than the ON voltage of the OLED 251. As a result, the OLED 251 turns off and the unwanted emission is zero. The voltage of the IDATA line includes $$V_P + V_T + \Delta VT \quad (3)$$

where $V_P$ includes the drain-source voltage of the driving transistor 254 and the gate-source voltage of the transistor 253, $V_T$ is the threshold voltage of the transistor 253 (254), and $\Delta V_T$ is the $V_T$ shift/mismatch.

At the end of the programming cycle, VDD goes to its original value, and so voltage at node B10 goes to the OLED voltage VOLED. At the driving cycle, SEL is low. The gate voltage of the transistor 254/253 is fixed and stored in the storage capacitor 252, since the switch transistors 255 and 256 are off. Therefore, the pixel current during the driving cycle becomes independent of the threshold voltage $V_T$.

The OLED removing technique can be adopted in hybrid driving technique to extract the $V_T$-shift or $V_T$-mismatch. From (3), if the pixel is programmed with the current, the only variant parameter in the voltage of the DATA line is the $V_T$ shift/mismatch ($\Delta V_T$). Therefore, $\Delta V_T$ can be extracted and the programming data can be calibrated with $\Delta V_T$.

Figure 25A:
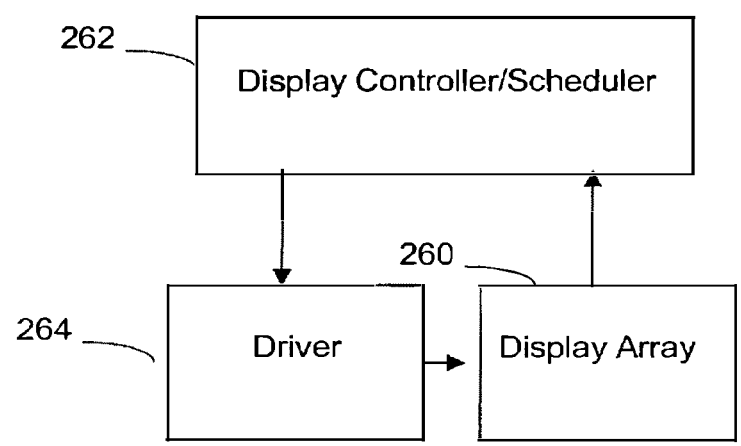
FIG. 25A is a diagram showing an example of a system architecture for the OLED removing.

FIG. 25A illustrates an example of a system architecture for implementing the OLED removing technique. A display array 260 includes a plurality of pixel circuits, e.g. pixel circuit 250 of FIG. 26A. A display controller and scheduler 262 controls and schedules the operation of the display array 260. A driver 264 provides operation voltages to the pixel circuit. The driver provides the operation voltage(s) to the pixel circuit based on instructions/commands from the display controller and scheduler 262 such that the OLED is removed from a programming path of the pixel circuit, as described above.

The controller and scheduler 262 may include functionality of the display controller and scheduler 64 of FIG. 3A, or may include functionality of the data process and calibration unit 206 of FIG. 16A. The system of FIG. 25A may have any of these functionalities, the calibration-scheduling described above, the voltage/current extraction described above, or combinations thereof.

Figure 26A:
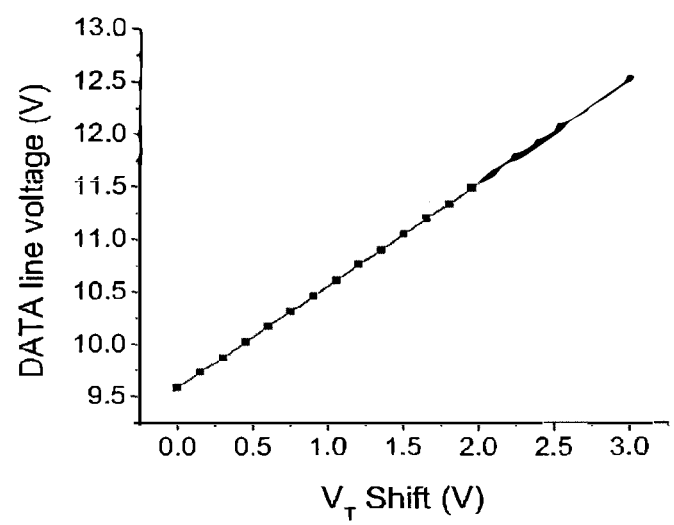
FIG. 26A is a graph showing the simulation result for the voltage on IDATA line for different threshold voltage.
Figure 11A:
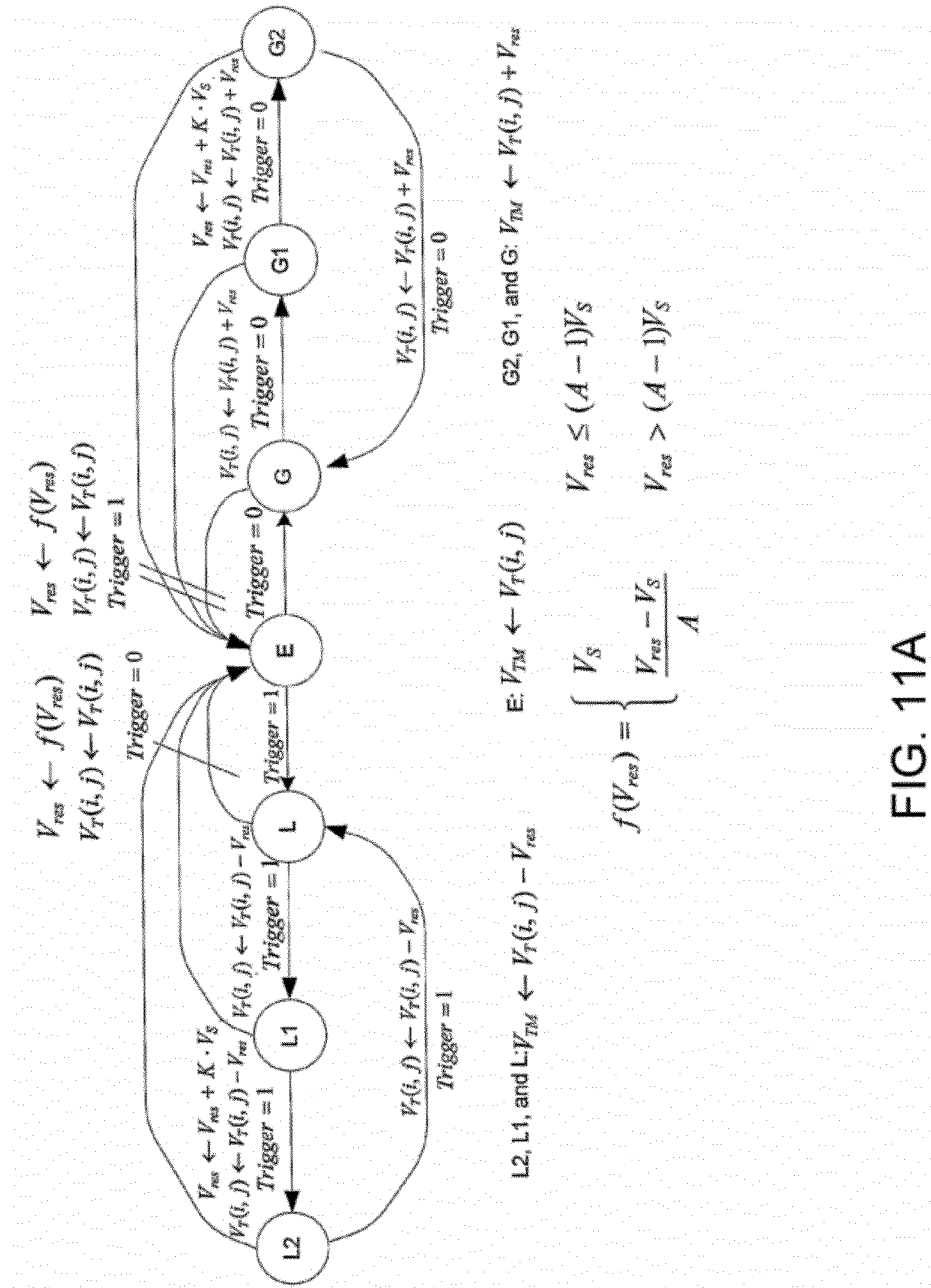

The simulation result for the voltage on IDATA line for different $V_T$ is illustrated in FIG. 26A. Referring to FIGS. 23A-26A, the voltage of the IDATA line includes the shift in the threshold voltage of the transistors 253 and 254. The programming current is 1 µA.

The unwanted emission is reduced significantly resulting in a higher resolution. Also, individual extraction of circuit aging and light emitting device aging become possible, leading in a more accurate calibration.

It is noted that each of the transistors shown in FIGS. 4A-8A,14A, 20A, 21A, 23A and 24A can be replaced with a p-type transistor using the concept of complementary circuits.

All citations are hereby incorporated by reference.
[Start of 13USP1]

Embodiments of the present invention are described using an AMOLED display which includes a pixel circuit having TFTs and an OLED. However, the transistors in the pixel circuit may be fabricated using amorphous silicon, nano/micro crystalline silicon, poly silicon, organic semiconductors technologies (e.g. organic TFT), NMOS technology, CMOS technology (e.g. MOSFET), or combinations thereof. The transistors may be a p-type transistor or n-type transistor. The pixel circuit may include a light emitting device other than OLED. In the description below, "pixel" and "pixel circuit" may be used interchangeably.

Figure 3B:
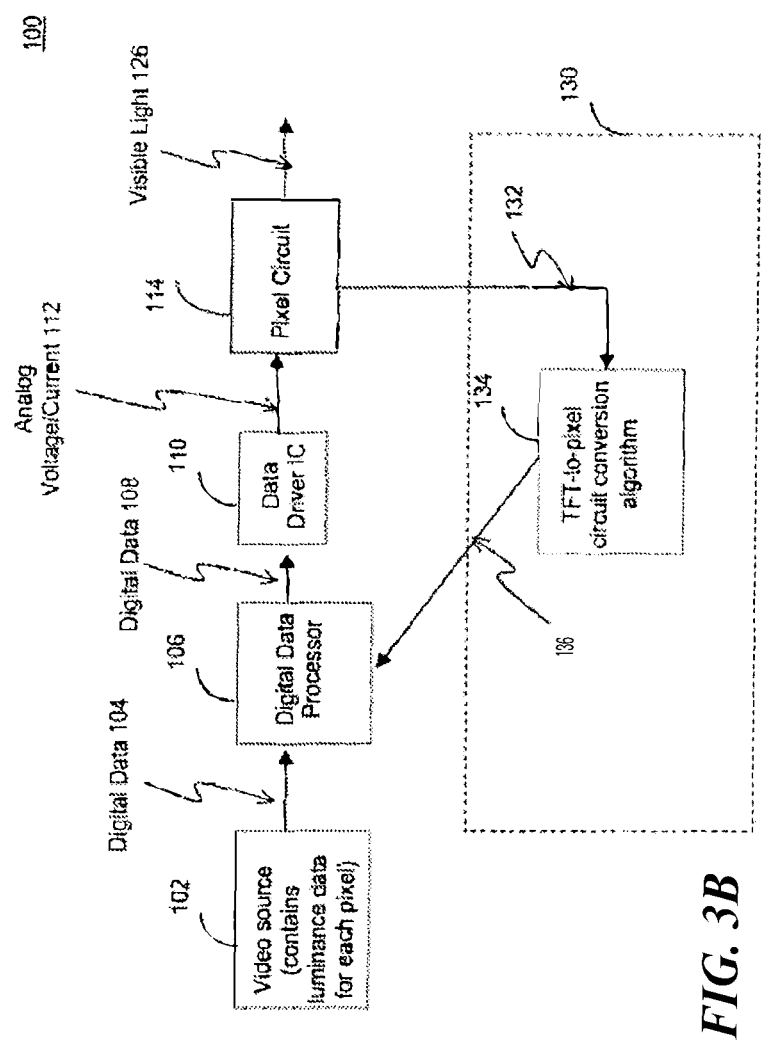
FIG. 3B illustrates a light emitting display system to which a compensation scheme in accordance with an embodiment of the present invention is applied.

FIG. 3B illustrates the operation of a light emitting display system 100 to which a compensation scheme in accordance with an embodiment of the present invention is applied. A video source 102 contains luminance data for each pixel and sends the luminance data in the form of digital data 104 to a digital data processor 106. The digital data processor 106 may perform some data manipulation functions, such as scaling the resolution or changing the color of the display. The digital data processor 106 sends digital data 108 to a data driver IC 110. The data driver IC 110 converts that digital data 108 into an analog voltage or current 112. The analog voltage or current 112 is applied to a pixel circuit 114. The pixel circuit 114 includes TFTs and an OLED. The pixel circuit 114 outputs a visible light 126 based on the analog voltage or current 112.

Figure 1B:
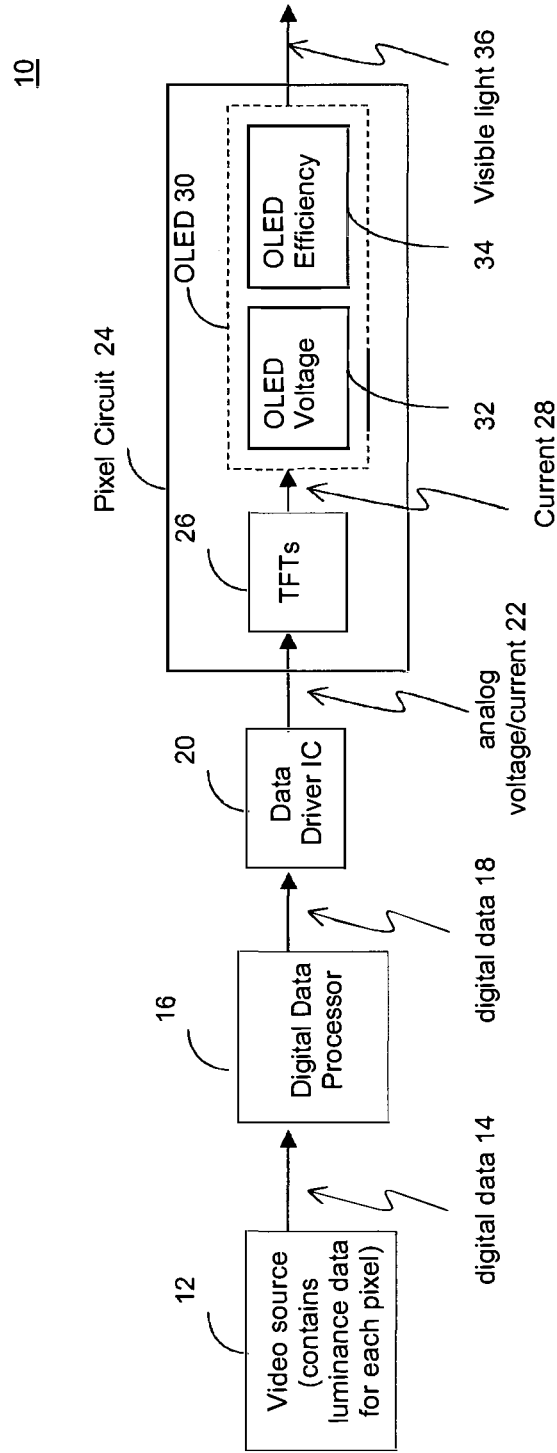
FIG. 1B illustrates a conventional AMOLED system.
Figure 2B:
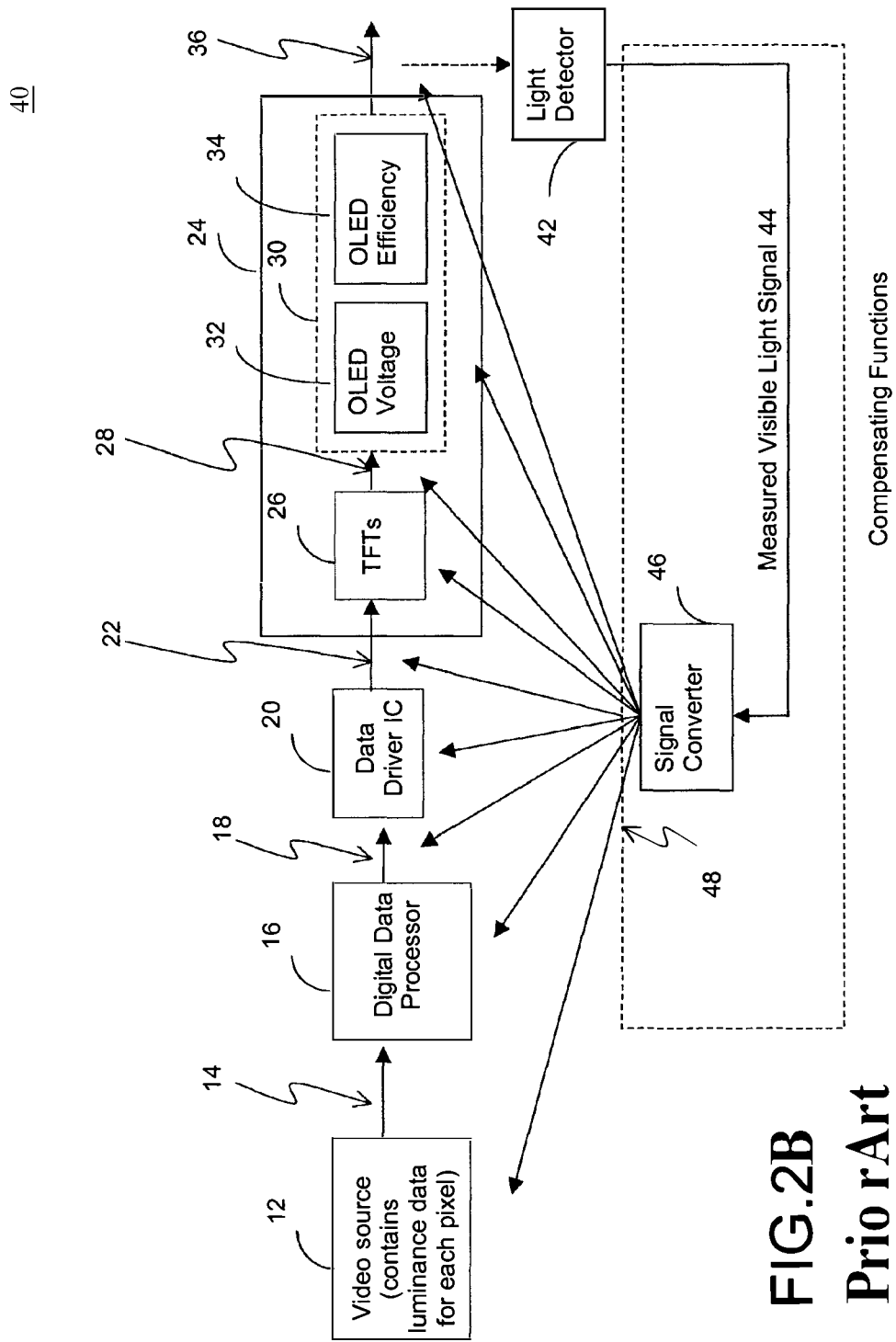
FIG. 2B illustrates a conventional AMOLED system that includes a light detector and a feedback scheme that uses the signal from the light detector.

In FIG. 3B, one pixel circuit is shown as an example. However, the light emitting display system 100 includes a plurality of pixel circuits. The video source 102 may be similar to the video source 12 of FIGS. 1B and 2B. The data driver IC 110 may be similar to the data driver IC 20 of FIGS. 1B and 2B.

A compensation functions module 130 is provided to the display. The compensation functions module 130 includes a module 134 for implementing an algorithm (referred to as TFT-to-pixel circuit conversion algorithm) on measurement 132 from the pixel circuit 114 (referred to as degradation data, measured degradation data, measured TFT degradation data, or measured TFT and OLED degradation data), and outputs calculated pixel circuit degradation data 136. It is noted that in the description below, "TFT-to-pixel circuit conversion algorithm module" and "TFT-to-pixel circuit conversion algorithm" may be used interchangeably.

The degradation data 132 is electrical data which represents how much a part of the pixel circuit 114 has been degraded. The data measured from the pixel circuit 114 may represent, for example, one or more characteristics of a part of the pixel circuit 114.

The degradation data 132 is measured from, for example, one or more thin-film-transistors (TFTs), an organic light emitting diode (OLED) device, or a combination thereof. It is noted that the transistors of the pixel circuit 114 are not limited to TFTs, and the light emitting device of the pixel circuit 114 is not limited to an OLED. The measured degradation data 132 may be digital or analog data. The system 100 provides compensation data based on measurement from a part of the pixel circuit (e.g. TFT) to compensate for non-uniformities in the display. The non-uniformities may include brightness non-uniformity, color non-uniformity, or a combination thereof. Factors for causing such non-uniformities may include, but are not limited to, process or construction inequalities in the display, aging of pixels, etc.

The degradation data 132 may be measured at a regular timing or a dynamically regulated timing. The calculated pixel circuit degradation data 136 may be compensation data to correct non-uniformities in the display. The calculated pixel circuit degradation data 136 may include any parameters to produce the compensation data. The compensation data may be used at a regular timing (e.g. each frame, regular interval, etc.) or dynamically regulated timing. The measured data, compensation data, or a combination thereof may be stored in a memory (e.g. 142 of FIG. 8B).

The TFT-to-pixel circuit conversion algorithm module 134 or the combination of the TFT-to-pixel circuit conversion algorithm module 134 and the digital data processor 106 estimates the degradation of the entire pixel circuit based on the measured degradation data 132. Based on this estimation, the entire degradation of the pixel circuit 114 is compensated by adjusting, at the digital data processor 106, the luminance data (digital data 104) applied to a certain pixel circuit(s).

The system 100 may modify or adjust luminance data 104 applied to a degraded pixel circuit or non-degraded pixel circuit. For example, if a constant value of visible light 126 is desired, the digital data processor 106 increases the luminance data for a pixel that is highly degraded, thereby compensating for the degradation.

In FIG. 3B, the TFT-to-pixel circuit conversion algorithm module 134 is provided separately from the digital data processor 106. However, the TFT-to-pixel circuit conversion algorithm module 134 may be integrated into the digital data processor 106.

Figure 4B:
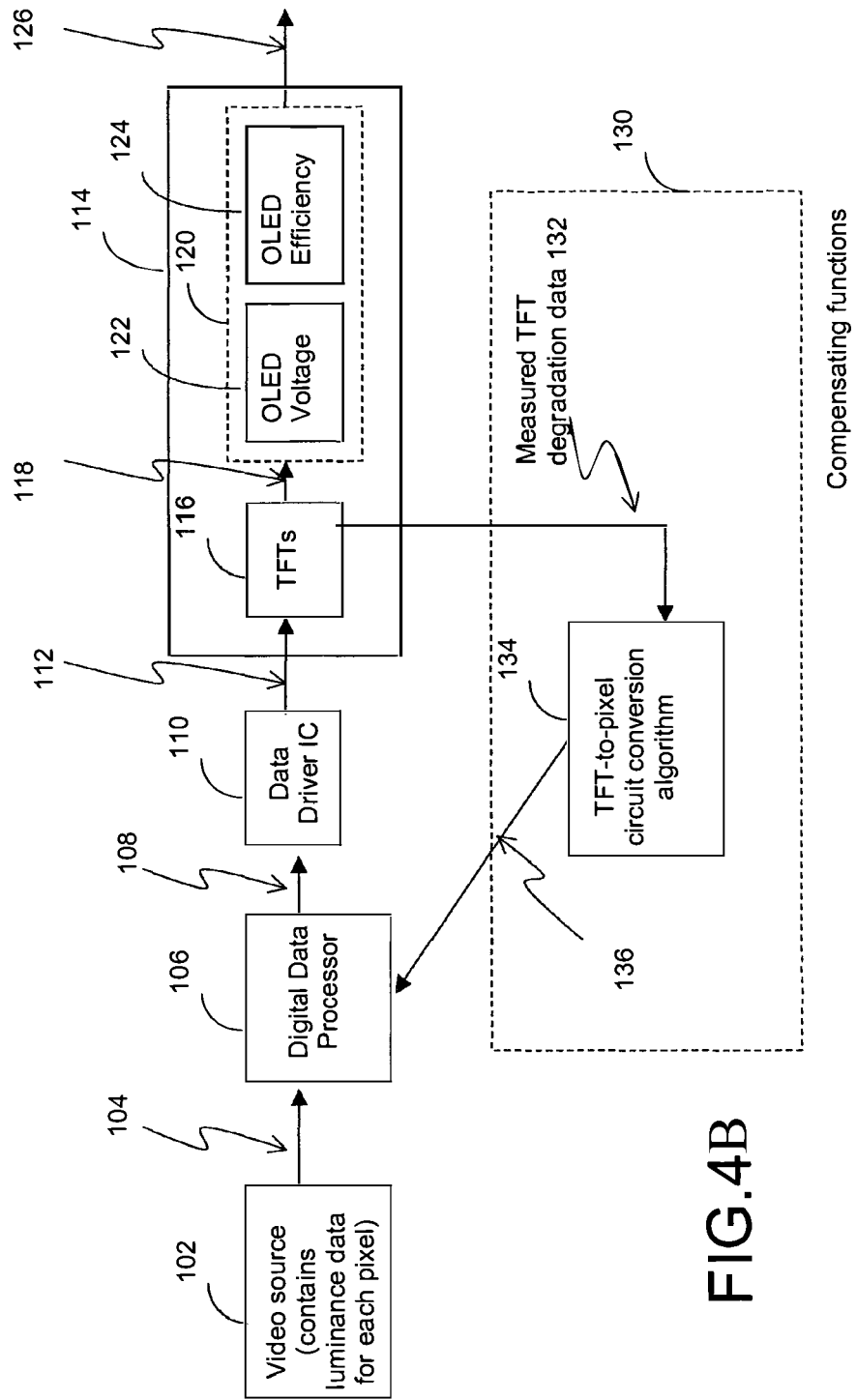
FIG. 4B illustrates an example of the light emitting display system of FIG. 3B.

FIG. 4B illustrates an example of the system 100 of FIG. 3B. The pixel circuit 114 of FIG. 4B includes TFTs 116 and OLED 120. The analog voltage or current 112 is provided to the TFTs 116. The TFTs 116 convert that voltage or current 112 into another current 118 which flows through the OLED 120. The OLED 120 converts the current 118 into the visible light 126. The OLED 120 has an OLED voltage 122, which is the voltage drop across the OLED. The OLED 120 also has an efficiency 134, which is a ratio of the amount of light emitted to the current through the OLED 120.

The system 100 of FIG. 4B measures the degradation of the TFTs only. The degradation of the TFTs 116 and the OLED 120 are usage-dependent, and the TFTs 116 and the OLED 120 are always linked in the pixel circuit 114. Whenever the TFT 116 is stressed, the OLED 120 is also stressed. Therefore, there is a predictable relationship between the degradation of the TFTs 116, and the degradation of the pixel circuit 114 as a whole. The TFT-to-pixel circuit conversion algorithm module 134 or the combination of the TFT-to-pixel circuit conversion algorithm module 134 and the digital data processor 106 estimates the degradation of the entire pixel circuit based on the TFT degradation only. An embodiment of the present invention may also be applied to systems that monitor both TFT and OLED degradation independently.

The pixel circuit 114 has a component that can be measured. The measurement obtained from the pixel circuit 114 is in some way related to the pixel circuit's degradation.

Figure 5B:
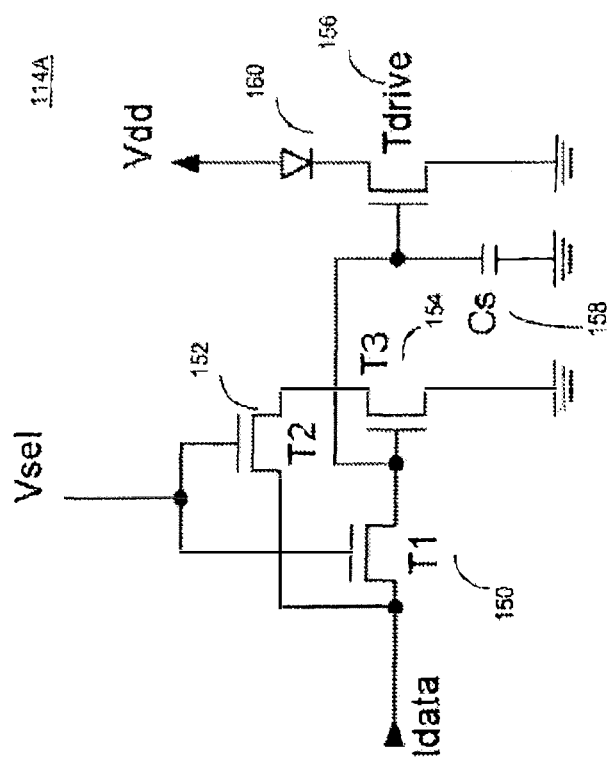
FIG. 5B illustrates an example of a pixel circuit of FIG. 5B.

FIG. 5B illustrates an example of the pixel circuit 114 of FIG. 4B. The pixel circuit 114 of FIG. 5B is a 4-T pixel circuit. The pixel circuit 114A includes a switching circuit having TFTs 150 and 152, a reference TFT 154, a dive TFT 156, a capacitor 158, and an OLED 160.

The gate of the switch TFT 150 and the gate of the feedback TFT 152 are connected to a select line Vsel. The first terminal of the switch TFT 154 and the first terminal of the feedback TFT 152 are connected to a data line Idata. The second terminal of the switch TFT 150 is connected to the gate of the reference TFT 154 and the gate of the drive TFT 156. The second terminal of the feedback TFT 152 is connected to the first terminal of the reference TFT 154. The capacitor 158 is connected between the gate of the drive TFT 156 and ground. The OLED 160 is connected between voltage supply Vdd and the drive TFT 156. The OLED 160 may also be connected between drive TFT 156 and ground in other systems (i.e. drain-connected format).

When programming the pixel circuit 114A, Vsel is high and a voltage or current is applied to the data line Idata. The data Idata initially flows through the TFT 150 and charges the capacitor 158. As the capacitor voltage rises, the TFT 154 begins to turn on and Idata starts to flow through the TFTs 152 and 154 to ground. The capacitor voltage stabilizes at the point when all of Idata flows through the TFTs 152 and 154. The current flowing through the TFT 154 is mirrored in the drive TFT 156.

In the pixel circuit 114A, by setting Vsel to high and putting a voltage on Idata, the current flowing into the Idata node can be measured. Alternately, by setting Vsel to high and putting a current on Idata, the voltage at the Idata node can be measured. As the TFTs degrade, the measured voltage (or current) will change, allowing a measure of the degradation to be recorded. In this pixel circuit, the analog voltage/current 112 shown in FIG. 4B is connected to the Idata node. The measurement of the voltage or current can occur anywhere along the connection between the data diver IC 110 and the TFTs 116.

In FIG. 4B, the TFT-to-pixel circuit conversion algorithm is applied to the measurement 132 from the TFTs 116. However, current/voltage information read from various places other than TFTs 116 may be usable. For example, the OLED voltage 122 may be included with the measured TFT degradation data 132.

Figure 6B:
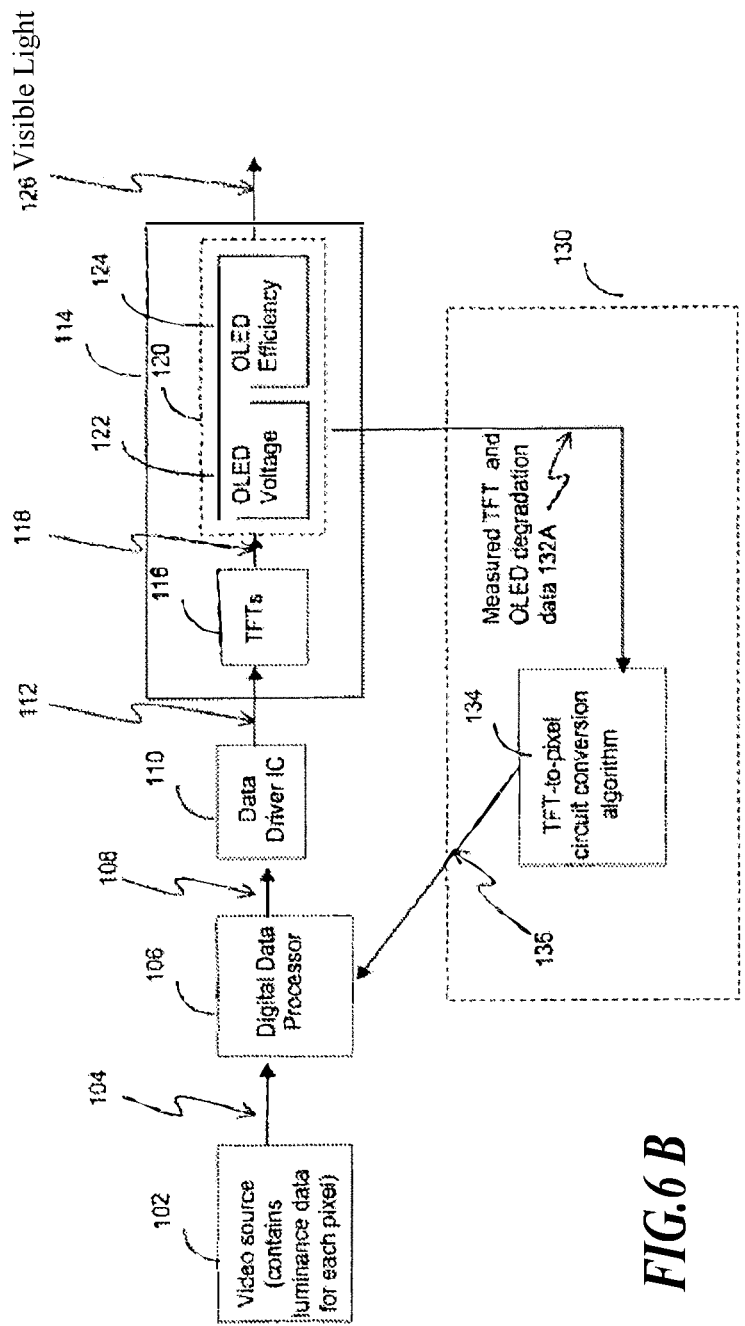
FIG. 6B illustrates a further example of the light emitting display system of FIG. 3B.

FIG. 6B illustrates a further example of the system 100 of FIG. 3B. The system 100 of FIG. 6B measures the OLED voltage 122. Thus, the measured data 132 is related to the TFT 116 and OLED 120 degradation ("measured TFT and OLED voltage degradation data 132A" in FIG. 6B). The compensation functions module 130 of FIG. 6B implements the TFT-to-pixel circuit conversion algorithm 134 on the signal related to both the TFT degradation and OLED degradation. The TFT-to-pixel circuit conversion algorithm module 134 or the combination of the TFT-to-pixel circuit conversion algorithm module 134 and the digital data processor 106 estimates the degradation of the entire pixel circuit based on the TFT degradation and the OLED degradation. The TFT degradation and OLED degradation may be measured separately and independently.

Figure 7B:
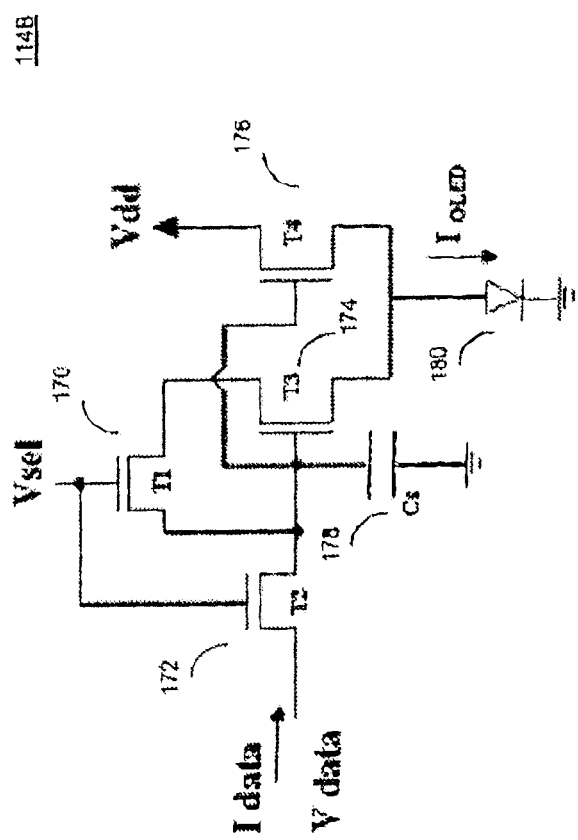
FIG. 7B illustrates an example of a pixel circuit of FIG. 6B.

FIG. 7B illustrates an example of the pixel circuit 114 of FIG. 6B. The pixel circuit 114B of FIG. 7B is a 4-T pixel circuit. The pixel circuit 114B includes a switching circuit having TFTs 170 and 172, a reference TFT 174, a drive TFT 176, a capacitor 178, and an OLED 180.

The gate of the switch TFT 170 and the gate of the switch TFT 172 are connected to a select line Vsel. The first terminal of the switch TFT 172 is connected to a data line Idata while the first terminal of the switch TFT 170 is connected to the second terminal of the switch TFT 172 which is connected to the gate of the reference TFT 174 and the gate of the dive TFT 176. The second terminal of the switch TFT 170 is connected to the first terminal of the reference TFT 174. The capacitor 178 is connected between the gate of the dive TFT 176 and ground. The first terminal of the dive TFT 176 is connected to voltage supply Vdd. The second terminal of the reference TFT 174 and the second terminal of the drive TFT 176 are connected to the OLED 180.

When programming the pixel circuit 114B, Vsel is high and a voltage or current is applied to the data line Idata. The data Idata initially flows through the TFT 172 and charges the capacitor 178. As the capacitor voltage rises, the TFT 174 begins to turn on and Idata starts to flow through the TFTs 170 and 174 and OLED 180 to ground. The capacitor voltage stabilizes at the point when all of Idata flows through the TFTs 170 and 174. The current flowing through the TFT 174 is mirrored in the drive TFT 176. In the pixel circuit 114B, by setting Vsel to high and putting a voltage on Idata, the current flowing into the Idata node can be measured. Alternately, by setting Vsel to high and putting a current on Idata, the voltage at the Idata node can be measured. As the TFTs degrade, the measured voltage (or current) will change, allowing a measure of the degradation to be recorded. It is noted that unlike the pixel circuit 114A of FIG. 5B, the current now flows through the OLED 180. Therefore the measurement made at the Idata node is now partially related to the OLED voltage, which will degrade over time. In the pixel circuit 114B, the analog voltage/current 112 shown in FIG. 6B is connected to the Idata node. The measurement of the voltage or current can occur anywhere along the connection between the data driver IC 110 and the TFTs 116.

Referring to FIGS. 3B, 4B, and 6B, the pixel circuit 114 may allow the current out of the TFTs 116 to be measured, and to be used as the measured TFT degradation data 132. The pixel circuit 114 may allow some part of the OLED efficiency to be measured, and to be used as the measured TFT degradation data 132. The pixel circuit 114 may also allow a node to be charged, and the measurement may be the time it takes for this node to discharge. The pixel circuit 114 may allow any parts of it to be electrically measured. Also, the discharge/charge level during a given time can be used for aging detection.

Figure 8B:
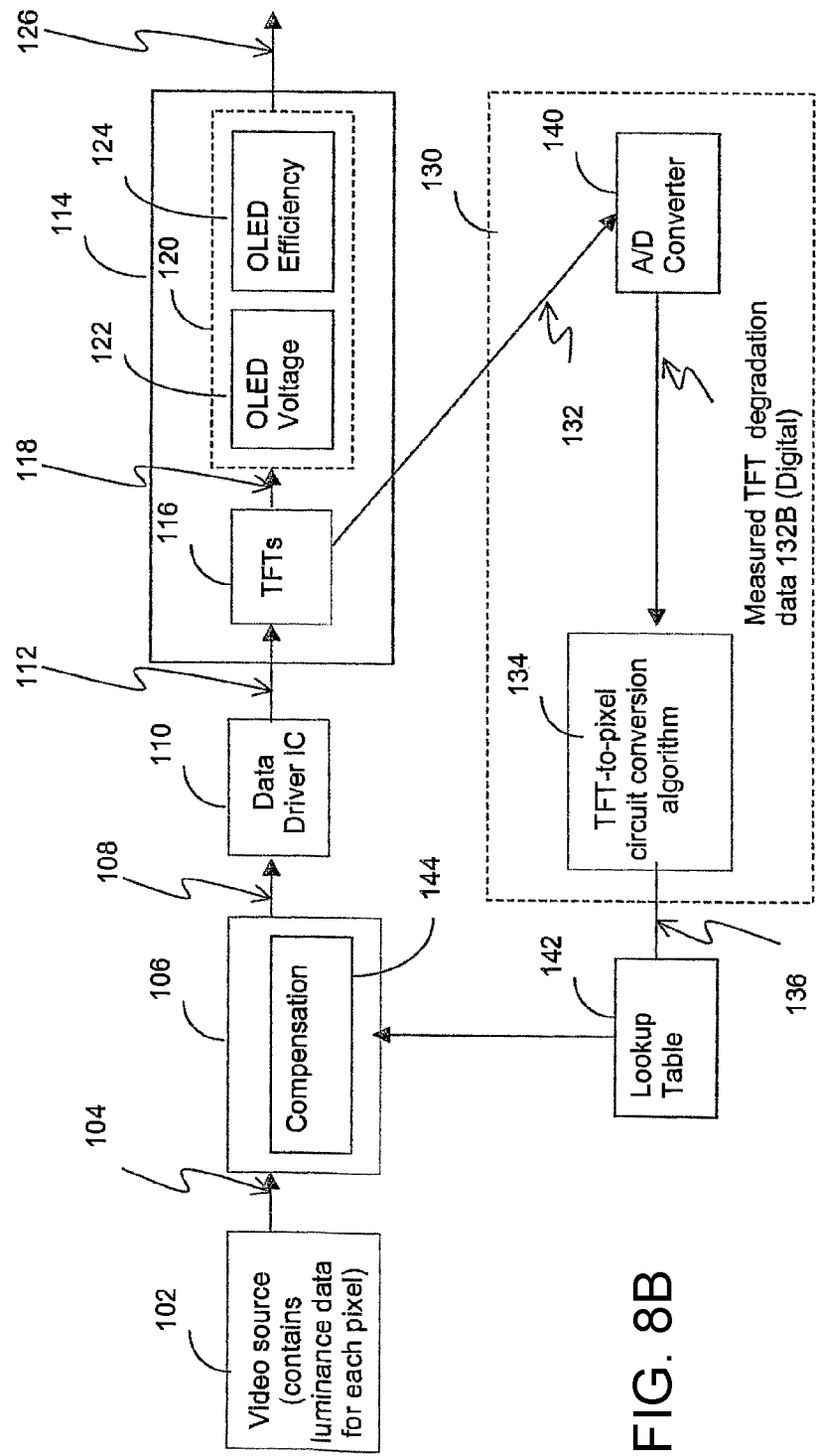
FIG. 8B illustrates an example of modules for the compensation scheme applied to the system of FIG. 4B.

Referring to FIG. 8B, an example of modules for the compensation scheme applied to the system of FIG. 4B is described. The compensation functions module 130 of FIG. 8B includes an analog/digital (A/D) converter 140. The A/D converter 140 converts the measured TFT degradation data 132 into digital measured TFT voltage/current 112 shown in FIG. 4B is connected to the Idata node. The measurement of the voltage or current can occur anywhere along the connection between the data driver IC 110 and the TFTs 116.

In FIG. 4B, the TFT-to-pixel circuit conversion algorithm is applied to the measurement 132 from the TFTs 116. However, current/voltage information read from various places other than TFTs 116 may be usable. For example, the OLED voltage 122 may be included with the measured TFT degradation data 132.

FIG. 6B illustrates a further example of the system 100 of FIG. 3B. The system 100 of the FIG. 6B measured the OLED voltage 122. Thus, the measured data 132 is related to the TFT 116 and OLED 120 degradation ("measured TFT and OLED voltage degradation data 132A" in FIG. 6B). The compensation functions module 130 of FIG. 6B implements the TFT-to-pixel circuit conversion algorithm 134 on the signal related to both the TFT degradation and OLED degradation. The TFT-to-pixel circuit conversion algorithm module 134 or the combination of the TFT-to-pixel circuit conversion algorithm module 134 and the digital data processor 106 estimates the degradation of the entire pixel circuit based on the TFT degradation and the OLED degradation. The TFT degradation and OLED degradation may be measured separately and independently.

FIG. 7B illustrates an example of the pixel circuit 114 of FIG. 6B. The pixel circuit 114B of FIG. 7B is a 4-T pixel circuit. The pixel circuit 114B includes a switching circuit having TFTs 170 and 172, a reference TFT 174, a drive TFT 176, a capacitor 178, and an OLED 180.

The gate of the switch TFT 170 and the gate of the switch TFT 172 are connected to a select line Vsel. The first terminal of the switch TFT 172 is connected to a data line Idata while the first terminal of the switch TFT 170 is connected to the second terminal of the switch TFT 172, which is connected to the gate of the reference TFT 174 and the gate of the drive TFT 176. The second terminal of the switch TFT 170 is connected to the first terminal of the reference TFT 174. The capacitor 178 is connected between the gate of the drive TFT 176 and ground. The first terminal of the drive TFT 176 is connected to voltage supply Vdd. The second terminal of the reference TFT 174 and the second terminal of the drive TFT 176 are connected to the OLED 180.

When programming the pixel circuit 114B, Vsel is high and a voltage or current is applied to the data line Idata. The data Idata initially flows through the TFT 172 and charges the capacitor 178. As the capacitor voltage rises, the TFT 174 begins to turn on and Idata starts to flow through the TFTs 170 and 174 and OLED 180 to ground. The capacitor voltage stabilizes at the point when all of Idata flows through the TFTs 152 and 154. The current flowing through the TFT 154 is mirrored in the drive TFT 156. In the pixel circuit 114A, by setting Vsel to high and putting a voltage on Idata, the current flowing into the Idata node can be measured. Alternately, by setting Vsel to high and putting a current on Idata, the voltage at the Idata node can be measured. As the TFTs degrade, the measured voltage (or current) will change, allowing a measure of the degradation to be recorded. It is noted that unlike the pixel circuit 114A of FIG. 5B, the current now flows through the OLED 180. Therefore the measurement made at the Idata node is now partially related to the OLED voltage, which will degrade over time. In the pixel circuit 114B, the analog voltage/current 112 shown in FIG. 6B is connected to the Idata node. The measurement of the voltage or current can occur anywhere along the connection between the data driver IC 110 and the TFTs 116.

Referring to FIGS. 3B, 4B, and 6B, the pixel circuit 114 may allow the current out of the TFTs 116 to be measured, and to be used as the measured TFT degradation data 132. The pixel circuit 114 may allow some part of the OLED efficiency to be measured, and to be used as the measured TFT degradation data 132. The pixel circuit 114 may also allow a node to be charged, and the measurement may be the time it takes for this node to discharge. The pixel circuit 114 may allow any parts of it to be electrically measured. Also, the discharge/charge level during a given time can be used for aging detection.

Referring to FIG. 8B, an example of modules for the compensation scheme applied to the system of FIG. 4B is described. The compensation functions module 130 of FIG. 8B includes an analog/digital (A/D) converter 140. The A/D converter 140 converts the measured TFT degradation data 132 into digital measured TFT degradation data 132B. The digital measured TFT degradation data 132B is converted into the calculated pixel circuit degradation data 136 at the TFT-to-pixel circuit conversion algorithm module 134. The calculated pixel circuit degradation data 136 is stored in a lookup table 142. Since measuring TFT degradation data from some pixel circuits may take a long time, the calculated pixel circuit degradation data 136 is stored in the lookup table 142 for use.

In FIG. 8B, the TFT-to-pixel circuit conversion algorithm 134 is a digital algorithm. The digital TFT-to-pixel circuit conversion algorithm 134 may be implemented, for example, on a microprocessor, an FPGA, a DSP, or another device, but not limited to these examples. The lookup table 142 may be implemented using memory, such as SRAM or DRAM. This memory may be in another device, such as a microprocessor or FPGA, or may be an independent device.

The calculated pixel circuit degradation data 136 stored in the lookup table 142 is always available for the digital data processor 106. Thus, the TFT degradation data 132 for each pixel does not have to be measured every time the digital data processor 106 needs to use the data. The degradation data 132 may be measured infrequently (for example, once every 20 hours, or less). Using a dynamic time allocation for the degradation measurement is another case, more frequent extraction at the beginning and less frequent extraction after the aging gets saturated.

The digital data processor 106 may include a compensation module 144 for taking input luminance data for the pixel circuit 114 from the video source 102, and modifying it based on degradation data for that pixel circuit or other pixel circuit. In FIG. 8B, the module 144 modifies luminance data using information from the lookup table 142.

It is noted that the configuration of FIG. 8B is applicable to the system of FIGS. 3B and 6B. It is noted that the lookup table 142 is provided separately from the compensating functions module 130, however, it may be in the compensating functions module 130. It is noted that the lookup table 142 is provided separately from the digital data processor 106, however, it may be in the digital data processor 106.

Figure 9B:
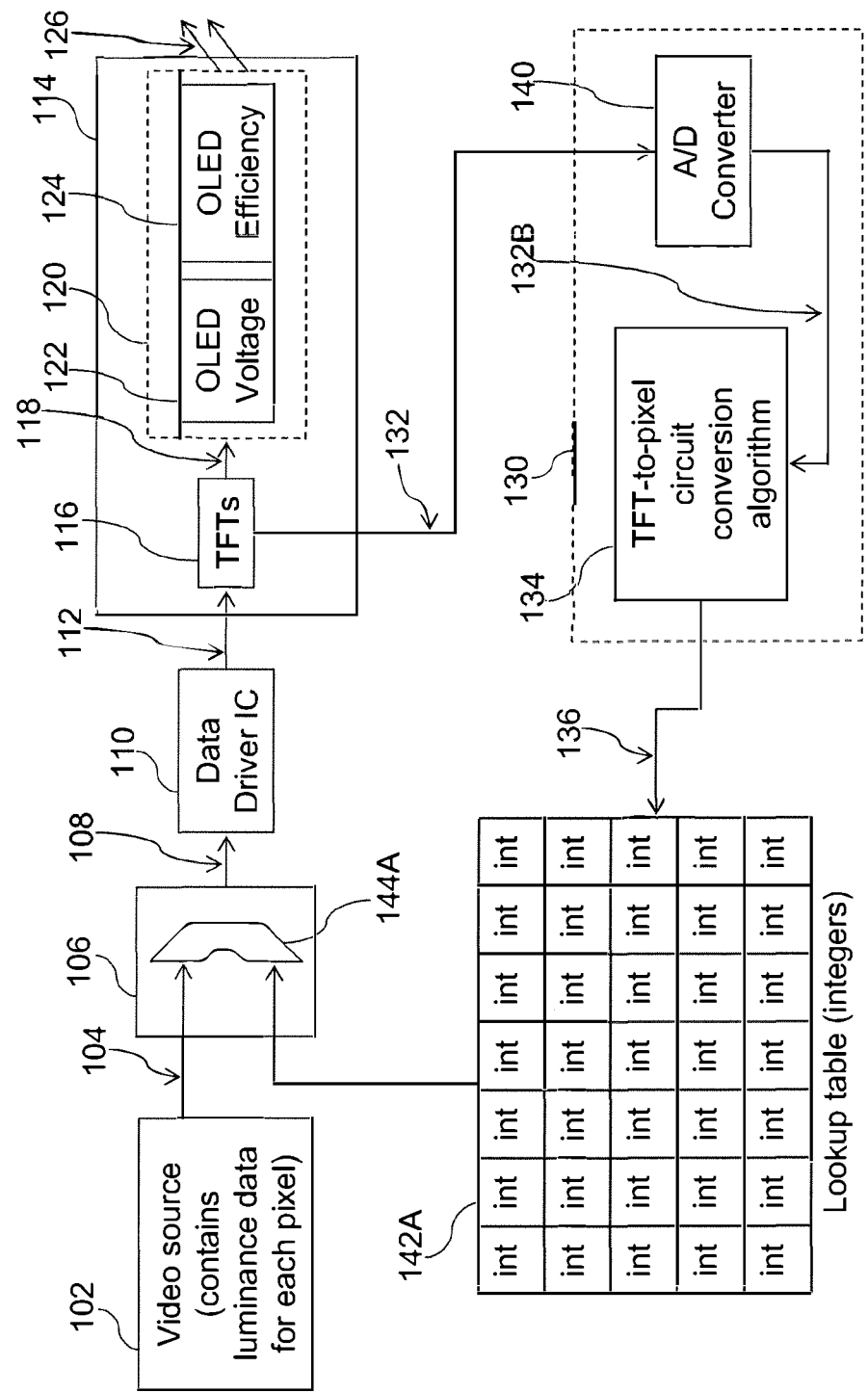
FIG. 9B illustrates an example of a lookup table and a compensation algorithm module of FIG. 7B.

One example of the lookup table 142 and the module 144 of the digital data processor 106 is illustrated in FIG. 9B. Referring to FIG. 9B, the output of the TFT-to-pixel circuit conversion algorithm module 134 is an integer value. This integer is stored in a lookup table 142A (corresponding to 142 of FIG. 8B). Its location in the lookup table 142A is related to the pixel's location on the AMOLED display. Its value is a number, and is added to the digital luminance data 104 to compensate for the degradation.

For example, digital luminance data may be represented to use 8-bits (256 values) for the brightness of a pixel. A value of 246 may represent maximum luminance for the pixel. A value of 128 may represent approximately 50% luminance. The value in the lookup table 142A may be the number that is added to the luminance data 104 to compensate for the degradation. Therefore, the compensation module (144 of FIG. 7B) in the digital data processor 106 may be implemented by a digital adder 144A. It is noted that digital luminance data may be represented by any number of bits, depending on the driver IC used (for example, 6-bit, 8-bit, 10-bit, 14-bit, etc.).

Figure 10B:
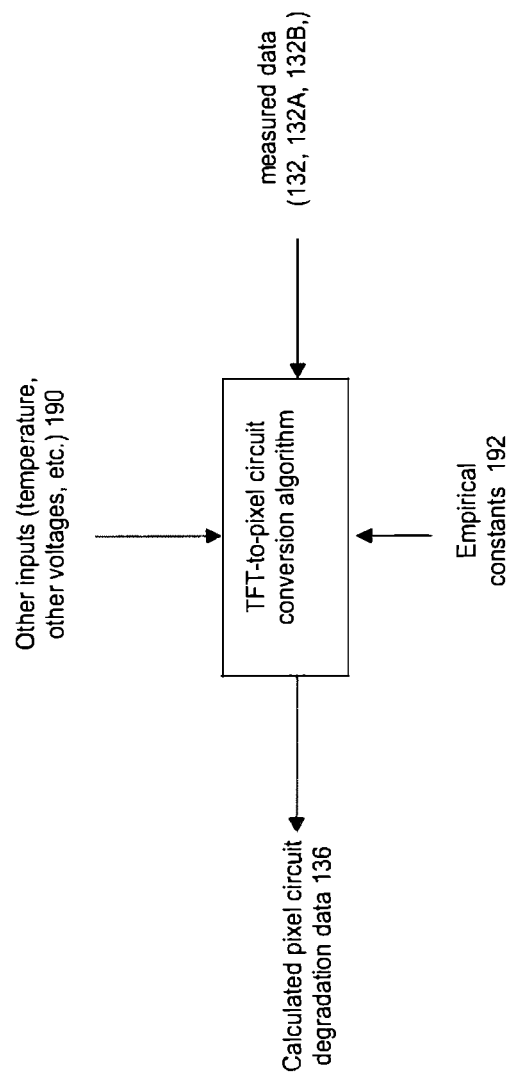
FIG. 10B illustrates an example of inputs to a TFT-to-pixel circuit conversion algorithm module.

In FIGS. 3B, 4B, 6B, 8B, and 9B, the TFT-to-pixel circuit conversion algorithm module 134 has the measured TFT degradation data 132 or 132A as an input, and the calculated pixel circuit degradation data 136 as an output. However, there may be other inputs to the system to calculate compensation data as well, as shown in FIG. 10B. FIG. 10B illustrates an example of inputs to the TFT-to-pixel circuit conversion algorithm module 134. In FIG. 10B, the TFT-to-pixel circuit conversion algorithm module 134 processes the measured data (132 of FIGS. 3B, 4B, 8B, and 9B; 132A of FIG. 5B; 132B of FIGS. 8B and 9B) based on additional inputs 190 (e.g. temperature, other voltages, etc.), empirical constants 192, or combinations thereof.

The additional inputs 190 may include measured parameters such as a voltage reading from current-programming pixels and a current reading from voltage-programming pixels. These pixels may be different from a pixel circuit from which the measured signal is obtained. For example, a measurement is taken from a "pixel under test" and is used in combination with another measurement from a "reference pixel." As described below, in order to determine how to modify luminance data to a pixel, data from other pixels in the display may be used. The additional inputs 190 may include light measurements, such as measurement of an ambient light in a room. A discrete device or some kind of test structure around the periphery of the panel may be used to measure the ambient light. The additional inputs may include humidity measurements, temperature readings, mechanical stress readings, other environmental stress readings, and feedback from test structures on the panel It may also include empirical parameters 921, such as the brightness loss in the OLED due to decreasing efficiency (□L), the shift in OLED voltage over time (□Voled), dynamic effects of Vt shift, parameters related to TFT performance such as Vt, □Vt, mobility ( ), inter-pixel non-uniformity, DC bias voltages in the pixel circuit, changing gain of current-mirror based pixel circuits, short-term and long-term based shifts in pixel circuit performance, pixel-circuit operating voltage variation due to IR-drop and ground bounce.

Referring to FIGS. 8B and 9B, the TFT-to-pixel-circuit conversion algorithm in the module 134 and the compensation algorithm 144 in the digital data processor 106 work together to convert the measured TFT degradation data 132 into a luminance correction factor. The luminance correction factor has information about how the luminance data for a given pixel is to be modified, to compensate for the degradation in the pixel.

In FIG. 9B, the majority of this conversion is done by the TFT-to-pixel-circuit conversion algorithm module 134. It calculates the luminance correction values entirely, and the digital adder 144A in the digital data processor 106 simply adds the luminance correction values to the digital luminance data 104. However, the system 100 may be implemented such that the TFT-to-pixel circuit conversion algorithm module 134 calculates only the degradation values, and the digital data processor 106 calculates the luminance correction factor from that data. The TFT-to-pixel circuit conversion algorithm 134 may employ fuzzy logic, neural networks, or other algorithm structures to convert the degradation data into the luminance correction factor.

The value of the luminance correction factor may allow the visible light to remain constant, regardless of the degradation in the pixel circuit. The value of the luminance correction factor may allow the luminance of degraded pixels not to be altered at all; instead, the luminance of the non-degraded pixels to be decreased. In this case, the entire display may gradually lose luminance over time, however the uniformity may be high.

The calculation of a luminance correction factor may be implemented in accordance with a compensation of non-uniformity algorithm, such as a constant brightness algorithm, a decreasing brightness algorithm, or combinations thereof. The constant brightness algorithm and the decreasing brightness algorithm may be implemented on the TFT-to-pixel circuit conversion algorithm module (e.g. 134 of FIG. 3B) or the digital data processor (e.g. 106 of FIG. 3B). The constant brightness algorithm is provided for increasing brightness of degraded pixels so as to match nondegraded pixels. The decreasing brightness algorithm is provided for decreasing brightness of non-degraded pixels 244 so as to match degraded pixels. These algorithm may be implemented by the TFT-to-pixel circuit conversion algorithm module, the digital data processor (such as 144 of FIG. 8B), or combinations thereof. It is noted that these algorithms are examples only, and the compensation of non-uniformity algorithm is not limited to these algorithms.

Referring to FIGS. 11A-1, 11B-1, 11C-1, 11D-1, and 11E-1, the experimental results of the compensation of non-uniformity algorithms are described in detail. Under the experiment, an AMOLED display includes a plurality of pixel circuits, and is driven by a system as shown in FIGS. 3B, 4B, 6B, 8B and 9B. It is noted that the circuitry to drive the AMOLED display is not shown in FIGS. 11A-1 through 11E-1.

Figures 1, 11B:
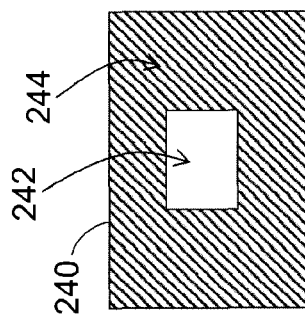

FIG. 11A-1 schematically illustrates an AMOLED display 240 which starts operating (operation period t=0 hour). The video source (102 of FIGS. 3B, 4B, 7B, 8B and 9B) initially outputs maximum luminance data to each pixel. No pixels are degraded since the display 240 is new. The result is that all pixels output equal luminance and thus all pixels show uniform luminance.

Next, the video source outputs maximum luminance data to some pixels in the middle of the display as shown in FIG. 11B-1. FIG. 11B-1 schematically illustrates the AMOLED display 240 which has operated for a certain period where maximum luminance data is applied to pixels in the middle of the display. The video source outputs maximum luminance data to pixels 242, while it outputs minimum luminance data (e.g. zero luminance data) to pixels 244 around the outside of the pixels 242. It maintains this for a long period of time, for example 1000 hours. The result is that the pixels 242 at maximum luminance will have degraded, and the pixels 244 at zero luminance will have no degradation.

At 1000 hours, the video source outputs maximum luminance data to all pixels. The results are different depending on the compensation algorithm used, as shown in FIGS. 11C-1 through 11E-1.

Figures 1, 11E:
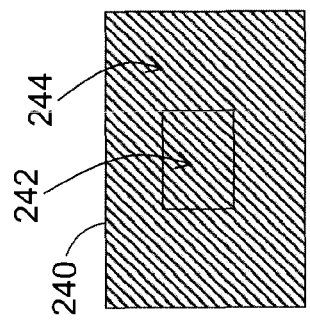
Figures 1, 11D:
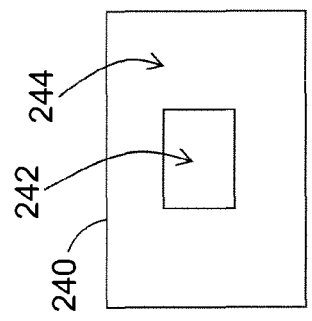
Figures 1, 11A:
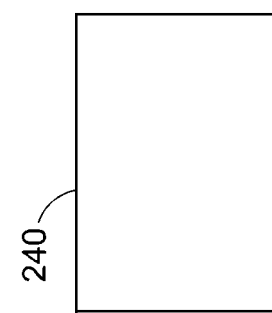
Figures 1, 11C:
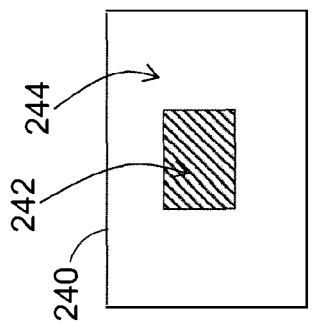

FIG. 11C-1 schematically illustrates the AMOLED display 240 to which no compensation algorithm is applied. As shown in FIG. 11C-1, if there was no compensation algorithm, the degraded pixels 242 would have a lower brightness than the non-degraded pixels 244.

FIG. 11D-1 schematically illustrates the AMOLED display 240 to which the constant brightness algorithm is applied. The constant brightness algorithm is implemented for increasing luminance data to degraded pixels, such that the luminance data of the degraded pixels 242 matches that of non-degraded pixels 244. For example, the increasing brightness algorithm provides increasing currents to the stressed pixels 242, and constant current to the unstressed pixels 244. Both degraded and non-degraded pixels have the same brightness. Thus, the display 240 is uniform. Differential aging is compensated, and brightness is maintained, however more current is required. Since the current to some pixels is being increased, this will cause the display to consume more current over time, and therefore more power over time because power consumption is related to the current consumption.

FIG. 11E-1 schematically illustrates the AMOLED display 240 to which the decreasing brightness algorithm is applied. The decreasing brightness algorithm decreases luminance data to non-degraded pixels, such that the luminance data of the non-degraded pixels 244 match that of degraded pixels 242. For example, the decreasing brightness algorithm provides constant OLED current to the stressed pixels 242, while decreasing current to the unstressed pixels 244. Both degraded and non-degraded pixels have the same brightness. Thus, the display 240 is uniform. Differential aging is compensated, and it requires a lower Vsupply, however brightness decrease over time. Because this algorithm does not increase the current to any of the pixels, it will not result in increased power consumption.

Figure 12B:
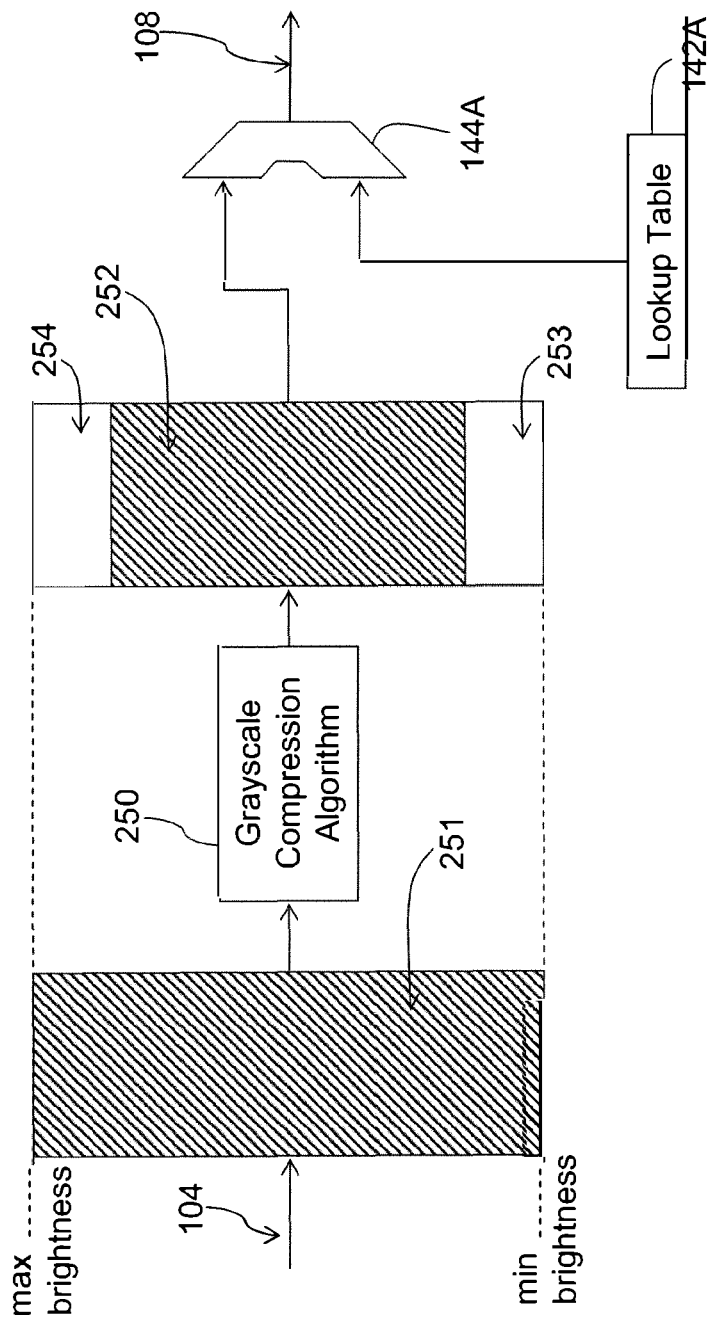
FIG. 12B illustrates an example of a grayscale compression algorithm.

Referring to FIG. 3B, components, such as the video source 102 and the data driver IC 110, may use only 8-bits, or 256 discrete luminance values. Therefore if the video source 102 outputs maximum brightness (a luminance value of 255), there is no way to add any additional luminance, since the pixel is already at the maximum brightness supported by the components in the system. Likewise, if the video source 102 outputs minimum brightness (a luminance value of 0), there is no way to subtract any luminance. The digital data processor 106 may implement a grayscale compression algorithm to reserve some grayscales. FIG. 12B illustrates an implementation of the digital data processor 106 which includes a grayscale compression algorithm module 250. The grayscale compression algorithm 250 takes the video signal 104 represented by 256 luminance values (251), and transforms it to use less luminance values (252). For example, instead of minimum brightness represented by grayscale 0, minimum brightness may be represented by grayscale 50. Likewise, maximum brightness may be represented by grayscale 200. In this way, there are some grayscales reserved for future increase (254) and decrease (253). It is noted that the shift in grayscales does not reflect the actual expected shift in grayscales.

According to the embodiments of the present invention, the scheme of estimating (predicting) the degradation of the entire pixel circuit and generating a luminance correction factor ensures uniformities in the display. According to embodiments of the present invention, the aging of some components or entire circuit can be compensated, thereby ensuring uniformity of the display.

According to the embodiments of the present invention, the TFT-to-pixel circuit conversion algorithm allows for improved display parameters, for example, including constant brightness uniformity and color uniformity across the panel over time. Since the TFT-to-pixel circuit conversion algorithm takes in additional parameters, for example, temperature and ambient light, any changes in the display due to these additional parameters may be compensated for.

The TFT-to-Pixel circuit conversion algorithm module (134 of FIGS. 3B, 4, 6, 8 and 9), the compensation module (144 of FIG. 8B, 144A of FIG. 9B, the compensation of non-uniformity algorithm, the constant brightness algorithm, the decreasing brightness algorithm and the grayscale compression algorithm may be implemented by any hardware, software or a combination of hardware and software having the above described functions. The software code, instructions and/or statements, either in its entirety or a part thereof, may be stored in a computer readable memory. Further, a computer data signal representing the software code, instructions and/or statements, which may be embedded in a carrier wave may be transmitted via a communication network. Such a computer readable memory and a computer data signal and/or its carrier are also within the scope of the present invention, as well as the hardware, software and the combination thereof.

Referring again to FIG. 3B, which illustrates the operation of the light emitting display system 100 by applying a compensation algorithm to digital data 104. In particular, FIG. 3B illustrates the operation of a pixel in an active matrix organic light emitting diode (AMOLED) display. The display system 100 includes an array of pixels. The video source 102 includes luminance input data for the pixels. The luminance data is sent in the form of digital input data 104 to the digital data processor 106. The digital input data 104 can be eight-bit data represented as integer values existing between 0 and 255, with greater integer values corresponding to higher luminance levels. The digital data processor 106 can optionally manipulate the digital input data 104 by, for example, scaling the resolution of the video source 102 to a native screen resolution, adjusting the color balance, or applying a gamma correction to the video source 102. The digital data processor 106 can also apply degradation corrections to the digital input data 104 based on degradation data 136. Following the manipulations, the digital data processor 106 sends the resulting digital data 108 to the data driver integrated circuit (IC) 110. The data driver IC 110 converts the digital data 108 into the analog voltage or current output 112. The data driver IC 110 can be implemented, for example, as a module including a digital to analog converter. The analog voltage or current 112 is provided to the pixel circuit 114. The pixel circuit 114 can include an organic light emitting diode (OLED) and thin film transistors (TFTs). One of the TFTs in the pixel circuit 114 can be a drive TFT that applies a drive current to the OLED. The OLED emits visible light 126 responsive to the drive current flowing to the OLED. The visible light 126 is emitted with a luminance related to the amount of current flowing to the OLED through the drive TFT.

In a configuration where the analog voltage or current 112 is a programming voltage, the drive TFT within the pixel circuit 114 can supply the OLED according to the analog voltage or current 112 by, for example, biasing the gate of the drive TFT with the programming voltage. The pixel circuit 114 can also operate where the analog voltage or current 112 is a programming current applied to each pixel rather than a programming voltage. A display system 100 utilizing programming currents can use current mirrors in each pixel circuit 114 to apply a drive current to the OLED through the drive TFT according to the programming current applied to each pixel.

The luminance of the emitted visible light 126 is affected by aspects within the pixel circuit 114 including the gradual degradation of hardware within the pixel circuit 114. The drive TFT has a threshold voltage, and the threshold voltage can change over time due to aging and stressing of the drive TFT. The luminance of the emitted visible light 126 can be influenced by the threshold voltage of the drive TFT, the voltage drop across the OLED, and the efficiency of the OLED. The efficiency of the OLED is a ratio of the luminance of the emitted visible light 126 to the drive current flowing through the OLED. Furthermore, the degradation can generally be non-uniform across the display system 100 due to, for example, manufacturing tolerances of the drive TFTs and OLEDs and differential aging of pixels in the display system 100. Non-uniformities in the display 100 are generally referred to as display mura or defects. In a display 100 with an array of OLEDs having uniform light emitting efficiency and threshold voltages driven by TFTs having uniform gate threshold voltages, the luminance of the display will be uniform when all the pixels in the display are programmed with the same analog voltage or current 112. However, as the OLEDs and TFTs in each pixel age and the degradation characteristics change, the luminance of the display ceases to be uniform when programmed the same.

The degradation can be compensated for by increasing the amount of drive current sent through the OLED in the pixel circuit 114. According to an implementation of the present disclosure, compensation for the degradation of the display 100 can be carried out by adjusting the digital data 108 output from the digital data processor 106. The digital data processor 106 receives the degradation data 136 from the compensation module 130. The compensation module 130 receives degradation data 132 based on measurements of parameters within the pixel circuit 114. Alternatively, the degradation data 132 sent to the compensation module 130 can be based on estimates of expected performance of the hardware aspects within the pixel circuit 114. The compensation module 130 includes the module 134 for implementing the algorithm 134, such as the TFT-to-pixel circuit conversion algorithm. The degradation data 132 can be electrical data that represents how much a hardware aspect of the pixel circuit 114 has been degraded. The degradation data 132 measured or estimated from the pixel circuit 114 can represent one or more characteristics of the pixel circuit 114.

In a configuration where the analog voltage or current 112 is a programming voltage, the programming voltage is generally determined by the digital input data 104, which is converted to a voltage in the data driver IC 110. The present disclosure provides a method of compensating for non-uniform characteristics in each pixel circuit 114 that affect the luminance of the emitted visible light 126 from each pixel. Compensation is performed by adjusting the digital input data 104 in the digital data processor 106 before the digital data 108 is passed to the data driver IC 110.

Figure 13B:
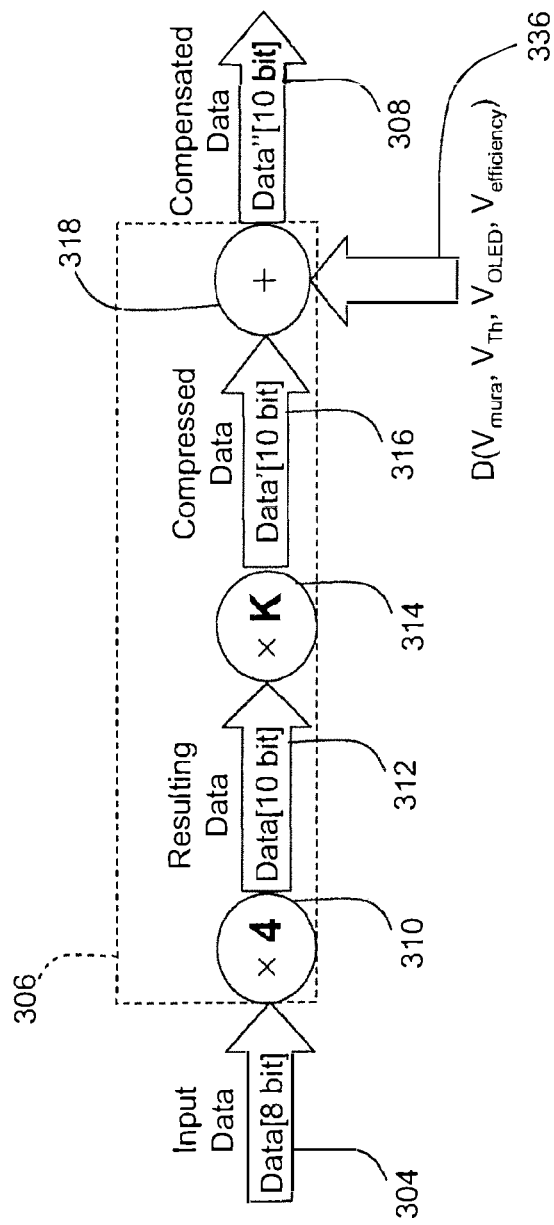
FIG. 13B is a data flow chart showing the compression and compensation of luminosity input data used to drive an AMOLED display.

FIG. 13B is a data flow chart showing the compression and compensation of luminosity input data 304 used to drive an AMOLED display. The data flow chart shown in FIG. 13B includes a digital data processor block 306 that can be considered an implementation of the digital data processor 106 shown in FIG. 3B. Referring again to FIG. 13B, a video source provides the luminosity input data 304. The input data 304 is a set of eight-bit integer values. The input data 304 includes integer values that exist between 0 and 255, with the values representing 256 possible programmable luminosity values of the pixels in the AMOLED display. For example, 255 can correspond to a pixel programmed with maximum luminance, and 127 can correspond to a pixel programmed with roughly half the maximum luminance. The input data 304 is similar to the digital input data 104 shown in FIG. 3B. Referring again to FIG. 13B, the input data 304 is sent to the digital data processor block 304. In the digital data processor block 304, the input data 304 is multiplied by four (310) in order to translate the eight-bit input data 304 to ten-bit resulting data 312. Following the multiplication by four (310), the resulting data 312 is a set of ten-bit integers existing between 0 and 1020.

By translating the eight-bit input data 304 to the ten-bit resulting data 312, the resulting data 312 can be manipulated for compensation of luminance degradation with finer steps than can be applied to the eight-bit input data 304. The ten-bit resulting data 312 can also be more accurately translated to programming voltages according to a gamma correction. The gamma correction is a non-linear, power law correction as is appreciated in the art of display technology. Applying the gamma correction to the input data can be advantageous, for example, to account for the logarithmic nature of the perception of luminosity in the human eye. According to an aspect of the present disclosure, multiplying the input data 304 by four (310) translates the input data 304 into a higher quantized domain. While the present disclosure includes multiplying by four (310), in an implementation the input data 304 can be multiplied by any number to translate the input data 310 into a higher quantized domain. The translation can advantageously utilize multiplication by a power of two, such as four, but the present disclosure is not so limited. Additionally, the present disclosure can be implemented without translating the input data 304 to a higher quantized domain.

The resulting data 312 is multiplied by a compression factor, K (314). The compression factor, K, is a number with a value less than one. Multiplying the resulting data 312 by K (314) allows for scaling the ten-bit resulting data 312 into compressed data 316. The compressed data 316 is a set of ten-bit integers having values ranging from 0 to the product of K and 1020. Next, the compressed data 316 is compensated for degradations in the display hardware (318). The compressed data 316 is compensated by adding additional data increments to the integers corresponding to the luminance of each pixel (318). The compensation for degradation is performed according to degradation data 336 that is sent to the digital data processor block 306. The degradation data 336 is digital data representing an amount of compensation to be applied to the compressed data 316 within the digital data processor block 306 according to degradations in the display hardware corresponding to each pixel. Following the compensation for degradations (318), compensated data 308 is output. The compensated data 208 is a set of ten-bit integer values with possible values between 0 and 1023. The compensated data 308 is similar in some respects to the digital data 108 output from the digital data processor 106 in FIG. 3B. Referring again to FIG. 13B, the compensated data 308 is supplied to a display driver, such as a display driver incorporating a digital to analog converter, to create programming voltages for pixels in the AMOLED display.

The degradations in the display hardware can be from mura defects (non-uniformities), from the OLED voltage drop, from the voltage threshold of the drive TFT, and from changes in the OLED light emitting efficiency. The degradations in the display hardware each generally correspond to an additional increment of voltage that is applied to the pixel circuit in order to compensate for the degradations. For a particular pixel, the increments of additional voltage necessary to compensate for the hardware degradations can be referred to as: $V_{mura}$, $V_{Th}$, $V_{OLED}$, and $V_{efficiency}$. Each of the hardware degradations can be mapped to corresponding increments in data steps according to a function of $V_{mura}$, $V_{Th}$, $V_{OLED}$, $V_{efficiency}$, $D(V_{mura}, V_{Th}, V_{OLED}, V_{efficiency})$. For example, the relationship can be given by Expression 1: $D(V_{mura}, V_{Th}, V_{OLED}, V_{efficiency})=\text{int}[(2nBits-1)(V_{mura}+V_{Th}+V_{OLED}+V_{efficiency})/V_{Max}]$, where nBits is the number of bits in the data set being compensated and $V_{Max}$ is the maximum programming voltage. In Expression 1, int[ ] is a function that evaluates the contents of the brackets and returns the nearest integer. The degradation data 336 sent to the digital data processor block 306 can be digital data created according to the relationship for $D(V_{mura}, V_{Th}, V_{OLED}, V_{efficiency})$ provided in Expression 1. In an implementation of the present disclosure, the degradation data 336 can be an array of digital data corresponding to an amount of compensation to be applied to the compressed data of each pixel in an AMOLED display. The array of digital data is a set of offset increments that can be applied to the compressed data by adding the offset increments to the compressed data of each pixel or by subtracting the offset increments from the compressed data of each pixel. The set of offset increments can generally be a set of digital data with entries corresponding to an amount of compensation needed to be applied to each pixel in the AMOLED display. The amount of compensation can be the amount of increments in data steps needed to compensate for a degradation according to Expression 1. In a configuration, locations in the array of the degradation data 336 can correspond to locations of pixels in the AMOLED display.

For example, Table 1 below provides a numerical example of the compression of input data according to FIG. 13B. Table 1 provides example values for a set of input data 304 following the multiplication by four (310) and the multiplication by K (314). In the example provided in Table 1, K has a value of 0.75. In Table 1, the first column provides example values of integer numbers in the set of input data 304. The second column provides example values of integer numbers in the set of resulting data 312 created by multiplying the corresponding input data values by four (310). The third column provides example values of numbers in the set of compressed data 316 created by multiplying the corresponding values of the resulting data 312 by K, where K has an example value of 0.75. The final column is the output voltage corresponding to the example compressed data 316 shown in the third column when no compensation is applied. The final column is created for an example display system having a maximum programming voltage of 18 V. In the numerical example illustrated in Table 1, the programming output voltage corresponding to the input data with the maximum input of two-hundred fifty-five is more than 4.5 V below the maximum voltage. The 4.5 V can be considered the compensation budget of the display system, and can be referred to as the voltage headroom, $V_{headroom}$. According to an aspect of the present disclosure, the 4.5 V is used to provide compensation for degradation of pixels in the AMOLED display.

TABLE 1

Numerical Example of Input Data Compression

| Input Data | Resulting Data (×4) | Compressed Data (×0.75) | Output Voltage (without degradation compensation) |
|---|---|---|---|
| 255 | 1020 | 765 | 13.46 V |
| 254 | 1016 | 762 | 13.40 V |
| 253 | 1012 | 759 | 13.35 V |
| ... | ... | ... | ... |
| 2 | 8 | 6 | 0.10 V |
| 1 | 4 | 3 | 0.05 V |
| 0 | 0 | 0 | 0.00 V |

According to an implementation of the present disclosure, the amount of voltage available for providing compensation degradation is $V_{headroom}$. An amount of $V_{headroom}$ can be advantageously reserved to compensate for a degradation of a pixel in an AMOLED display with the most severe luminance degradation. By reserving an amount of $V_{headroom}$ to compensate for the most severely degraded pixel, the relative luminosity of the display can be advantageously maintained. The required amount of $V_{headroom}$ to compensate for the pixel in an display with a maximum amount of degradation is given by Expression 2: $V_{headroom}=\max[V_{mura}+V_{Th}+V_{OLED}+V_{efficiency}]$. In Expression 2, $V_{mura}$, $V_{Th}$, $V_{OLED}$, and $V_{efficiency}$ can each be an array of values corresponding to the amount of additional voltage necessary to compensate the pixels in the display, and the entries in the arrays of values can correspond to individual pixels in the display. That is, $V_{mura}$ can be an array of voltages required to compensate display mura or non-uniform defects; $V_{Th}$ can be an array of voltage thresholds of drive TFTs of pixels in the display; $V_{OLED}$ can be an array of OLED voltages of the pixels in the display; and $V_{efficiency}$ can be an array of voltages required to compensate for OLED efficiency degradations of pixels in the display. In Expression 2, max[ ] is a function evaluating an array of values in the brackets and returning the maximum value in the array.

As can be appreciated with reference to FIG. 13B and Table 1, the choice of K affects the amount of $V_{headroom}$ available to compensate for degradations in the display. Choosing a lower value of K leads to a greater amount of $V_{headroom}$. In a configuration of the present disclosure where the need for compensation increases over time due to aging of the display, the value of K can be advantageously decreased over time according to the degradation of the display over time. Decreasing K enables uniformity compensation across the display such that pixels receiving the same digital input data actually emit light with the same luminance, but the uniformity compensation comes at the cost of overall luminance reduction for the entire display. FIGS. 14B through 17B provide methods for selecting and adjusting K.

FIG. 14B is a flowchart illustrating a method for selecting the compression factor according to display requirements and the design of the pixel circuit. In operation of the method illustrated by the flowchart in FIG. 14B, the display requirements and pixel circuit design of a display are analyzed to estimate maximum values of $V_{mura}$, $V_{Th}$, $V_{OLED}$, and $V_{efficiency}$ for the pixels in the display (405). The estimation (405) can be carried out based on, for example, empirical data from experimental results related to the aging of displays incorporating pixel circuits similar to the pixel circuit in the display 100. Alternatively, the estimation (405) can be carried out based on numerical models or software-based simulation models of anticipated performances of the pixel circuit in the display 100. The estimation (405) can also account for an additional safety margin of headroom voltage to account for statistically predictable variations amongst the pixel circuits in the display 100. Responsive to the estimation (405), the required voltage headroom is calculated (410). The required voltage headroom, $V_{headroom}$, is calculated according to Expression 2. Once $V_{headroom}$ is calculated, the compression factor, K, is calculated (415) according to Expression 3: $K=1-V_{headroom}/V_{Max}$, where $V_{Max}$ is a maximum programming voltage for the display 100. The compression factor, K, is then set (420) for use in the compression and compensation algorithm, such as the compression algorithm illustrated in the data flow chart in FIG. 13B.

FIG. 15B is a flowchart illustrating a method for selecting the compression factor according to a pre-determined headroom adjustment profile. A headroom adjustment profile is selected (505). The first block 505 in the flowchart in FIG. 15B graphically illustrates three possible headroom adjustment profiles as profile 1, profile 2, and profile 3. The profiles illustrated are graphs of K versus time. The time axis can be, for example, a number of hours of usage of the display 100. In all three profiles K decreases over time. By decreasing K over time, an additional amount of voltage ($V_{headroom}$) is available for compensation. The example profiles in the first block 505 include profile 1, which maintains K at a constant level until a time threshold is reached and K decreases linearly with usage time thereafter. Profile 2 is a stair step profile, which maintains K at a constant level for a time, and then decreases K to a lower value, when it is maintained until another time, at which point it is decreased again. Profile 3 is a linear decrease profile, which provides for K to gradually decrease linearly with usage time. The profile can be selected by a user profile setting according to a user's preferences for the compensation techniques employed over the life of the display. For example, a user may want to maintain an overall maximum luminance for the display for a specific amount of usage hours before dropping the luminance. Another user may be fine with gradually dropping the luminance from the beginning of the display's lifetime.

Once an headroom adjustment profile is selected (505), the display usage time is monitored (510). At a given usage time, the value of the compression factor, K, is determined according to the usage time and selected profile (515). The compression factor, K, is then set (520), and the display usage time continues to be monitored (510). After K is set (520), K can be used in the compression and compensation algorithm, such as the compression algorithm illustrated in the data flow chart in FIG. 13B. According to an aspect of the present disclosure, the method of setting and adjusting K shown in FIG. 15B is a dynamic method of setting and adjusting K, because the value of K is updated over time according to the usage time of the display 100.

Figure 16B:
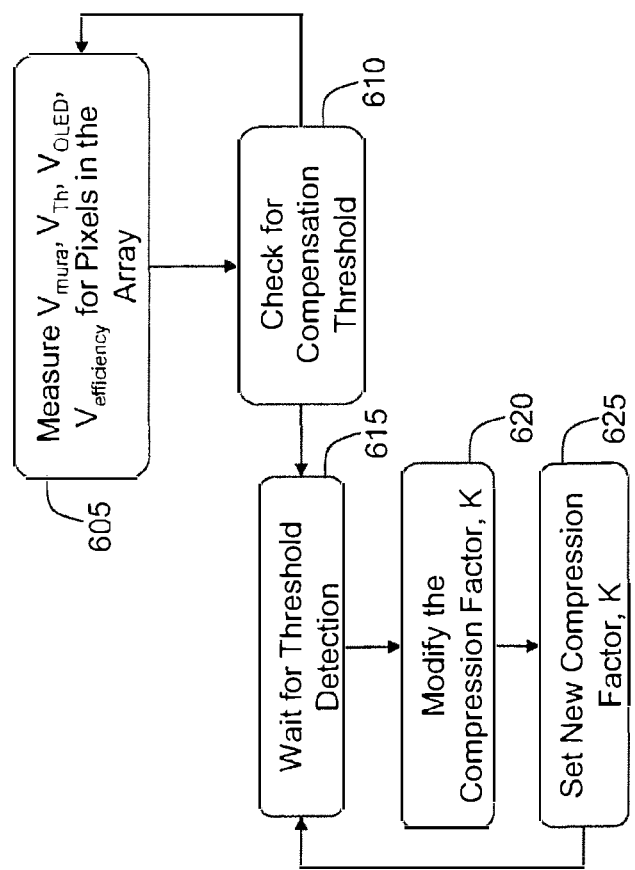
FIG. 16B is a flowchart illustrating a method for selecting the compression factor according to dynamic measurements of degradation data exceeding a threshold over a previous compensation.

FIG. 16B is a flowchart illustrating a method for selecting the compression factor according to dynamic measurements of degradation data exceeding a threshold over a previous compensation. Measurements are taken from aspects of the pixel circuits of the pixels in the display 100 to measure $V_{mura}$, $V_{Th}$, $V_{OLED}$, and $V_{efficiency}$ (605) and compute $V_{headroom}$ according to Expression 2. The difference between the value of $V_{headroom}$ presently computed at time t2 is then compared to the value of $V_{headroom}$ computed at an earlier time t1 by computing the difference (610). The difference is $\Delta V_{headroom}$, and is calculated according to Expression 5: $\Delta V_{headroom}=(V_{headroom})_{t2}-(V_{headroom})_{t1}$. In Expression 5, t1 is the last time used to adjust the compensation factor, K, and t2 is a present time. The subscripts in the right hand side of Expression 5 indicate a time of evaluation of the quantity in parentheses.

The calculated value of $\Delta V_{headroom}$ is then compared to a compensation threshold, $V_{thresh}$ (615). If $\Delta V_{headroom}$ exceeds $V_{thresh}$, K is modified (620). If $\Delta V_{headroom}$ is less than or equal to $V_{thresh}$, K is not modified. The value of K can be modified according to Expression 6: $K_{new}=K_{old}/A-B$, where $K_{new}$ is the new value of K, $K_{old}$ is the old value of K, and A and B are values set for applications and different technologies. For example, A and B can be set based on empirical results from experiments examining the characteristic degradation due to aging of pixel circuits similar to those used in the display 100 to drive OLEDs in each pixel. Similar measurements or user inputs can be used to set $V_{thresh}$ as well. The compression factor, K, is then set (625) for use in the compression and compensation algorithm, such as the compression algorithm illustrated in the data flow chart in FIG. 13B. Degradation measurements continue to be measured (605), $\Delta V_{headroom}$ continues to be calculated (610), and K is updated according to Expression 6 whenever $\Delta V_{headroom}$ exceeds $V_{thresh}$ (620). According to an aspect of the present disclosure, the method of adjusting K shown in FIG. 16B is a dynamic method of adjusting K, because the value of K is updated over time according to degradation measurements gathered from the pixel circuits within the display 100.

Alternatively, the compression factor can be modified (620) according to Expression 3 based on the measured $V_{headroom}$. According to an aspect of the method provided in the flowchart shown in FIG. 16B, the value of K is maintained until a threshold event occurs (615), when K is modified (620). Implementing the method provided in FIG. 16B for adjusting the compression factor, K, can result in K being decreased over time according to a stair step profile.

Figure 17B:
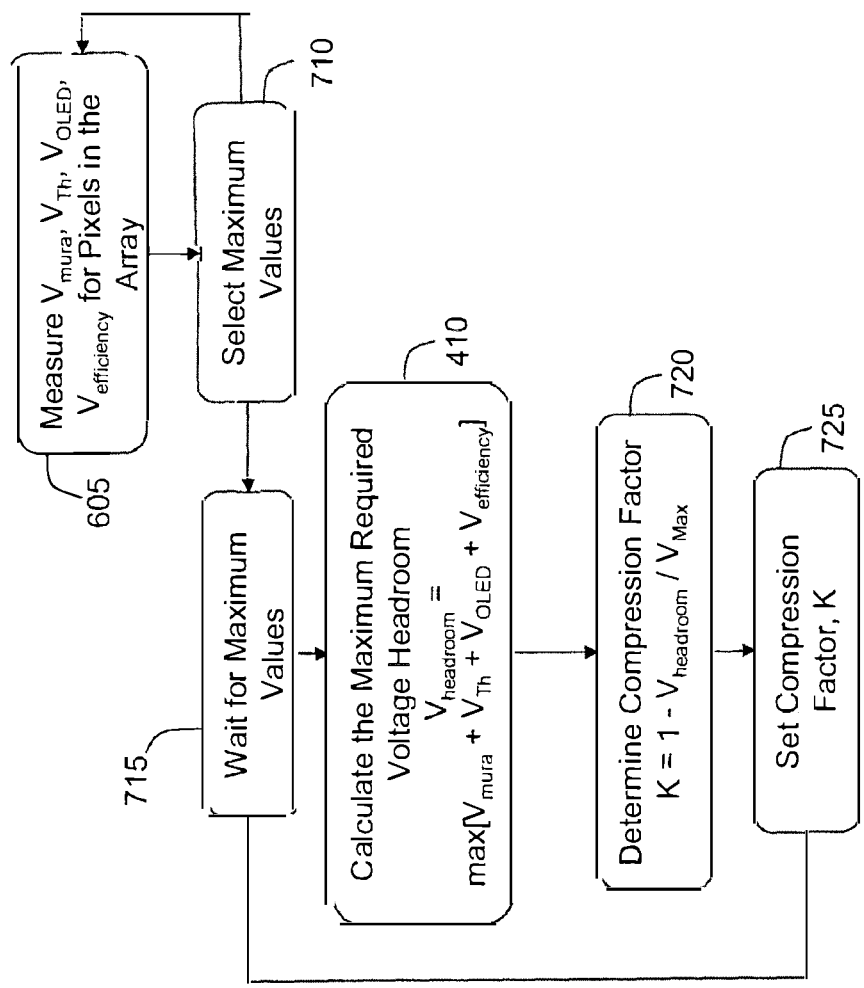
FIG. 17B is a flowchart illustrating a method for selecting the compression factor according to dynamic measurements of degradation data exceeding a previously measured maximum.

FIG. 17B is a flowchart illustrating a method for selecting the compression factor according to dynamic measurements of degradation data exceeding a previously measured maximum. Measurements are taken from aspects of the pixel circuits of the pixels in the display 100 to measure $V_{mura}$, $V_{Th}$, $V_{OLED}$, and $V_{efficiency}$ (605). The measurements of $V_{mura}$, $V_{Th}$, $V_{OLED}$, and $V_{efficiency}$ are referred to as degradation measurements. The maximum values of the degradation measurements are selected (710). The maximum values of the degradation can be selected according to Expression 2. The combination of measuring the degradation measurements (605) and selecting the maximum values (710) provides for ascertaining the maximum compensation applied to pixels within the display. The maximum values are compared to previously measured maximum values of previously measured degradation measurements (715). If the presently measured maximum values exceed the previously measured maximum values, $V_{headroom}$ is calculated according to Expression 2 (410) based on the present degradation measurements. Next, the compression factor, K, is determined according to Expression 3 (720). The compression factor is set (725) and the maximum values are updated for comparison with new maximum values (715). The compression factor is set (725) for use in the compression and compensation algorithm, such as the compression algorithm illustrated in the data flow chart in FIG. 13B. Similar to the method provided in FIG. 16B, the method shown illustrated by the flowchart in FIG. 17B is a dynamic method of adjusting K based on degradation measurements continually gathered from the pixel circuits within the display 100.

The present disclosure can be implemented by combining the above disclosed methods for setting and adjusting the compression factor, K, in order to create an adequate amount of voltage headroom that allows for compensation to be applied to the digital data before it is passed to the data driver IC. For example, a method of setting and adjusting K according to FIG. 16B or FIG. 17B can also incorporate a user selected profile as in FIG. 15B.

In an implementation of the present disclosure, the methods of selecting and adjusting the compression factor, K, provided in FIGS. 14B through 17B can be used in conjunction with the digital data manipulations illustrated in FIG. 13B to operate a display while maintaining the uniform luminosity of the display. In a configuration, the above described methods allow for maintaining the relative luminosity of a display by compensating for degradations to pixels within the display. In a configuration, the above described methods allow for maintaining the luminosity of a pixel in a display array for a given digital input by compensating for degradations within the pixel's pixel circuit.

Figure 18B:
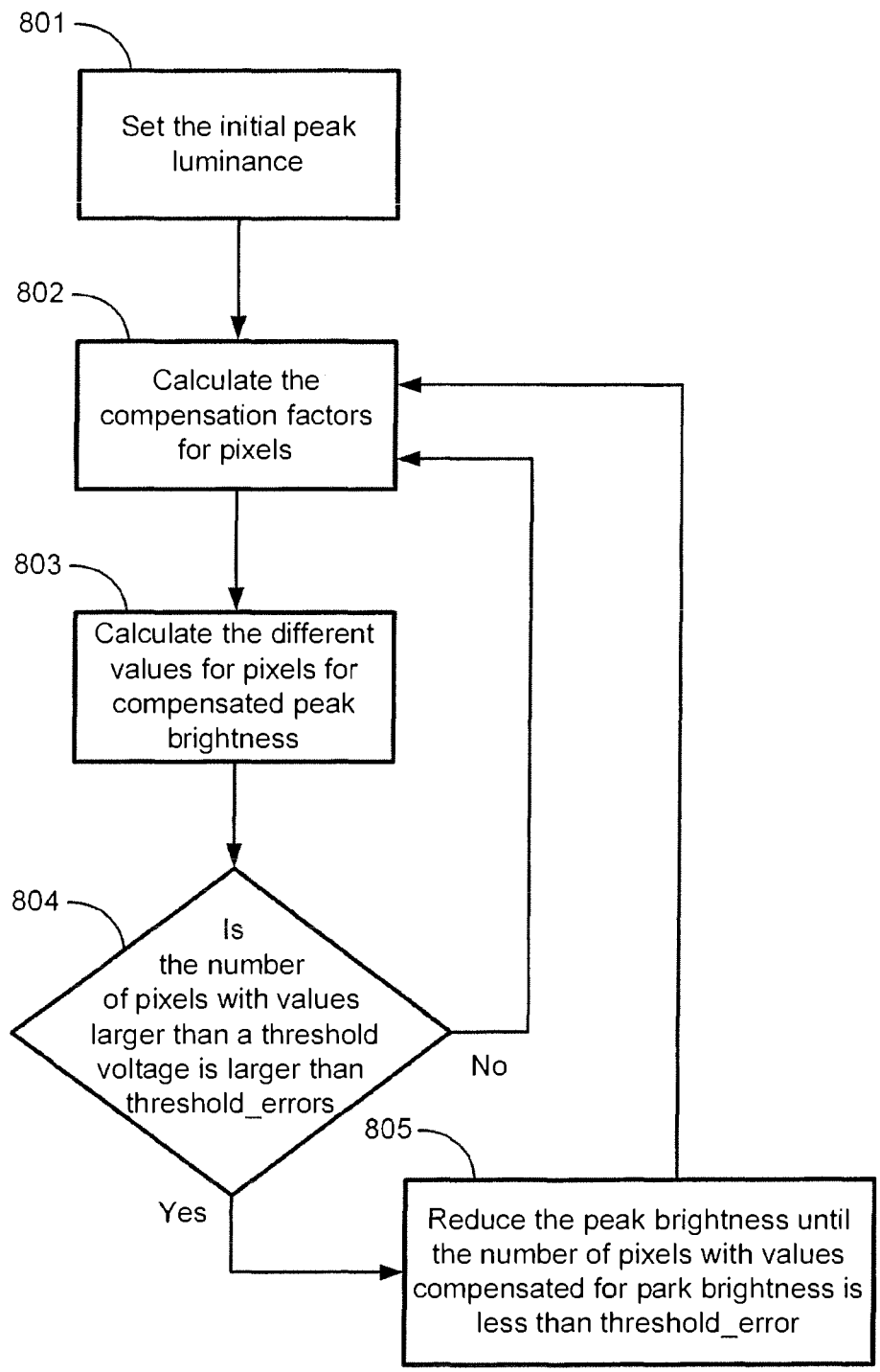
FIG. 18B is a flowchart illustrating a method for periodically adjusting the peak luminance for compensation.

FIG. 18B is a flow chart illustrating a method of periodically adjusting the peak luminance for compensation. The initial peak luminance set by the display at step 801 is adjusted based on compensation levels at step 802. After calculating the compensated value for each pixel to provide the peak brightness at step 803, the number of pixels whose values are larger than a threshold voltage is calculated at step 804. If this number is larger a threshold number (threshold_error), the peak luminance (brightness) is reduced at step 805 until the number is less than threshold_error.

1. Initial brightness can be set by applications or an algorithm that controls the power, temperature, or any other display factors.
2. The pixel values can be the data passed to the display driver, the pixel luminance or the pixel currents. One can calculate more than one pixel value to compare with more than one threshold value.
3. The threshold values can be set based on different conditions such as the maximum compensated headroom available and aging acceleration factors. For example, as the current of the pixel is increased to compensate for the OLED aging, the OLED aging accelerates. Therefore, one can set a threshold value to limit the aging acceleration. The threshold values can be more than one and can be different for each sub-pixel.
4. The threshold_error can be set as the maximum tolerable number of pixels having the wrong compensation level. There can be different threshold_error values for different threshold (pixel) values.
5. In the case of multiple threshold values, there can be a priority list in which the conditions of the values with higher priority need to be fixed first.
6. The compensation factors can include uniformity compensation, aging compensation, temperature compensation, and other adjustments related to display performance.
7. The adjustment can be made periodically, at an event (e.g., power on, power off, readjusting the compensation factors, etc.) or at user (application) request.

FIG. 19B is a flow chart illustrating a method of periodically adjusting the operating conditions for compensation. The initial operating conditions (e.g., voltages, currents, gray levels, etc.) are set at step 901, and the compensation factors for the pixels are calculated at step 902. After calculating the pixel values for compensated peak brightness at step 903, the number of pixels whose values are larger than a threshold value is calculated at step 904. If this number is larger than a threshold number (threshold_error), the operating conditions are adjusted at step 905 so that the number of pixels with values larger than the threshold is less than threshold_error. Then at step 906 the threshold values are re-adjusted based on the new voltage levels.

1. Initial operating conditions can be set by applications or an algorithm that controls the power, temperature, or any other display factors.
2. Pixel values can be the data passed to the display driver, the pixel luminance or the pixel currents. One can calculate more than one pixel value to compare with more than one threshold value.
3. The threshold values can be set based on different conditions such as the maximum compensated headroom available.
4. The threshold_error can be set as the maximum tolerable pixels with wrong compensation levels. There can be different threshold_errors for different threshold (pixel) values.
5. The compensation factors can include uniformity compensation, aging compensation, temperature compensation, and other adjustments related to display performance.
6. In case of multiple threshold values, there can be a priority list in which the conditions of the values with higher priority need to be fixed first.
7. The adjustment can be made periodically, at an event (e.g., power on, power off, readjusting the compensation factors, etc.) or at user (application) request.

A combination of luminance adjustment and display operating conditions, i.e., a hybrid adjustment, may be used to meet the threshold_error values.

1. In one case, different threshold values are allocated to different parameters (e.g., some are allocated to the luminance adjustment and some to the display operation conditions). For example, the aging acceleration factor threshold value can be allocated to the luminance adjustment, and the uniformity value can be allocated to the display operation condition algorithm. Also, some threshold values can have priority over others so that the higher priority values are fixed first.
2. In another case, there can be a percentage correction for each parameter. For example, the maximum change in the luminance (or the rate of luminance reduction) can be limited. In this case, if there are some threshold_errors left after adjusting the luminance according the allowable rate, they are fixed by the operation condition adjustment.
3. In another case, one can use a mixture of the two aforementioned cases (some threshold values are controlled by specific parameters (e.g., aging acceleration is controlled by a luminance adjustment algorithm), and some threshold values are allocated to both algorithms.

The present disclosure describes maintaining uniform luminosity of an AMOLED display, but the techniques presented are not so limited. The disclosure is applicable to a range of systems incorporating arrays of devices having a characteristic stimulated responsive to a data input, and where the characteristic is sought to be maintained uniformly. For example, the present disclosure applies to sensor arrays, memory cells, and solid state light emitting diode displays. The present disclosure provides for modifying the data input that stimulates the characteristic of interest in order to maintain uniformity. While the present disclosure for compressing and compensating digital luminosity data to maintain a luminosity of an AMOLED display is described as utilizing TFTs and OLEDs, the present disclosure applies to a similar apparatus having a display including an array of light emitting devices.

The present invention has been described with regard to one or more embodiments. However, it will be apparent to persons skilled in the art that a number of variations and modifications can be made without departing from the scope of the invention as defined in the claims.

What is claimed is:

1. A method of adjusting operating conditions for pixels in an OLED display, said method comprising
    calculating pixel values for a plurality of pixels in the display,
    determining the number of pixels having pixel values satisfying threshold criteria, and
    if the determined number of pixels is greater than a predetermined threshold number, adjusting an operating condition for the pixels in the display until said determined number of pixels is less than said predetermined threshold number.

2. The method of claim 1 further comprising, prior to calculating pixel values, setting the operating condition by an application or algorithm controlling the power, temperature or other display factor.

3. The method of claim 1 in which said pixel values are at least one of compensation data, pixel drive data, pixel luminance data, and pixel current data.

4. The method of claim 1 in which said threshold criteria is based on at least one of maximum compensation headroom available and aging acceleration factors.

5. The method of claim 1 in which said predetermined threshold number is the maximum tolerable number of pixels having wrong pixel levels.

6. The method of claim 1 in which said pixel values include compensation values based on compensating for at least one of non-uniformity of the display, aging, temperature and other display performance factors.

7. The method of claim 1 in which said adjusting is effected periodically, in response to a predetermined event, or in response to a user-initiated request.

8. The method of claim 1 in which said operating condition includes a peak luminance programming value.

9. A display degradation compensation system for adjusting operating conditions for pixels in an OLED display, said system comprising a controller programmed to
    calculate pixel values for a plurality of pixels in the display,
    determine the number of pixels having pixel values satisfying threshold criteria, and
    if the determined number of pixels is greater than a predetermined threshold number, adjust the an operating condition for the pixels in the display until said determined number of pixels is less than said predetermined threshold number.

10. The system of claim 9 in which the controller is programmed further to, prior to calculating pixel values, setting the operating condition by an application or algorithm controlling the power, temperature or other display factor.

11. The system of claim 10 in which said pixel values include compensation values based on compensating for at least one of non-uniformity of the display, aging, temperature and other display performance factors.

12. The system of claim 9 in which said pixel values are at least one of compensation data, pixel drive data, pixel luminance data, and pixel current data.

13. The system of claim 12 in which said adjusting is effected periodically, in response to a predetermined event, or in response to a user-initiated request.

14. The system of claim 12 in which said operating condition includes a peak luminance programming value.

15. The system of claim 9 in which said threshold criteria is based on at least one of maximum compensation headroom available and aging acceleration factors.

16. The system of claim 9 in which said predetermined threshold number is the maximum tolerable number of pixels having wrong pixel levels.

* * * * *

UNITED STATES PATENT AND TRADEMARK OFFICE
CERTIFICATE OF CORRECTION

PATENT NO. : 11,270,621 B2
APPLICATION NO. : 16/914533
DATED : March 8, 2022
INVENTOR(S) : Arokia Nathan et al.

It is certified that error appears in the above-identified patent and that said Letters Patent is hereby corrected as shown below:

In the Drawings

Please replace Fig. 11A with Fig. 11A as shown on the attached page.

Signed and Sealed this
Twenty-fifth Day of June, 2024

Katherine Kelly Vidal
*Director of the United States Patent and Trademark Office*